(12) United States Patent  (10) Patent No.: US 9,324,737 B2
Yamazaki et al.  (45) Date of Patent: Apr. 26, 2016

(54) DISPLAY DEVICE AND ELECTRONIC DEVICE

(71) Applicant: Semiconductor Energy Laboratory Co., Ltd., Atsugi-shi, Kanagawa-ken (JP)

(72) Inventors: Shunpei Yamazaki, Setagaya (JP); Hajime Kimura, Atsugi (JP); Hiroyuki Miyake, Atsugi (JP); Jun Koyama, Sagamihara (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 14/089,133

(22) Filed: Nov. 25, 2013

(65) Prior Publication Data
US 2014/0145182 A1  May 29, 2014

(30) Foreign Application Priority Data

Nov. 28, 2012 (JP) ................................. 2012-260208

(51) Int. Cl.
*H01L 29/12* (2006.01)
*H01L 27/12* (2006.01)
(Continued)

(52) U.S. Cl.
CPC .......... *H01L 27/124* (2013.01); *H01L 27/0296* (2013.01); *H01L 27/1225* (2013.01);
(Continued)

(58) Field of Classification Search
CPC ............ H01L 51/0067; H01L 51/0072; H01L 51/5044; H01L 51/506; H01L 51/5265; H01L 51/5268; H01L 51/5278; H01L 51/5068; H01L 51/5064; H01L 51/0085; H01L 51/0071; H01L 51/5218; H01L 51/0061; H01L 51/0052; H01L 51/5092
USPC .......... 257/12–13, 40, 81, 84, 87–89, 98–100, 257/347–348, 433–434
See application file for complete search history.

(56) References Cited

U.S. PATENT DOCUMENTS 5,731,856 A 3/1998 Kim et al.
5,744,864 A 4/1998 Cillessen et al.
(Continued)

FOREIGN PATENT DOCUMENTS

EP 1737044 A 12/2006
EP 2226847 A 9/2010
(Continued)

OTHER PUBLICATIONS

Fortunato.E et al., "Wide-Bandgap High-Mobility ZNO Thin-Film Transistors Produced at Room Temperature,", Appl. Phys. Lett. (Applied Physics Letters), Sep. 27, 2004, vol. 85, No. 13, pp. 2541-2543.

(Continued)

*Primary Examiner* — Dung Le
(74) *Attorney, Agent, or Firm* — Eric J. Robinson; Robinson Intellectual Property Law Office, P.C.

(57) ABSTRACT

To provide a novel display device. The display device includes a pixel portion, a driver circuit portion that is provided outside the pixel portion, and a protection circuit that is electrically connected to one of or both the pixel portion and the driver circuit portion and includes a pair of electrodes. The pixel portion includes pixel electrodes arranged in a matrix and transistors electrically connected to the pixel electrodes. The transistor includes a first insulating layer containing nitrogen and silicon, and a second insulating layer containing oxygen, nitrogen, and silicon. The protection circuit includes the first insulating layer between the pair of electrodes.

22 Claims, 25 Drawing Sheets

(51) Int. Cl.
  *H01L 27/02* (2006.01)
  *H01L 27/32* (2006.01)
(52) U.S. Cl.
  CPC ........ *H01L27/1248* (2013.01); *H01L 27/3276* (2013.01); *H01L 27/3248* (2013.01); *H01L 2227/323* (2013.01)

(56) References Cited

U.S. PATENT DOCUMENTS

| | | |
|---|---|---|
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 8,384,078 B2 | 2/2013 | Kang et al. |
| 8,389,988 B2 | 3/2013 | Yamazaki et al. |
| 8,541,785 B2 | 9/2013 | Hosoya et al. |
| 2001/0046027 A1 | 11/2001 | Tai et al. |
| 2002/0056838 A1 | 5/2002 | Ogawa |
| 2002/0117719 A1* | 8/2002 | Ando et al. ................... 257/347 |
| 2002/0132454 A1 | 9/2002 | Ohtsu et al. |
| 2003/0189401 A1 | 10/2003 | Kido et al. |
| 2003/0218222 A1 | 11/2003 | Wager et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0236601 A1* | 9/2009 | Jinbo ............................. 257/60 |
| 2009/0278122 A1 | 11/2009 | Hosono et al. |
| 2009/0280600 A1 | 11/2009 | Hosono et al. |
| 2010/0065839 A1 | 3/2010 | Yamazaki et al. |
| 2010/0065840 A1 | 3/2010 | Yamazaki et al. |
| 2010/0065844 A1 | 3/2010 | Tokunaga |
| 2010/0072470 A1 | 3/2010 | Yamazaki et al. |
| 2010/0072471 A1 | 3/2010 | Yamazaki et al. |
| 2010/0092800 A1 | 4/2010 | Itagaki et al. |
| 2010/0109002 A1 | 5/2010 | Itagaki et al. |
| 2012/0033151 A1* | 2/2012 | Toyotaka et al. ............... 349/43 |
| 2012/0300150 A1 | 11/2012 | Yamazaki et al. |
| 2012/0313103 A1* | 12/2012 | Yamada et al. ................. 257/66 |
| 2013/0092934 A1 | 4/2013 | Yamazaki et al. |
| 2013/0134417 A1 | 5/2013 | Yamazaki et al. |
| 2013/0175525 A1 | 7/2013 | Yamazaki et al. |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2010-092036 | 4/2010 |
| JP | 2010-092037 | 4/2010 |
| JP | 2010-097203 | 4/2010 |
| JP | 2010-97204 | 4/2010 |
| JP | 2010-107976 | 5/2010 |
| JP | 2010-107977 | 5/2010 |
| JP | 2010-113346 | 5/2010 |
| WO | WO-2004/114391 | 12/2004 |

OTHER PUBLICATIONS

Dembo.H et al., "RFCPUS on Glass and Plastic Substrates Fabricated by TFT Transfer Technology,", IEDM 05: Technical Digest of

(56) References Cited

OTHER PUBLICATIONS

International Electron Devices Meeting, Dec. 5, 2005, pp. 1067-1069.
Ikeda.T et al., "Full-Functional System Liquid Crystal Display Using CG-Silicon Technology,", SID Digest '04 : SID International Symposium Digest of Technical Papers, 2004, vol. 35, pp. 860-863.
Nomura.K et al., "Room-Temperature Fabrication of Transparent Flexible Thin-Film Transistors Using Amorphous Oxide Semiconductors,", Nature, Nov. 25, 2004, vol. 432, pp. 488-492.
Park.J et al., "Improvements in the Device Characteristics of Amorphous Indium Gallium Zinc Oxide Thin-Film Transistors by Ar Plasma Treatment,", Appl. Phys. Lett. (Applied Physics Letters) , Jun. 26, 2007, vol. 90, No. 26, pp. 262106-1-262106-3.
Takahashi.M et al., "Theoretical Analysis of IGZO Transparent Amorphous Oxide Semiconductor,", IDW '08 : Proceedings of the 15th International Display Workshops, Dec. 3, 2008, pp. 1637-1640.
Hayashi.R et al., "42.1: Invited Paper: Improved Amorphous In—Ga—Zn—O TFTs,", SID Digest '08 : SID International Symposium of Technical Papers, May 20, 2008, vol. 39, pp. 621-624.
Prins.M et al., "A Ferroelectric Transparent Thin-Film Transistor,", Appl. Phys. Lett. (Applied Physics Letters) , Jun. 17, 1996, vol. 68, No. 25, pp. 3650-3652.
Nakamura.M et al., "The phase relations in the $In_2O_3$—$Ga_2ZnO_4$—ZnO system at 1350° C.", Journal of Solid State Chemistry, Aug. 1, 1991, vol. 93, No. 2, pp. 298-315.
Kimizuka.N et al., "Syntheses and Single-Crystal Data of Homologous Compounds, $In_2O_3(ZnO)m$ (m = 3, 4, and 5), $InGaO_3(ZnO)_3$, and $Ga_2O_3(ZnO)m$ (m = 7, 8, 9, and 16) in the $In_2O_3$—$ZnGa_2O_4$—ZnO System,", Journal of Solid State Chemistry, Apr. 1, 1995, vol. 116, No. 1, pp. 170-178.
Nomura.K et al., "Thin-Film Transistor Fabricated in Single-Crystalline Transparent Oxide Semiconductor,", Science, May 23, 2003, vol. 300, No. 5623, pp. 1269-1272.
Masuda.S et al., "Transparent thin film transistors using ZnO as an active channel layer and their electrical properties,", J. Appl. Phys. (Journal of Applied Physics) , Feb. 1, 2003, vol. 93, No. 3, pp. 1624-1630.
Asakuma.N et al., "Crystallization and Reduction of Sol-Gel-Derived Zinc Oxide Films by Irradiation With Ultraviolet Lamp,", Journal of Sol-Gel Science and Technology, 2003, vol. 26, pp. 181-184.
Osada.T et al., "15.2: Development of Driver-Integrated Panel using Amorphous In—Ga—Zn—Oxide TFT,", SID Digest '09 : SID International Symposium Digest of Technical Papers, May 31, 2009, pp. 184-187.
Nomura.K et al., "Carrier transport in transparent oxide semiconductor with intrinsic structural randomness probed using single-crystalline $InGaO_3(ZnO)_5$ films,", Appl. Phys. Lett. (Applied Physics Letters) , Sep. 13, 2004, vol. 85, No. 11, pp. 1993-1995.
Li.C et al., "Modulated Structures of Homologous Compounds $InMO_3(ZnO)m$ (M=In,Ga; m=Integer) Described by Four-Dimensional Superspace Group,", Journal of Solid State Chemistry, 1998, vol. 139, pp. 347-355.
Son.K et al., "42.4L: Late-News Paper: 4 Inch QVGA AMOLED Driven by the Threshold Voltage Controlled Amorphous GIZO ($Ga_2O_3$—$In_2O_3$—ZnO) TFT,", SID Digest '08 : SID International Symposium Digest of Technical Papers, May 20, 2008, vol. 39, pp. 633-636.
Lee.J et al., "World's Largest (15-Inch) XGA AMLCD Panel Using IGZO Oxide TFT,", SID Digest '08 : SID International Symposium Digest of Technical Papers, May 20, 2008, vol. 39, pp. 625-628.
Nowatari.H et al., "60.2: Intermediate Connector With Suppressed Voltage Loss for White Tandem OLEDS,", SID Digest '09 : SID International Symposium Digest of Technical Papers, May 31, 2009, vol. 40, pp. 899-902.
Kanno.H et al., "White Stacked Electrophosphorecent Organic Light-Emitting Devices Employing $MOO_3$ as a Charge-Generation Layer,", Adv. Mater. (Advanced Materials), 2006, vol. 18, No. 3, pp. 339-342.

Tsuda.K et al., "Ultra Low Power Consumption Technologies for Mobile TFT-LCDs ,", IDW '02 : Proceedings of the 9th International Display Workshops, Dec. 4, 2002, pp. 295-298.
Van de Walle.C, "Hydrogen as a Cause of Doping in Zinc Oxide,", Phys. Rev. Lett. (Physical Review Letters), Jul. 31, 2000, vol. 85, No. 5, pp. 1012-1015.
Fung.T et al., "2-D Numerical Simulation of High Performance Amorphous In—Ga—Zn—O TFTs for Flat Panel Displays,", AM-FPD '08 Digest of Technical Papers, Jul. 2, 2008, pp. 251-252, The Japan Society of Applied Physics.
Jeong.J et al., "3.1: Distinguished Paper: 12.1-Inch WXGA AMOLED Display Driven by Indium—Gallium—Zinc Oxide TFTs Array,", SID Digest '08 : SID International Symposium Digest of Technical Papers, May 20, 2008, vol. 39, No. 1, pp. 1-4.
Park.J et al., "High performance amorphous oxide thin film transistors with self-aligned top-gate structure,", IEDM 09: Technical Digest of International Electron Devices Meeting, Dec. 7, 2009, pp. 191-194.
Kurokawa.Y et al., "UHF RFCPUS on Flexible and Glass Substrates for Secure RFID Systems,", Journal of Solid-State Circuits , 2008, vol. 43, No. 1, pp. 292-299.
Ohara.H et al., "Amorphous In—Ga—Zn—Oxide TFTs with Suppressed Variation for 4.0 inch QVGA AMOLED Display,", AM-FPD '09 Digest of Technical Papers, Jul. 1, 2009, pp. 227-230, The Japan Society of Applied Physics.
Coates.D et al., "Optical Studies of the Amorphous Liquid-Cholesteric Liquid Crystal Transition:The "Blue Phase",", Physics Letters, Sep. 10, 1973, vol. 45A, No. 2, pp. 115-116.
Cho.D et al., "21.2:Al and Sn-Doped Zinc Indium Oxide Thin Film Transistors for AMOLED Back-Plane,", SID Digest '09 : SID International Symposium Digest of Technical Papers, May 31, 2009, pp. 280-283.
Lee.M et al., "15.4:Excellent Performance of Indium—Oxide—Based Thin-Film Transistors by DC Sputtering,", SID Digest '09 : SID International Symposium Digest of Technical Papers, May 31, 2009, pp. 191-193.
Jin.D et al., "65.2:Distinguished Paper:World-Largest (6.5") Flexible Full Color Top Emission AMOLED Display on Plastic Film and Its Bending Properties,", SID Digest '09 : SID International Symposium Digest of Technical Papers, May 31, 2009, pp. 983-985.
Sakata.J et al., "Development of 4.0-In. AMOLED Display With Driver Circuit Using Amorphous In—Ga—Zn—Oxide TFTs,", IDW '09 : Proceedings of the 16th International Display Workshops, 2009, pp. 689-692.
Park.J et al., "Amorphous Indium—Gallium—Zinc Oxide TFTs and Their Application for Large Size AMOLED,", AM-FPD '08 Digest of Technical Papers, Jul. 2, 2008, pp. 275-278.
Park.S et al., "Challenge to Future Displays: Transparent AM-OLED Driven by Peald Grown ZnO TFT,", IMID '07 Digest, 2007, pp. 1249-1252.
Godo.H et al., "Temperature Dependence of Characteristics and Electronic Structure for Amorphous In—Ga—Zn—Oxide TFT,", AM-FPD '09 Digest of Technical Papers, Jul. 1, 2009, pp. 41-44.
Osada.T et al., "Development of Driver-Integrated Panel Using Amorphous In—Ga—Zn—Oxide TFT,", AM-FPD '09 Digest of Technical Papers, Jul. 1, 2009, pp. 33-36.
Hirao.T et al., "Novel Top-Gate Zinc Oxide Thin-Film Transistors (ZnO TFTs) for AMLCDS,", Journal of the SID, 2007, vol. 15, No. 1, pp. 17-22.
Hosono.H, "68.3:Invited Paper:Transparent Amorphous Oxide Semiconductors for High Performance TFT,", SID Digest '07 : SID International Symposium Digest of Technical Papers, 2007, vol. 38, pp. 1830-1833.
Godo.H et al., "P-9:Numerical Analysis on Temperature Dependence of Characteristics of Amorphous In—Ga—Zn—Oxide TFT,", SID Digest '09 : SID International Symposium Digest of Technical Papers, May 31, 2009, pp. 1110-1112.
Ohara.H et al., "21.3:4.0 In. QVGA AMOLED Display Using In—Ga—Zn—Oxide TFTs With a Novel Passivation Layer,", SID Digest '09 : SID International Symposium Digest of Technical Papers, May 31, 2009, pp. 284-287.

(56) References Cited

OTHER PUBLICATIONS

Miyasaka.M, "SUFTLA Flexible Microelectronics on Their Way to Business,", SID Digest '07 : SID International, Symposium Digest of Technical Papers, 2007, vol. 38, pp. 1673-1676.

Chern.H et al., "An Analytical Model for the Above-Threshold Characteristics of Polysilicon Thin-Film Transistors,", IEEE Transactions on Electron Devices, Jul. 1, 1995, vol. 42, No. 7, pp. 1240-1246.

Kikuchi.H et al., "39.1:Invited Paper:Optically Isotropic Nano-Structured Liquid Crystal Composites for Display Applications,", SID Digest '09 : SID International Symposium Digest of Technical Papers, May 31, 2009, pp. 578-581.

Asaoka.Y et al., "29.1: Polarizer-Free Reflective LCD Combined With Ultra Low-Power Driving Technology,", SID Digest '09 : SID International Symposium Digest of Technical Papers, May 31, 2009, pp. 395-398.

Lee.H et al., "Current Status of, Challenges to, and Perspective View of AM-OLED ,", IDW '06 : Proceedings of the 13th International Display Workshops, Dec. 7, 2006, pp. 663-666.

Kikuchi.H et al., "62.2:Invited Paper:Fast Electro-Optical Switching in Polymer-Stabilized Liquid Crystalline Blue Phases for Display Application,", SID Digest '07 : SID International Symposium Digest of Technical Papers, 2007, vol. 38, pp. 1737-1740.

Nakamura.M, "Synthesis of Homologous Compound with New Long-Period Structure,", NIRIM Newsletter, Mar. 1, 1995, vol. 150, pp. 1-4.

Kikuchi.H et al., "Polymer-Stabilized Liquid Crystal Blue Phases,", Nature Materials, Sep. 2, 2002, vol. 1, pp. 64-68.

Kimizuka.N et al., "Spinel,YBFE2O4, and YB2FE3O7 Types of Structures for Compounds in the In2O3 and Sc2O3—A2O3—BO Systems [A; Fe, Ga, or Al; B: Mg, Mn, Fe, Ni, Cu,or Zn] At Temperatures Over 1000° C.", Journal of Solid State Chemistry, 1985, vol. 60, pp. 382-384.

Kitzerow.H et al., "Observation of Blue Phases in Chiral Networks,", Liquid Crystals, 1993, vol. 14, No. 3, pp. 911-916.

Costello.M et al., "Electron Microscopy of a Cholesteric Liquid Crystal and Its Blue Phase,", Phys. Rev. A (Physical Review. A), May 1, 1984, vol. 29, No. 5, pp. 2957-2959.

Meiboom.S et al., "Theory of the Blue Phase of Cholesteric Liquid Crystals,", Phys. Rev. Lett. (Physical Review Letters), May 4, 1981, vol. 46, No. 18, pp. 1216-1219.

Park.Sang-Hee et al., "42.3: Transparent ZnO Thin Film Transistor for the Application of High Aperture Ratio Bottom Emission AM-OLED Display,", SID Digest '08 : SID International Symposium Digest of Technical Papers, May 20, 2008, vol. 39, pp. 629-632.

Orita.M et al., "Mechanism of Electrical Conductivity of Transparent InGaZnO4,", Phys. Rev. B (Physical Review. B), Jan. 15, 2000, vol. 61, No. 3, pp. 1811-1816.

Nomura.K et al., "Amorphous Oxide Semiconductors for High-Performance Flexible Thin-Film Transistors,", Jpn. J. Appl. Phys. (Japanese Journal of Applied Physics) , 2006, vol. 45, No. 5B, pp. 4303-4308.

Janotti.A et al., "Native Point Defects in ZnO,", Phys. Rev. B (Physical Review. B), Oct. 4, 2007, vol. 76, No. 16, pp. 165202-1-165202-22.

Park.J et al., "Electronic Transport Properties of Amorphous Indium—Gallium—Zinc Oxide Semiconductor Upon Exposure to Water,", Appl. Phys. Lett. (Applied Physics Letters) 2008, vol. 92, pp. 072104-1-072104-3.

Hsieh.H et al., "P-29:Modeling of Amorphous Oxide Semiconductor Thin Film Transistors and Subgap Density of States,", SID Digest '08 : SID International Symposium Digest of Technical Papers, 2008, vol. 39, pp. 1277-1280.

Janotti.A et al., "Oxygen Vacancies in ZnO,", Appl. Phys. Lett. (Applied Physics Letters) , 2005, vol. 87, pp. 122102-1-122102-3.

Oba.F et al., "Defect energetics in ZnO: A hybrid Hartree-Fock density functional study,", Phys. Rev. B (Physical Review. B), 2008, vol. 77, pp. 245202-1-245202-6.

Orita.M et al., "Amorphous transparent conductive oxide InGaO3(ZnO)m (m<4):a Zn4s conductor,", Philosophical Magazine, 2001, vol. 81, No. 5, pp. 501-515.

Hosono.H et al., "Working hypothesis to explore novel wide band gap electrically conducting amorphous oxides and examples,", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays,", IDW '08 : Proceedings of the 6th International Display Workshops, Dec. 3, 2008, pp. 581-584.

Kim.S et al., "High-Performance oxide thin film transistors passivated by various gas plasmas,", 214th ECS Meeting, 2008, No. 2317, ECS.

Clark.S et al., "First Principles Methods Using CASTEP,", Zeitschrift fur Kristallographie, 2005, vol. 220, pp. 567-570.

Lany.S et al., "Dopability, Intrinsic Conductivity, and Nonstoichiometry of Transparent Conducting Oxides,", Phys. Rev. Lett. (Physical Review Letters), Jan. 26, 2007, vol. 98, pp. 045501-1-045501-4.

Park.J et al., "Dry etching of ZnO films and plasma-induced damage to optical properties,", J. Vac. Sci. Technol. B (Journal of Vacuum Science & Technology B), Mar. 1, 2003, vol. 21, No. 2, pp. 800-803.

Oh.M et al., "Improving the Gate Stability of ZnO Thin-Film Transistors With Aluminum Oxide Dielectric Layers,", J. Electrochem. Soc. (Journal of the Electrochemical Society), 2008, vol. 155, No. 12, pp. H1009-H1014.

Ueno.K et al., "Field-Effect Transistor on SrTiO3 With Sputtered Al2O3 Gate Insulator,", Appl. Phys. Lett. (Applied Physics Letters) , Sep. 1, 2003, vol. 83, No. 9, pp. 1755-1757.

\* cited by examiner

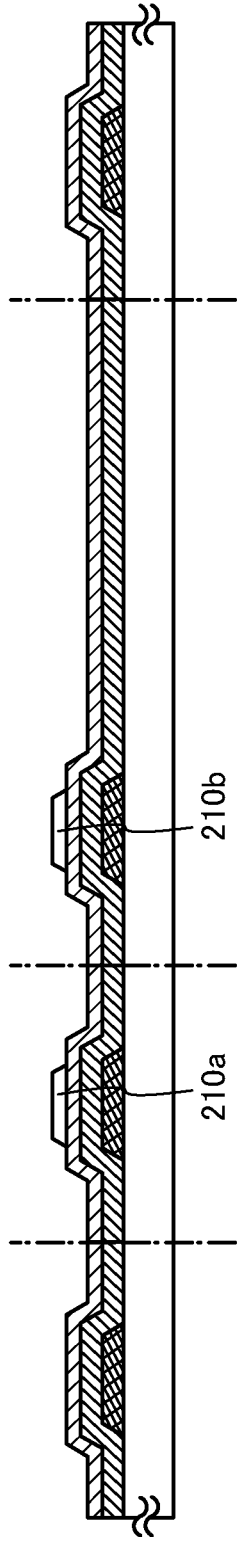
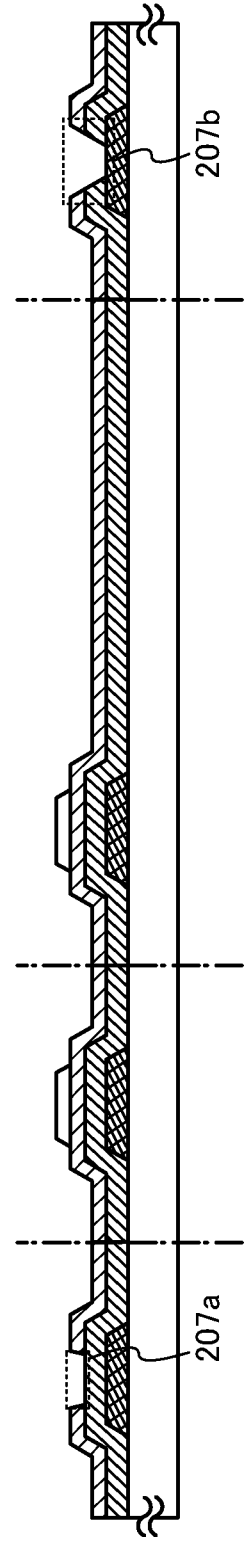

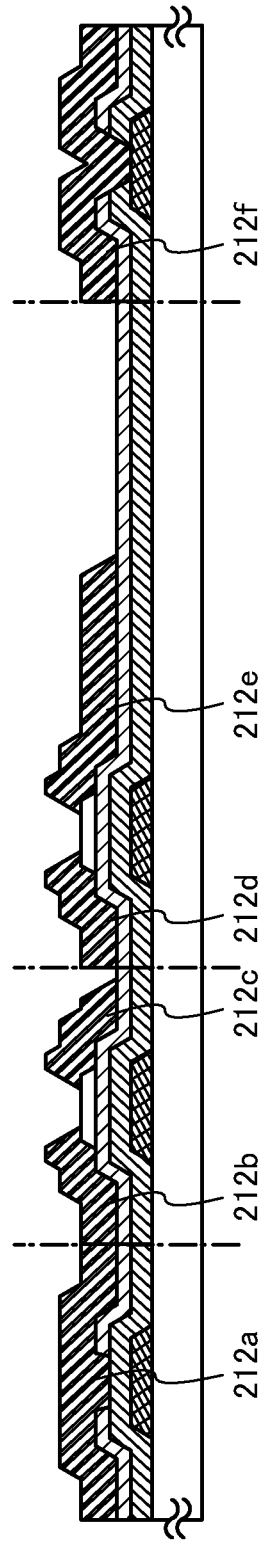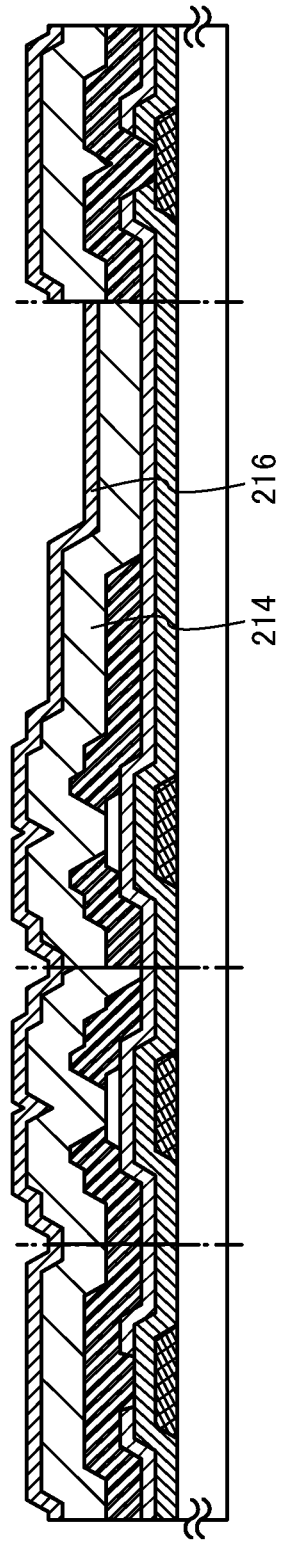
FIG. 9A
FIG. 9B

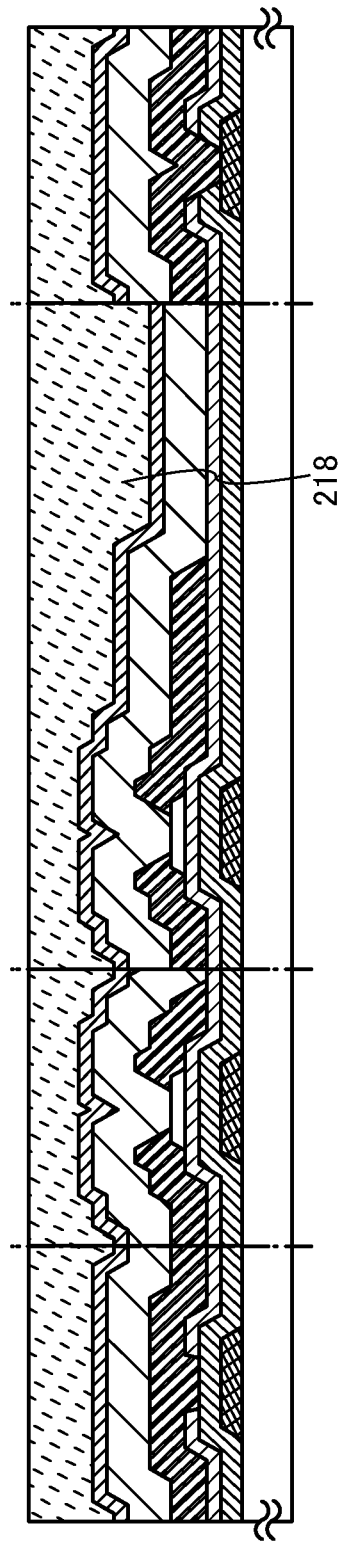
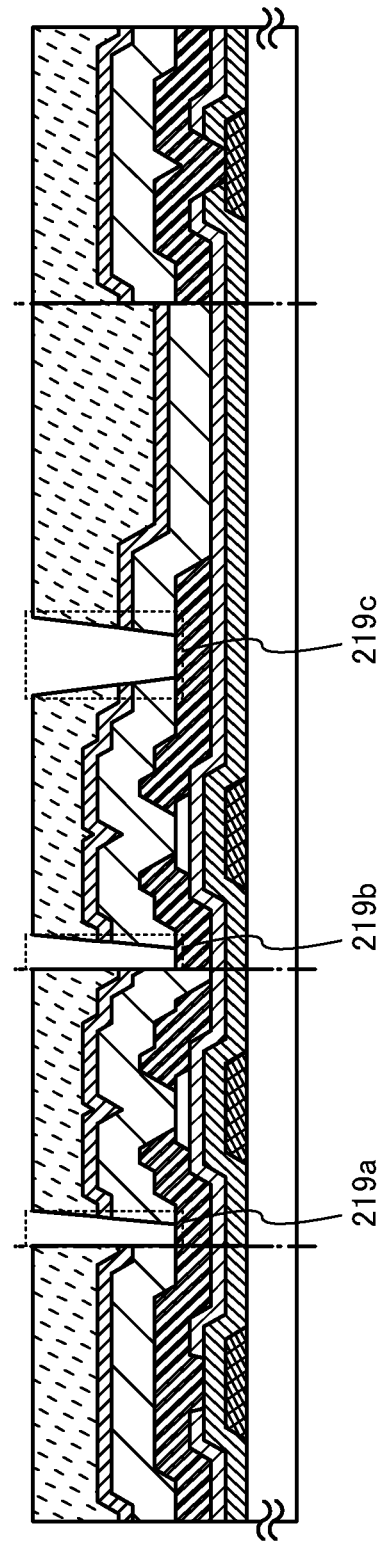
FIG. 10A
FIG. 10B

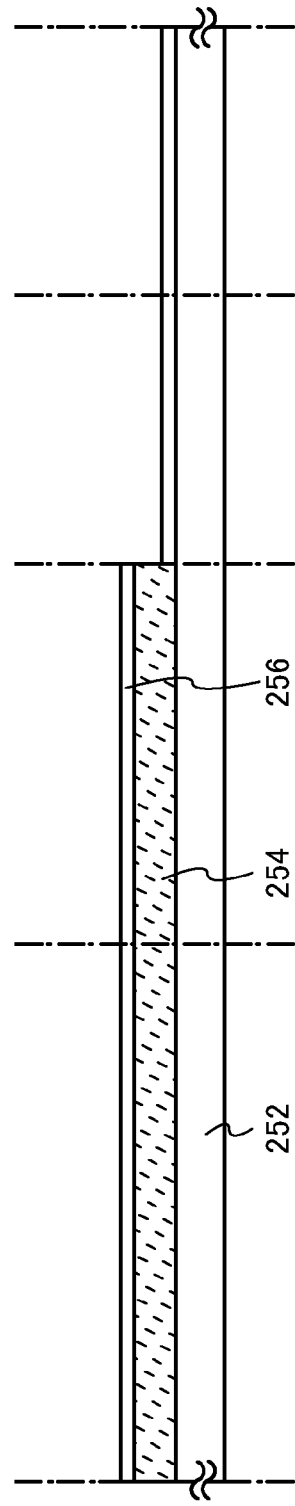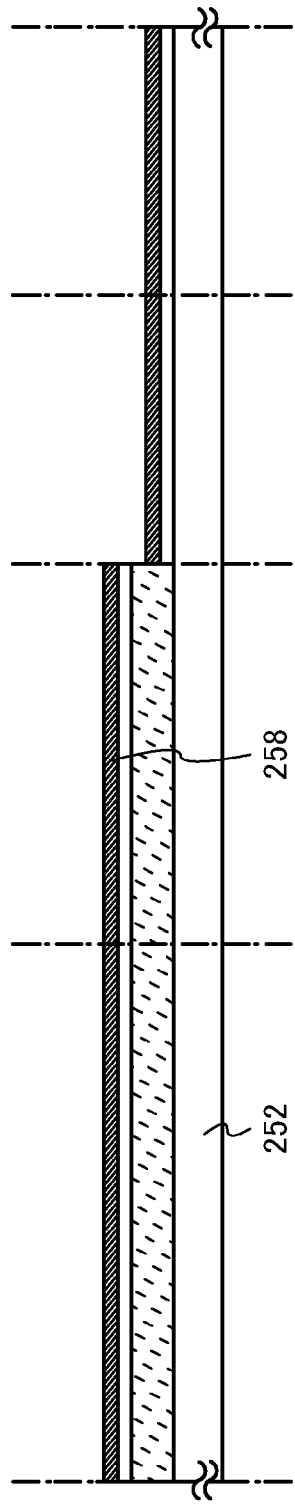

DISPLAY DEVICE AND ELECTRONIC DEVICE

BACKGROUND OF THE INVENTION

1. Field of the Invention

The present invention relates to an object, a method, a production method, a process, a machine, a manufacture, and a composition (a composition of matter). In particular, the present invention relates to a semiconductor device, a display device, a light-emitting device, an electronic device, a driving method thereof, or a manufacturing method thereof. In particular, the present invention relates to a semiconductor device, a display device, an electronic device or a light-emitting device each including an oxide semiconductor.

Note that the term "display device" means a device including a display element. In addition, the display device also includes a driver circuit for driving a plurality of pixels, and the like. Further, the display device includes a control circuit, a power supply circuit, a signal generation circuit, or the like formed over another substrate.

2. Description of the Related Art

For display devices typified by liquid crystal display devices, elements and wirings have been downsized with recent technological innovation and mass production technology has also been improved greatly. Improvement in fabrication yield is required to achieve lower cost in the future.

If a surge voltage due to static electricity or the like is applied to a display device, an element is broken to produce abnormal display. Thus, fabrication yield might be decreased. To overcome that, a protection circuit for releasing a surge voltage to another wiring is provided in a display device (see Patent Documents 1 to 7, for example).

[Reference]

[Patent Document 1] Japanese Published Patent Application No. 2010-92036

[Patent Document 2] Japanese Published Patent Application No. 2010-92037

[Patent Document 3] Japanese Published Patent Application No. 2010-97203

[Patent Document 4] Japanese Published Patent Application No. 2010-97204

[Patent Document 5] Japanese Published Patent Application No. 2010-107976

[Patent Document 6] Japanese Published Patent Application No. 2010-107977

[Patent Document 7] Japanese Published Patent Application No. 2010-113346

SUMMARY OF THE INVENTION

A structure aiming at improvement in reliability is important for display devices, like a protection circuit.

It is an object of one embodiment of the present invention to provide a display device having a novel structure that can improve reliability. Alternatively, it is another object of one embodiment of the present invention to provide a display device having a novel structure that can reduce electrostatic discharge damages. Alternatively, it is another object of one embodiment of the present invention to provide a display device having a novel structure that can reduce adverse effects of static electricity. Alternatively, it is another object of one embodiment of the present invention is to provide a display device having a novel structure that hardly breaks down. Alternatively, it is another object of one embodiment of the present invention to provide a display device having a novel structure that can reduce adverse effects on a transistor in a rubbing process. Alternatively, it is another object of one embodiment of the present invention to provide a display device having a novel structure that can reduce adverse effects on a transistor in an inspecting step. Alternatively, it is another object of one embodiment of the present invention to provide a display device having a novel structure that can reduce adverse effects of a trouble when a touch sensor is used. Alternatively, it is another object of one embodiment of the present invention to provide a display device having a novel structure that can reduce fluctuation or degradation of transistor characteristics. Alternatively, it is another object of one embodiment of the present invention to provide a display device having a novel structure that can reduce fluctuation in the threshold voltage or deterioration of a transistor. Alternatively, it is another object of one embodiment of the present invention to provide a display device having a novel structure that can inhibit normally-on of a transistor. Alternatively, it is another object of one embodiment of the present invention to provide a display device having a novel structure that can increase fabrication yield of a transistor. Alternatively, it is another object of one embodiment of the present invention to provide a display device having a novel structure that can protect a transistor. Alternatively, it is another object of one embodiment of the present invention to provide a display device having a novel structure that can discharge electric charge accumulated in a pixel electrode. Alternatively, it is another object of one embodiment of the present invention to provide a display device having a novel structure that can discharge electric charge accumulated in a wiring. Alternatively, it is another object of one embodiment of the present invention to provide a display device having a novel structure that has an oxide semiconductor layer having increased conductivity. Alternatively, it is another object of one embodiment of the present invention to provide a display device having a novel structure that can control the conductivity of an oxide semiconductor layer. Alternatively, it is another object of one embodiment of the present invention to provide a display device having a novel structure that can control the conductivity of a gate insulating film. Alternatively, it is another object of one embodiment of the present invention to provide a display device having a novel structure that enables normal display.

Note that the descriptions of these objects do not disturb the existence of other objects. Note that one embodiment of the present invention does not necessarily achieve all the objects. Objects other than the above objects will be apparent from and can be derived from the descriptions of the specification, the drawings, the claims, and the like.

One embodiment of the present invention is a display device including a pixel portion, a driver circuit portion that is provided outside the pixel portion, and a protection circuit that is electrically connected to one of or both the pixel portion and the driver circuit portion and includes a pair of electrodes. The pixel portion includes pixel electrodes arranged in a matrix and transistors electrically connected to the pixel electrodes. The transistors each include a first insulating layer containing nitrogen and silicon, and a second insulating layer containing oxygen, nitrogen, and silicon. The protection circuit includes the first insulating layer between the pair of electrodes.

According to one embodiment of the present invention, the reliability of a display device can be improved.

BRIEF DESCRIPTION OF THE DRAWINGS

In the accompanying drawings:

FIGS. 8A and 8B are cross-sectional views illustrating a method for manufacturing the display device;

FIGS. 9A and 9B are cross-sectional views illustrating a method for manufacturing the display device;

FIGS. 10A and 10B are cross-sectional views illustrating a method for manufacturing the display device;

FIGS. 12A and 12B are cross-sectional views illustrating a method for manufacturing a display device;

DETAILED DESCRIPTION OF THE INVENTION

Figure 1A:
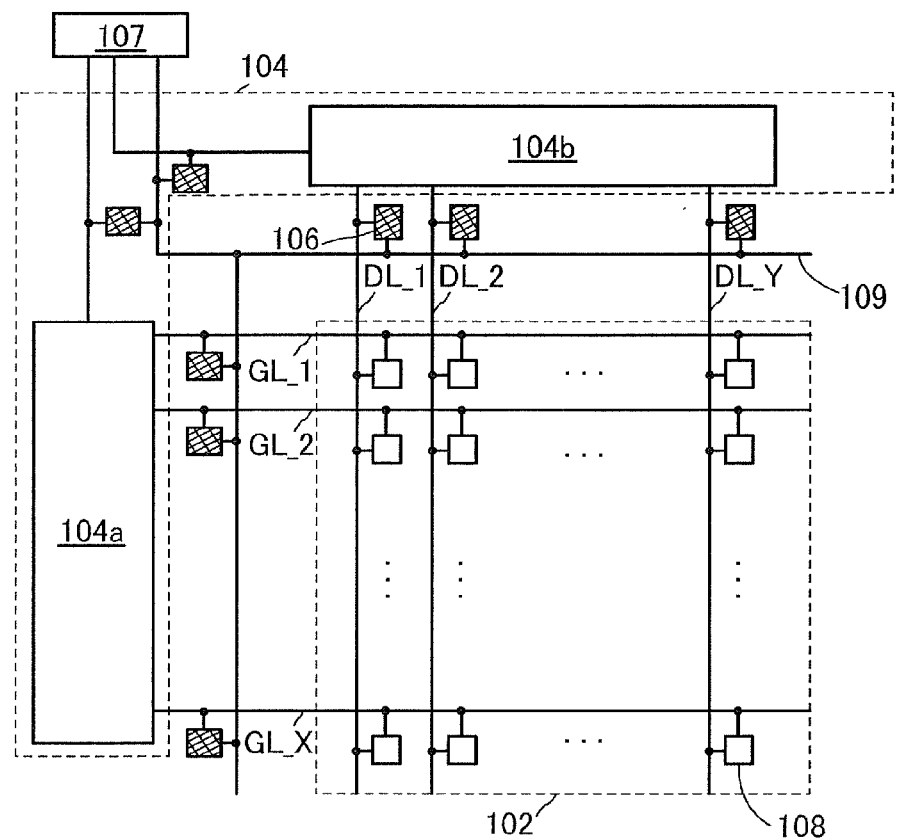
FIGS. 1A and 1B are a planar schematic view of a display device and a circuit diagram of a protection circuit.

Hereinafter, embodiments will be described with reference to drawings. However, the embodiments can be implemented with various modes. It will be readily appreciated by those skilled in the art that modes and details can be changed in various ways without departing from the spirit and scope of the present invention. Thus, the present invention should not be interpreted as being limited to the following descriptions of the embodiments.

In the drawings, the size, the thicknesses of layers, and/or regions may be exaggerated for clarity in some cases. Therefore, embodiments of the present invention are not limited to such scales. Note that drawings are schematic views of ideal examples, and the embodiments of the present invention are not limited to the shape or the value illustrated in the drawings. For example, variation in signal, voltage, or current due to noise or difference in timing can be included.

Note that in this specification and the like, a transistor is an element having at least three terminals of a gate, a drain, and a source. In addition, the transistor has a channel region between a drain (a drain terminal, a drain region, or a drain electrode) and a source (a source terminal, a source region, or a source electrode), and current can flow through the drain, the channel region, and the source.

Here, since the source and the drain of the transistor change depending on the structure, the operating condition, and the like of the transistor, it is difficult to define which is a source or a drain. Thus, a portion which functions as the source and a portion which functions as the drain are not called a source and a drain, and one of the source and the drain is referred to as a first electrode and the other thereof is referred to as a second electrode in some cases.

Note that in this specification, ordinal numbers such as "first", "second", and "third" are used in order to avoid confusion among components, and the terms do not limit the components numerically.

Note that in this specification, the phrase "A and B are connected" or "A is connected to B" means the case where A and B are electrically connected to each other in addition to the case where A and B are directly connected to each other. Here, the phrase "A and B are electrically connected" or "A is electrically connected to B" means the following case: when an object having any electrical function exists between A and B, an electric signal can be transmitted and received between A and B.

Note that in this specification, terms for describing arrangement, such as "over" "above", "under", and "below", are used for convenience in describing a positional relation between components with reference to drawings. Further, a positional relation between components is changed as appropriate in accordance with a direction in which each component is described. Thus, such a positional relation between components is not limited to the terms used in this specification, and can be described appropriately depending on the situation.

Note that the layout of circuit blocks in a block diagram in a drawing specifies the positional relation for description. Thus, even when a drawing shows that different functions are achieved in different circuit blocks, an actual circuit or region may be configured so that the different functions are achieved in the same circuit or region. Further, a function of each circuit block in a block diagram in a drawing is specified for description. Thus, even when one circuit block is illustrated, an actual circuit or region may be configured so that such processing as being performed in the one circuit block is performed in a plurality of circuit blocks.

Note that a pixel corresponds to a display unit that can control the luminance of one color component (e.g., any one of R (red), G (green), and B (blue)). Therefore, in a color display device, the minimum display unit of a color image is composed of three pixels of an R pixel, a G pixel and a B pixel. Note that the color elements for displaying a color image are not limited to the three colors, and color elements of more than three colors may be used or a color other than RGB may be used.

In this specification, embodiments of the present invention will be described with reference to the drawings. Embodiments will be described in the following order:
1. Embodiment 1 (Basic structure relating to one embodiment of the present invention)
2. Embodiment 2 (Components of display device)
3. Embodiment 3 (Method for manufacturing display device)

4. Embodiment 4 (Configuration of pixel circuit)
5. Embodiment 5 (Structures of pixel portion)
6. Embodiment 6 (Variations of pixel circuit)
7. Embodiment 7 (Structures of transistor)
8. Embodiment 8 (Structure of connection terminal portion)
9. Embodiment 9 (Touch sensor and display module)
10. Embodiment 10 (Electronic devices)

(Embodiment 1)

In this embodiment, a display device of one embodiment of the present invention will be described with reference to FIGS. 1A and 1B, FIGS. 2A and 2B, FIG. 3, FIGS. 4A and 4B, and FIG. 5.

The display device illustrated in FIG. 1A includes a region including display elements in pixels (hereinafter referred to as a pixel portion 102), a circuit portion including a circuit for driving the pixels (hereinafter referred to as a driver circuit portion 104), circuits each having a protective function for an element (hereinafter referred to as protection circuits 106), and a terminal portion 107.

The pixel portion 102 includes circuits for driving the plurality of display elements in X (X is a natural number of 2 or more) rows and Y columns (Y is a natural number of 2 or more) (hereinafter, such circuits are referred to as protection circuits 108). The driver circuit portion 104 includes driver circuits such as a circuit for supplying a signal (scan signal) to select a pixel (hereinafter the circuit is referred to as a gate driver 104a) and a circuit for supplying a signal (data signal) to drive a display element in a pixel (hereinafter, the circuit is referred to as a source driver 104b).

The gate driver 104a includes a shifter register or the like. The gate driver gate driver 104a receives a signal for driving the shift register through the terminal portion 107 and outputs a signal. For example, the gate driver 104a receives a start pulse signal, a clock signal, or the like and outputs a pulse signal. The gate driver 104a has a function of controlling the potentials of wirings supplied with scan signals (hereinafter, such wirings are referred to as scan lines GL_1 to GL_X). Note that the plurality of gate drivers 104a may be provided to separately control the scan lines GL_1 to GL_X. Alternatively, the gate driver 104a has, but is not limited to, a function of supplying an initialization signal. The gate driver 104a can supply another signal.

The source driver 104b includes a shift register or the like. The source driver 104b receives a signal (video signal) from which a data signal is derived, as well as a signal for driving the shift register, through the terminal portion 107. The source driver 104b has a function of generating a data signal to be written in the pixel circuits 108 based on the video signal. In addition, the source driver 104b has a function of controlling output of a data signal in response to a pulse signal produced by input of a start pulse, a clock signal, or the like. Further, the source driver 104b has a function of controlling the potentials of wirings supplied with data signals (hereinafter such wirings are referred to as data lines DL_1 to DL_Y). Alternatively, the source driver 104b has, but is not limited to, a function of supplying an initialization signal. The source driver 104b can supply another signal.

Alternatively, the source driver 104b is formed using a plurality of analog switches or the like, for example. The source driver 104b can output signals obtained by time-dividing an image signal as the data signals by sequentially turning on the plurality of analog switches. The source driver 104b may be formed using a shift register or the like.

A pulse signal and a data signal are input to each of the plurality of the pixel circuits 108 through one of the plurality of wirings supplied with scan signals (hereinafter scan lines GL) and one of the plurality of wirings supplied with data signals (hereinafter data lines DL), respectively. Writing and holding of the data signal in each of the plurality of pixel circuits 108 are performed by the gate driver 104a. For example, to the pixel circuit 108 in the m-th row and the n-th column (m is a natural number of less than or equal to X, and n is a natural number of less than or equal to Y), a pulse signal is input from the gate driver 104a through the scan line GL_m, and a data signal is input from the source driver 104b through the data line DL_n in accordance with the potential of the scan line GL_m.

The protection circuit 106 is connected to the scan line GL making a connection between the gate driver 104a and the pixel circuit 108. Alternatively, the protection circuit 106 is connected to a data line DL making a connection between the source driver 104b and the pixel circuit 108. Alternatively, the protection circuit 106 can be connected to a wiring making a connection between the gate driver 104a and the terminal portion 107. Alternatively, the protection circuit 106 can be connected to a wiring making a connection between the source driver 104b and the terminal portion 107. Note that the terminal portion 107 means a portion having terminals for inputting power, control signals, and video signals to the display device from external circuits.

The protection circuit 106 is a circuit which electrically connects a wiring connected to the protection circuit to another wiring when a potential out of a certain range is supplied to the wiring connected to the protection circuit. However, without being limited thereto, the protection circuit 106 can supply another signal.

As illustrated in FIG. 1A, the protection circuits 106 are provided for the pixel portion 102 and the driver circuit portion 104, so that the resistance of the display device to over-current generated by electrostatic discharge (ESD) or the like can be improved. Note that the configuration of the protection circuits 106 is not limited to that, and for example, a configuration in which the protection circuits 106 are connected to the gate driver 104a and are not connected to the source driver 104b or a configuration in which the protection circuits 106 are connected to the gate driver 104b and are not connected to the source driver 104a may be employed. Alternatively, a configuration in which the terminal portion 107 is connected to the protection circuit 106 may be employed.

In the non-limiting example illustrated in FIG. 1A, the driver circuit portion 104 includes the gate driver 104a and the source driver 104b. For example, only the gate driver 104a may be formed and a separately prepared substrate where a source driver circuit is formed (e.g., a driver circuit substrate formed with a single crystal semiconductor film or a poly-crystalline semiconductor film) may be mounted.

Thus, the protection circuit 106 is electrically connected to one of or both the pixel portion 102 and the driver circuit portion 104.

Figure 1B:
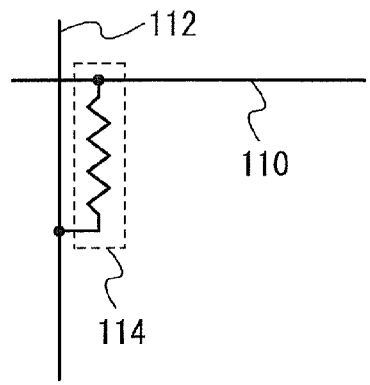

The protection circuit 106 can be formed using a resistor, for example. FIG. 1B illustrates a specific example of the protection circuit.

In the protection circuit 106 illustrated in FIG. 1B, a resistor 114 is connected between a wiring 110 and a wiring 112. The wiring 110 is, for example, a lead wiring led out from the scan line GL, the data line DL, or the terminal portion 107 to the driver circuit portion 104 in FIG. 1A.

The wiring 112 is, for example, a wiring that is supplied with the potential (VDD, VSS, or GND) of a power supply line for supplying power to the gate driver 104a or the source driver 104b illustrated in FIG. 1A. Alternatively, the wiring 112 is a wiring that is supplied with a common potential (common line). For example, the wiring 112 is preferably connected to the power supply line for supplying power to the gate driver 104*a*, in particular, to a wiring for supplying a low potential. This is because the scan line GL has a low potential in most periods, and thus, when the wiring 112 has also a low potential, current leaked from the scan line GL to the wiring 112 can be reduced in a normal operation.

Structural examples of the resistor 114 will be described with reference to FIGS. 2A and 2B.

The resistor 114 illustrated in FIG. 2A includes a layer having a conductive property over the substrate 140 (hereinafter, the layer is referred to as a conductive layer 142), a layer having an insulating property over the substrate 140 and the conductive layer 142 (hereinafter the layer is referred to as an insulating layer 144), and a layer having a conductive property over the insulating layer 144 (hereinafter the layer is referred to as a conductive layer 148).

Figure 2A:
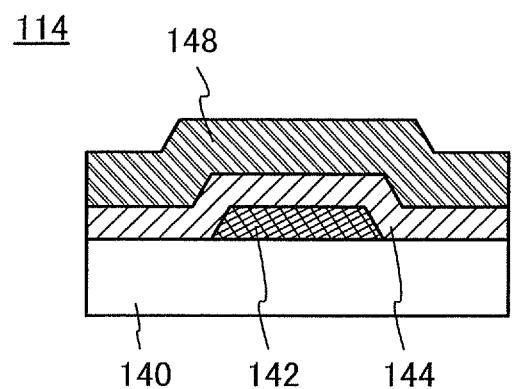
FIGS. 2A and 2B are cross-sectional views each illustrating a resistor in a display device.
Figure 2B:
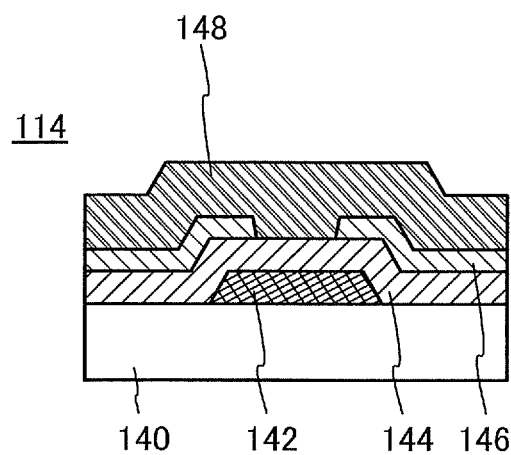

The resistor 114 illustrated in FIG. 2B includes the conductive layer 142 over the substrate 140, the insulating layer 144 over the substrate 140 and the conductive layer 142, an insulating layer 146 over the insulating layer 144, and the conductive layer 148 over the insulating layer 144 and the insulating layer 146.

Note that the wiring 112 illustrated in FIG. 1B corresponds to a wiring formed of the conductive layer 142, and the wiring 110 illustrated in FIG. 1B corresponds to a wiring formed of the conductive layer 148.

In other words, the resistor 114 illustrated in FIGS. 2A and 2B has a structure in which the insulating layer 144 is interposed between a pair of electrodes. The resistivity (also referred to as resistance, electric resistivity or specific resistance) of the insulating layer 144 is controlled, so that when overcurrent flows to one of the pair of electrodes, part or the whole of overcurrent can be made to flow to the other.

However, when the resistance of the insulating layer interposed between the pair of electrodes is high, for example, an insulating layer having a resistivity of $10^{18}$ Ωcm or higher is used, overcurrent flowing to one of the pair of electrodes cannot be made to flow to the other favorably.

For that reason, in one embodiment of the present invention, the resistivity of the insulating layer 144 interposed between the pair of electrodes is, for example, $10^{10}$ Ωcm or higher and lower than $10^{18}$ Ωcm, preferably, $10^{11}$ Ωcm or higher and lower than $10^{15}$ Ωcm. An example of the insulating film having such a resistivity includes an insulating film containing nitrogen and silicon.

In addition, the resistor 114 may have a structure in which the insulating layer 146 is formed over the insulating layer 144 so as to cover an end portion of one of the pair of electrodes as illustrated in FIG. 2B. The insulating layer 146 can be formed using a material having a resistivity higher than that of the insulating layer 144. For example, an insulating film having a resistivity of $10^{18}$ Ωcm or higher may be used for the insulating layer 146. An example of the insulating film having such a resistivity includes an insulating film containing oxygen, nitrogen, and silicon.

In addition, the conductive layers 142 and 148 serving as the pair of electrodes of the resistor 114 and the insulating layers 144 and 146 serving as the insulating layers of the resistor 114 can be formed in the same steps as the fabrication steps of the transistors included in the pixel portion 102 and the driver circuit portion 104 in the display device illustrated in FIG. 1A.

Specifically, the conductive layer 142 can be formed in the same step as the gate electrode of the transistor, the conductive layer 148 can be formed in the same step as the source electrode or the drain electrode of the transistor, and the insulating layers 144 and 146 can be formed in the same step as the gate insulating layer of the transistor.

By the protection circuit 106 provided in the display device illustrated in FIG. 1A in this manner, the pixel portion 102 and the driver circuit portion 104 can have increased resistance to overcurrent generated by ESD or the like. Therefore, a novel display device with improved reliability can be provided.

The pixel portion 102 is preferably formed over the same substrate as the protection circuit 106, for example, in which case the number of components and the number of terminals can be reduced. Part or the whole of the driver circuit portion 104 is preferably formed over the same substrate as the pixel portion 102, for example, in which case the number of components and the number of terminals can be reduced. When part or the whole of the driver circuit portion 104 is not formed over the same substrate as the pixel portion 102, part or the whole of the driver circuit portion 104 is often mounted by COG or TAB.

Next, a specific configuration of the display device illustrated in FIG. 1A will be described with reference to FIG. 3.

Figure 3:
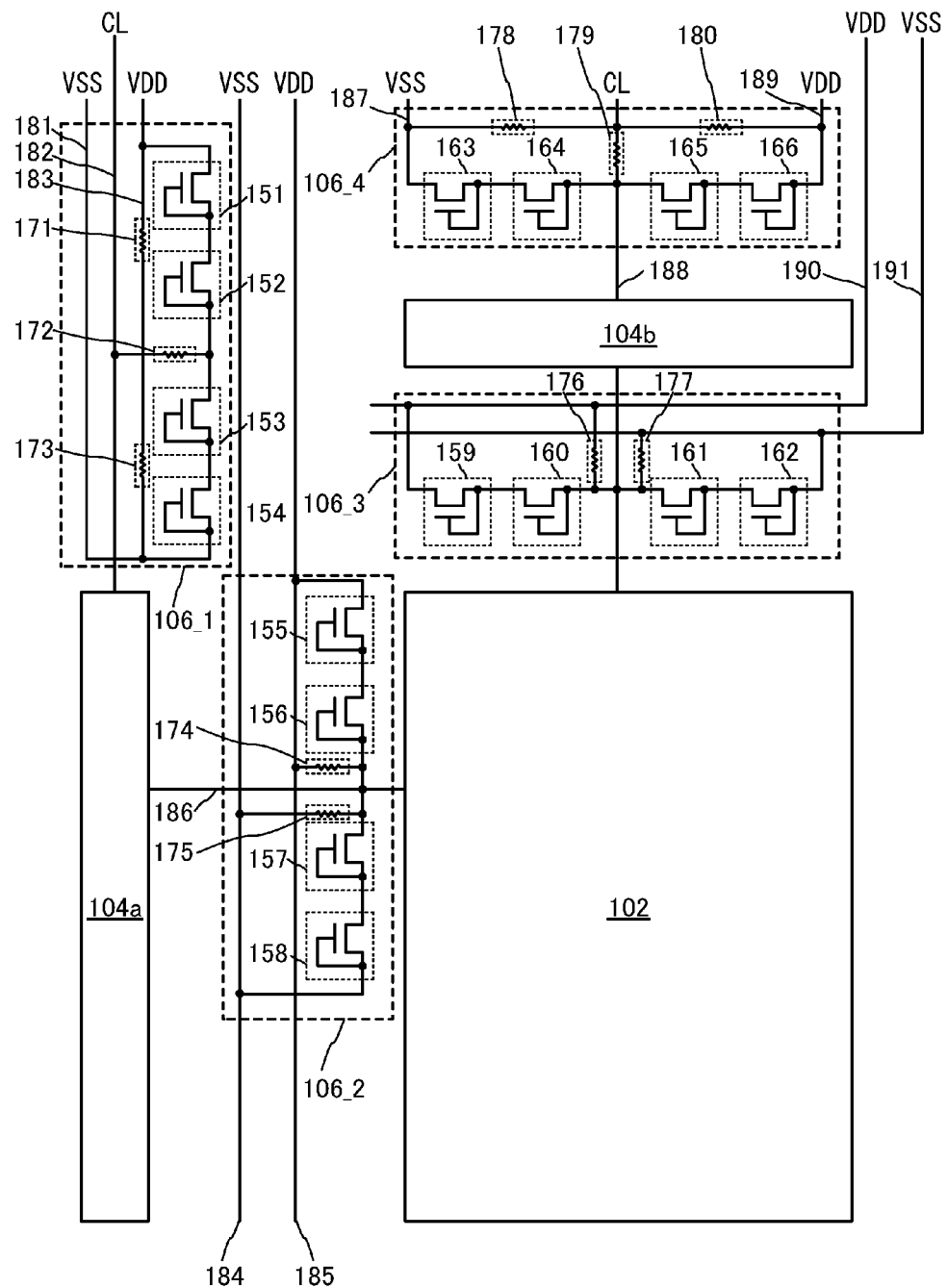
FIG. 3 is a planar schematic view of a display device that includes a circuit diagram of a protection circuit.

A display device illustrated in FIG. 3 includes the pixel portion 102, the gate driver 104*a* serving as a driver circuit portion, the source driver 104*b*, a protection circuit 106_1, a protection circuit 106_2, a protection circuit 106_3, and a protection circuit 106_4.

Note that the pixel portion 102, the gate driver 104*a*, and the source driver 104*b* have the same structures as those illustrated in FIG. 1A.

The protection circuit 106_1 includes transistors 151, 152, 153, and 154 and resistors 171, 172, and 173. In addition, the protection circuit 106_1 is provided between the gate driver 104*a* and wirings 181, 182, and 183 connected to the gate driver 104*a*. In addition, a first terminal serving as a source electrode of the transistor 151 is connected to a second terminal serving as a gate electrode of the transistor 151, and a third terminal serving as a drain electrode of the transistor 151 is connected to the wiring 183. A first terminal serving as a source electrode of the transistor 152 is connected to a second terminal serving as a gate electrode of the transistor 152, and a third terminal serving as a drain electrode of the transistor 152 is connected to the first terminal of the transistor 151. A first terminal serving as a source electrode of the transistor 153 is connected to a second terminal serving as a gate electrode of the transistor 153, and a third terminal serving as a drain electrode of the transistor 153 is connected to the first terminal of the transistor 152. A first terminal serving as a source electrode of the transistor 154 is connected to a second terminal serving as a gate electrode of the transistor 154, a third terminal serving as a drain electrode is connected to the first terminal of the transistor 153, and the first terminal of the transistor 154 is connected to the wiring 183 and the wiring 181. In addition, the wiring 183 is provided with the resistors 171 and 173. In addition, the resistor 172 is provided between the wiring 182, the first terminal of the transistor 152, and the third terminal of the transistor 153.

Note that for example, the wiring 181 can be used as a power supply line that is supplied with the low power supply potential VSS; the wiring 182 can be used as a common line; and the wiring 183 can be used as a power supply line that is supplied with the high power supply potential VDD.

The protection circuit 106_2 includes transistors 155, 156, 157, and 158 and resistors 174 and 175. In addition, the protection circuit 106_2 is provided between the gate driver 104*a* and the pixel portion 102. In addition, a first terminal serving as a source electrode of the transistor 155 is connected to a second terminal serving as a gate electrode of the transistor 155, and a third terminal serving as a drain electrode of the transistor 155 is connected to the wiring 185. A first terminal serving as a source electrode of the transistor 156 is connected to a second terminal serving as a gate electrode of the transistor 156, and a third terminal serving as a drain electrode of the transistor 156 is connected to the first terminal of the transistor 155. A first terminal serving as a source electrode of the transistor 157 is connected to a second terminal serving as a gate electrode of the transistor 157, and a third terminal serving as a drain electrode of the transistor 157 is connected to the first terminal of the transistor 156. A first terminal serving as a source electrode of the transistor 158 is connected to a second terminal serving as a gate electrode of the transistor 158, a third terminal serving as a drain electrode of the transistor 158 is connected to the first terminal of the transistor 157, and the first terminal of the transistor 158 is connected to the wiring 184. In addition, the resistor 174 is provided between the wiring 185, the first terminal of the transistor 156, and the third terminal of the transistor 157, and the resistor 175 is provided between the wiring 184, the first terminal of the transistor 156, and the third terminal of the transistor 157.

Note that for example, the wiring 184 can be used as a power supply line that is supplied with the low power supply potential VSS; the wiring 185 can be used as a power supply line that is supplied with the high power supply potential VDD; and the wiring 186 can be used as a gate line.

The protection circuit 106_3 includes transistors 159, 160, 161, and 162 and resistors 176 and 177. In addition, the protection circuit 106_3 is provided between the source driver 104b and the pixel portion 102. In addition, a first terminal serving as a source electrode of the transistor 159 is connected to a second terminal serving as a gate electrode of the transistor 159, and a third terminal serving as a drain electrode of the transistor 159 is connected to a wiring 190. A first terminal serving as a source electrode of the transistor 160 is connected to a second terminal serving as a gate electrode of the transistor 160, and a third terminal serving as a drain electrode of the transistor 160 is connected to the first terminal of the transistor 159. A first terminal serving as a source electrode of the transistor 161 is connected to a second terminal serving as a gate electrode of the transistor 161, and a third terminal serving as a drain electrode of the transistor 161 is connected to the first terminal of the transistor 160. A first terminal serving as a source electrode of the transistor 162 is connected to a second terminal serving as a gate electrode of the transistor 162, and a third terminal serving as a drain electrode of the transistor 162 is connected to the first terminal of the transistor 161. In addition, the first terminal of the transistor 162 is connected to a wiring 191. Further, the resistor 176 is provided between the wiring 190, the first terminal of the transistor 160, and the third terminal of the transistor 161, and the resistor 177 is provided between the wiring 191, the first terminal of the transistor 160, and the third terminal of the transistor 161.

Note that for example, the wiring 188 can be used as a common line or a source line; the wirings 189 and 190 can be used as a power supply line that is supplied with the high power supply potential VDD; and the wiring 191 can be used as a power supply line that is supplied with the low power supply potential VSS.

The protection circuit 106_4 includes transistors 163, 164, 165, and 166 and resistors 178, 179, and 180. In addition, the protection circuit 106_4 is provided between the source driver 104b and wirings 187, 188, 189, 190, and 191 connected to the source driver 104b. In addition, a first terminal serving as a source electrode of the transistor 163 is connected to a second terminal serving as a gate electrode of the transistor 163, and a third terminal serving as a drain electrode of the transistor 163 is connected to the wiring 187. A first terminal serving as a source electrode of the transistor 164 is connected to a second terminal serving as a gate electrode of the transistor 164, and a third terminal serving as a drain electrode of the transistor 164 is connected to the first terminal of the transistor 163. A first terminal serving as a source electrode of the transistor 165 is connected to a second terminal serving as a gate electrode of the transistor 165, and a third terminal serving as a drain electrode of the transistor 165 is connected to the first terminal of the transistor 164. A first terminal serving as a source electrode of the transistor 166 is connected to a second terminal serving as a gate electrode of the transistor 166, and a third terminal serving as a drain electrode of the transistor 166 is connected to the first terminal of the transistor 165. In addition, the first terminal of the transistor 166 is connected to the wiring 189. Further, the resistor 178 is provided between the wiring 187 and the wiring 188. The wiring 188 is provided with the resistor 179, and the resistor 179 is connected to the first terminal of the transistor 164 and the third terminal of the transistor 165. The resistor 180 is provided between the wiring 188 and the wiring 189.

Note that for example, the wirings 187 and 191 can be used as power supply lines that are supplied with the low power supply potential VSS; the wiring 188 can be used as a common line or a source line; the wirings 189 and 190 can be used as power supply lines that are supplied with the high power supply potential VDD.

Note that the functions of the wirings 181 to 191 are not limited to functions of being supplied with the high power supply potential VDD and the low power supply potential VSS, and a function of the common line CL illustrated in FIG. 3, and the wirings 181 to 191 can have functions of a scan line, a signal line, a power supply line, a ground line, a capacitor line, a common line, and the like, independently.

Semiconductor layers of the transistors 151 to 166 in the protection circuits 106_1 to 106_4 are preferably formed using an oxide semiconductor. The transistors including an oxide semiconductor hardly cause avalanche breakdown and have higher resistance to an electric field than that of transistors including semiconductor layers formed using silicon or the like. Examples of the structure of the transistors 151 to 166 include a planar structure and an inverted staggered structure.

In this manner, the protection circuits 106_1 to 106_4 each include a plurality of transistors that are diode-connected and a plurality of resistors. In other words, the protection circuits 106_1 to 106_4 can include diode-connected transistors and resistors that are combined in parallel.

In addition, the protection circuits 106_1 to 106_4 illustrated in FIG. 3 can be provided between the gate driver 104a and wirings connected to the gate driver 104a, between the pixel portion 102 and the gate driver 104a, between the pixel portion 102 and the source driver 104b, and between the source driver 104b and wirings connected to the source driver 104b.

Figure 4A:
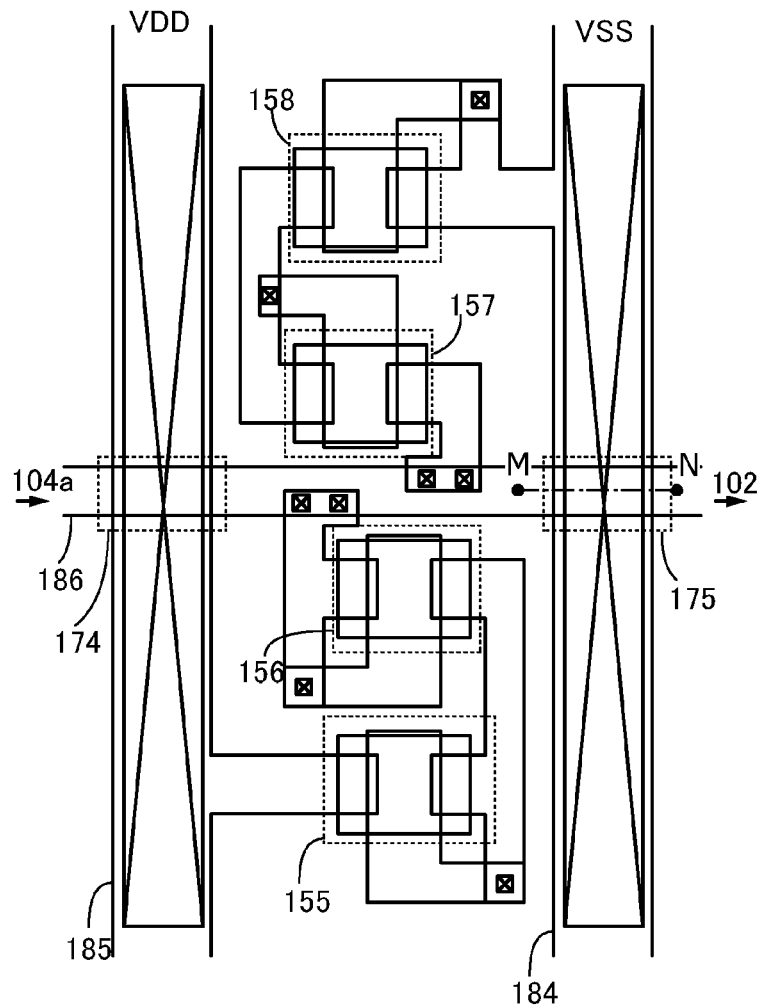
FIGS. 4A and 4B are a plan view and a cross-sectional view of a protection circuit and a resistor.
Figure 4B:
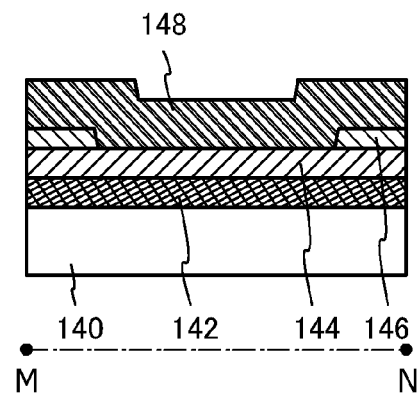

FIG. 4A is a plan view of the protection circuit 106_2 illustrated in FIG. 3 and FIG. 4B is a cross-sectional view of a region serving as the resistor. The reference numerals in the plan view of FIG. 4A correspond to the reference numerals in FIG. 3. FIG. 4B is a cross-sectional view along section line M-N in FIG. 4A. As illustrated in FIGS. 4A and 4B, part of the insulating layer overlapping with the wiring is removed to control the resistivity of the insulating layer between wirings, so that the resistor in the protection circuit described in this embodiment can release overcurrent favorably.

Figure 5:
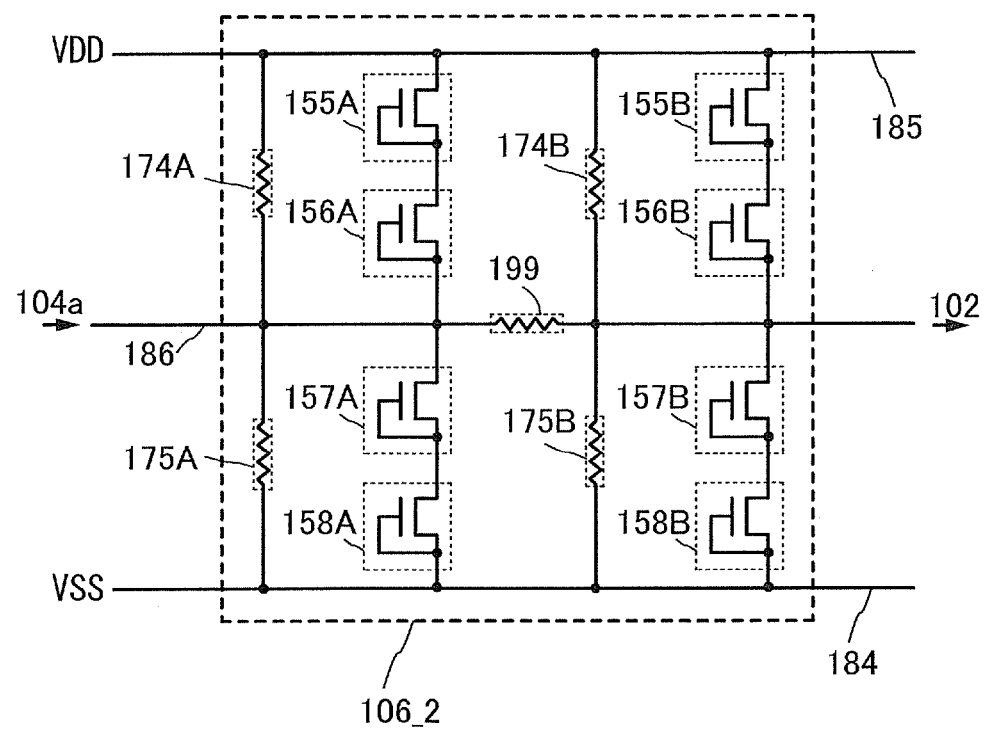
FIG. 5 is a circuit diagram of a protection circuit.

Further, FIG. 5 is a circuit diagram having a configuration different from that of the protection circuit described with reference to FIG. 3. In the circuit diagram illustrated in FIG. 5, transistors 155A to 158A, transistors 155B to 158B, resistors 174A and 175A, resistors 174B and 175B, a resistor 199, the wiring 184, the wiring 185 and the wiring 186 are illustrated. The reference numerals in the circuit diagram of FIG. 5 correspond to the reference numerals used for the protection circuit 106_2 in FIG. 3 for the components common in FIG. 5 and FIG. 3. The protection circuit 106_2 in FIG. 5 is different from that in FIG. 3 in that circuits corresponding to the protection circuit 106_2 in FIG. 3 are placed side by side and the resistor 199 is placed between wirings.

Note that the resistor 199 included in the protection circuit 106_2 illustrated in FIG. 5 preferably has a resistivity much lower than the resistivities of the resistors 174A, 175A, 174B, and 175B, in which case the resistivity of the resistor 199 is $10^3$ Ωcm or higher and lower than $10^6$ Ωcm and the resistivities of the resistors 174A, 175A, 174B, and 175B are $10^{10}$ Ωcm or higher and lower than $10^{18}$ Ωcm. With the configuration of the circuit diagram illustrated in FIG. 5, a steep change of signals supplied to the wirings can be suppressed.

By the plurality of protection circuits provided in the display device in such a manner, the resistances of the pixel portion 102 and the driver circuit portion 104 (the gate driver 104a and the source driver 104b) to overcurrent due to ESD or the like can be further improved. Therefore, a novel display device with improved reliability can be provided.

Although this embodiment has described an example where the protection circuits, the resistors, the transistors, and the like are provided, one embodiment of the present invention is not limited to this embodiment. Depending on the situation, for example, no protection circuit can be provided.

The structure described in this embodiment can be used in combination with any of the structures described in the other embodiments as appropriate.

(Embodiment 2)

In this embodiment, the structure of a display device (also referred to as a liquid crystal display device) that includes the protection circuit described in Embodiment 1 and a vertical electric field mode liquid crystal display element will be described with reference to FIG. 6.

Figure 6:
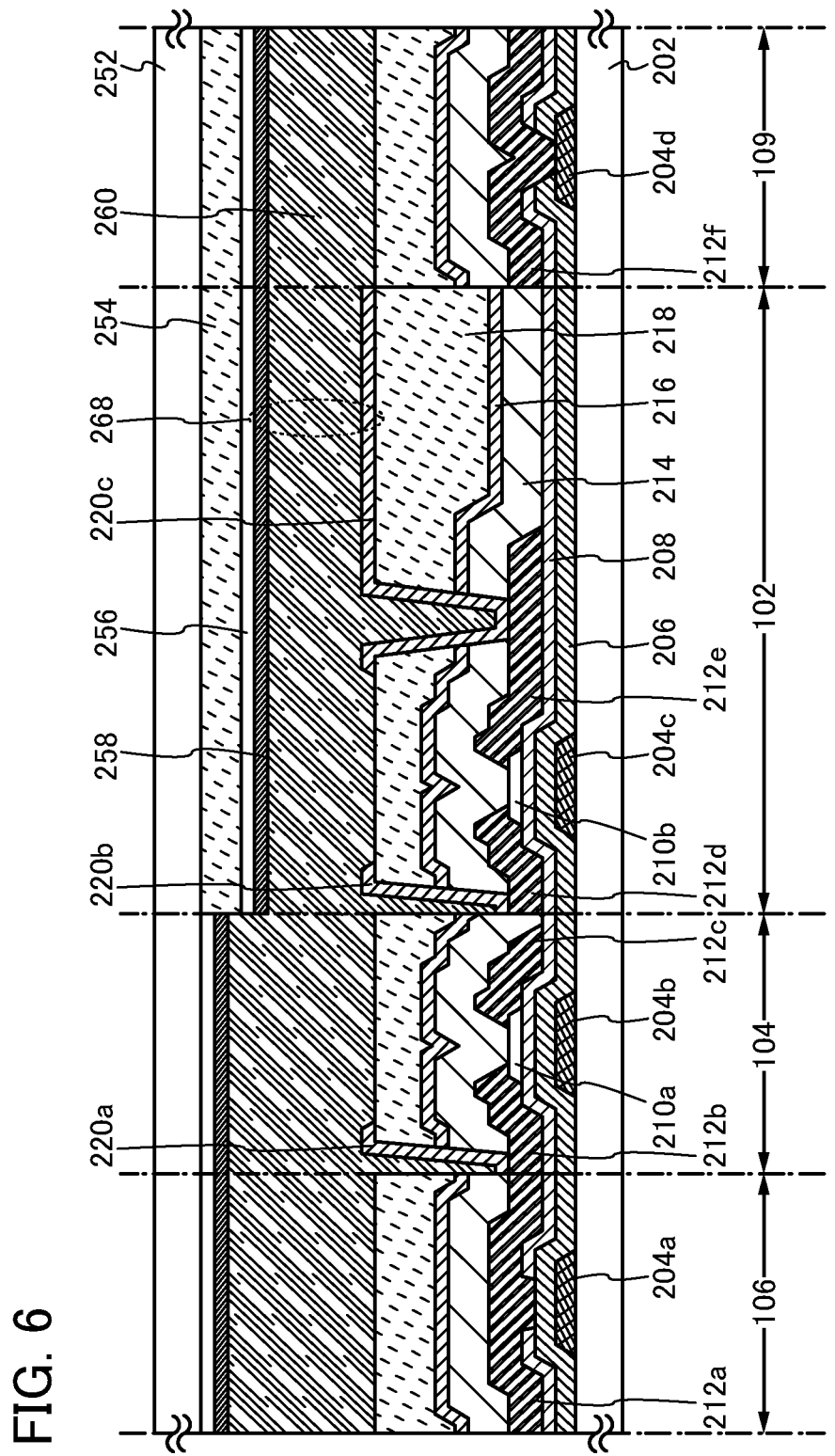
FIG. 6 is a cross-sectional view of a display device.

The display device illustrated in FIG. 6 includes the pixel portion 102, the driver circuit portion 104, and the protection circuit 106 of the display device illustrated in FIG. 1A. Further, a connecting portion 109 is illustrated as an example of a portion where conductive layers are connected to each other. The connecting portion 109 has a portion where a first conductive layer and a second conductive layer are connected to each other. Such a connection can be applied to the driver circuit portion 104, a lead wiring, or the like.

Although the display device illustrated in FIG. 6 has a structure where the protection circuit 106 is connected to the driver circuit portion 104, a structure of the display device in FIG. 6 is not limited thereto. For example, the protection circuit 106 can be configured to be connected between the driver circuit portion 104 and the pixel portion 102.

In the display device described in this embodiment, a liquid crystal element 268 is provided between a pair of substrates (a substrate 202 and a substrate 252).

The liquid crystal element 268 includes a conductive layer 220c over the substrate 202, a liquid crystal layer 260 over the conductive layer 220c, and a conductive layer 258 over the liquid crystal layer. The conductive layer 220c functions as one electrode of the liquid crystal element 268, and the conductive layer 258 functions as the other electrode of the liquid crystal element 268.

In this embodiment, the liquid crystal element 268 is a vertical electric field mode liquid crystal element. Typical examples of the vertical electric field mode liquid crystal element include a twisted nematic liquid crystal element, a super twisted nematic (STN) liquid crystal element, and a vertical alignment (VA) liquid crystal element. However, the liquid crystal element is not limited thereto and, for example, an in-plane-switching (IPS) liquid crystal element, a fringe field switching (FFS) liquid crystal element, or the like, which are transverse electric field mode liquid crystal elements, may alternatively be used.

Thus, "liquid crystal display device" refers to a device including a liquid crystal element. Note that the liquid crystal display device includes a driver circuit for driving a plurality of pixels, and the like. The liquid crystal display device may also be referred to as a liquid crystal module including a control circuit, a power supply circuit, a signal generation circuit, a backlight module, and the like provided over another substrate.

When the protection circuits 106 are provided for the driver circuit portion 104 and the pixel portion 102 as described in this embodiment, transistors provided in the driver circuit portion 104 and the pixel portion 102 of the liquid crystal display device can have resistance to overcurrent from the outside.

For example, static electricity might be caused by rubbing treatment performed in forming the liquid crystal element. However, the protection circuit 106 prevents or suppresses the flow of overcurrent due to the static electricity through the transistors provided in the pixel portion 102 and the driver circuit portion 104. Therefore, electrostatic breakdown of the transistors can be inhibited, so that the display device can have high reliability.

Here, other components of the display device illustrated in FIG. 6 will be described below.

Layers having a conductive property (hereinafter referred to as conductive layers 204a, 204b, 204c, and 204d) are formed over the substrate 202. The conductive layer 204a is formed in the protection circuit 106 and functions as one of a pair of electrodes of a resistor. The conductive layer 204b is formed in the driver circuit portion 104 and functions as a gate of the transistor in the driver circuit. The conductive layer 204c is formed in the pixel portion 102 and functions as a gate of the transistor in the pixel circuit. The conductive layer 204d is formed in the connecting portion 109 and connected to a conductive layer 212f.

Layers having an insulating property (hereinafter referred to as insulating layers 206 and 208) are formed over the substrate 202 and the conductive layers 204a, 204b, 204c, and 204d. The insulating layers 206 and 208 function as a gate insulating layer of the transistor in the driver circuit portion 104 and a gate insulating layer of the transistor in the pixel portion 102. The insulating layer 206 also functions as a resistor (resistive layer) in the protection circuit 106.

Layers with semiconductor characteristics (hereinafter referred to as semiconductor layers 210a and 210b) are formed over the insulating layer 208. The semiconductor layer 210a is formed in a position overlapping with the conductive layer 204b and functions as a channel of the transistor in the driver circuit. The semiconductor layer 210b is formed in a position overlapping with the conductive layer 204c and functions as a channel of the transistor in the pixel circuit.

Layers having a conductive property (hereinafter referred to as conductive layers 212a, 212b, 212c, 212d, 212e, and 212f) are formed over the insulating layers 206 and 208 and the semiconductor layers 210a and 210b. The conductive layer 212a functions as the other of the pair of electrodes of the resistor in the protection circuit 106. The conductive layer 212b is electrically connected to the semiconductor layer 210a and functions as one of a source and a drain of the transistor in the driver circuit. The conductive layer 212c is electrically connected to the semiconductor layer 210a and functions as the other of the source and the drain of the transistor in the driver circuit. The conductive layer 212d is electrically connected to the semiconductor layer 210b and functions as one of a source and a drain of the transistor in the pixel circuit. The conductive layer 212e is electrically connected to the semiconductor layer 210b and functions as the other of the source and the drain of the transistor in the pixel circuit. The conductive layer 212f is formed in the connecting portion 109 and electrically connected to the conductive layer 204d through an opening portion formed in the insulating layers 206 and 208.

Layers having an insulating property (hereinafter referred to as insulating layers 214 and 216) are formed over the insulating layer 208, the semiconductor layers 210a and 210b, and the conductive layers 212a, 212b, 212c, 212d, 212e, and 212f). The insulating layers 214 and 216 have a function of protecting the transistors. In particular, the insulating layer 214 protects the semiconductor layers 210a and 210b.

A layer having an insulating property (hereinafter referred to as an insulating layer 218) is formed over the insulating layer 216. The insulating layer 218 functions as a planarization layer. The provided insulating layer 218 can suppress generation of parasitic capacitance between the conductive layer below the insulating layer 218 and the conductive layer above the insulating layer 218.

Layers having a conductive property (hereinafter referred to as conductive layers 220a, 220b, and 220c) are formed over the conductive layer 218. The conductive layer 220a is electrically connected to the conductive layer 212b through an opening portion penetrating the insulating layers 214, 216, and 218 and functions as a connection electrode electrically connecting the conductive layer 212b in the driver circuit portion 104 and another wiring. The conductive layer 220b is electrically connected to the conductive layer 212d through an opening portion penetrating the insulating layers 214, 216, and 218 and functions as a connection electrode electrically connecting the conductive layer 212d in the pixel portion 102 and another wiring. The conductive layer 220c is electrically connected to the conductive layer 212e through an opening portion penetrating the insulating layers 214, 216, and 218 and functions as a pixel electrode in the pixel portion 102. The conductive layer 220c can also function as one of a pair of electrodes of the liquid crystal element in the pixel circuit.

A layer having a coloring property (hereinafter referred to as a coloring layer 254) is formed over the substrate 252. The coloring layer 254 functions as a color filter. Although not illustrated in FIG. 6, a light-blocking film that functions as a black matrix may be formed so as to be adjacent to the coloring layer 254. The coloring layer 254 is not necessarily provided in the case where the display device is a monochrome display device, for example.

A layer having an insulating property (hereinafter referred to as an insulating layer 256) is formed over the coloring layer 254. The insulating layer 256 functions as a planarization layer or suppresses diffusion of impurities in the coloring layer 254 to the liquid crystal element side.

A layer having a conductive property (hereinafter referred to as a conductive layer 258) is formed over the insulating layer 256. The conductive layer 258 functions as the other of the pair of electrodes of the liquid crystal element in the pixel circuit. Note that an insulating film that functions as an alignment film may be additionally formed over the conductive layers 220a, 220b, and 220c and the conductive layer 258.

A liquid crystal layer 260 is formed between the conductive layers 220a, 220b, and 220c and the conductive layer 258. The liquid crystal layer 260 is sealed between the substrate 202 and the substrate 252 with the use of a sealant (not illustrated). The sealant is preferably in contact with an inorganic material to prevent entry of moisture and the like from the outside.

A spacer may be provided between the conductive layers 220a, 220b, and 220c and the conductive layer 258 to maintain the thickness of the liquid crystal layer 260 (also referred to as a cell gap).

In the case of the display device described in this embodiment, the protection circuit 106 and the transistors included in the pixel portion 102 and the driver circuit portion 104 can be formed at the same time. Thus, the protection circuit 106 can be formed without increasing the manufacturing cost and the like.

The structure described in this embodiment can be used in combination with any of the structures described in the other embodiments, as appropriate.

(Embodiment 3)

In this embodiment, a manufacturing method of the display device described in Embodiment 2 will be described with reference to FIGS. 7A and 7B, FIGS. 8A and 8B, FIGS. 9A and 9B, FIGS. 10A and 10B, FIG. 11, and FIGS. 12A to 12B.

First, the substrate 202 is prepared. For the substrate 202, a glass material such as aluminosilicate glass, aluminoborosilicate glass, or barium borosilicate glass is used. In the mass production, for the substrate 202, a mother glass with any of the following sizes is preferably used: the 8-th generation (2160 mm×2460 mm), the 9-th generation (2400 mm×2800 mm, or 2450 mm×3050 mm), the 10-th generation (2950 mm×3400 mm), and the like. High process temperature and a long period of process time drastically might shrink such mother glass. Thus, in the case where mass production is performed with the use of the mother glass, the heating temperature in the manufacturing process is preferably lower than or equal to 600° C., more preferably lower than or equal to 450° C., still more preferably lower than or equal to 350° C.

Then, a conductive film is formed over the substrate 202 and processed into desired regions, so that the conductive layers 204a, 204b, 204c, and 204d are formed. The conductive layers 204a, 204b, 204c, and 204d can be formed in such a manner that a mask is formed in a desired region by first patterning and regions not covered with the mask are etched (see FIG. 7A).

For the conductive layers 204a, 204b, 204c, and 204d, a metal element selected from aluminum, chromium, copper, tantalum, titanium, molybdenum, and tungsten, an alloy containing any of these metal elements as a component, an alloy containing these metal elements in combination, or the like can be used. The conductive layers 204a, 204b, 204c, and 204d may have a single-layer structure or a layered structure including two or more layers. For example, a two-layer structure in which a titanium film is stacked over an aluminum film, a two-layer structure in which a titanium film is stacked over a titanium nitride film, a two-layer structure in which a tungsten film is stacked over a titanium nitride film, a two-layer structure in which a tungsten film is stacked over a tantalum nitride film or a tungsten nitride film, a three-layer structure in which a titanium film, an aluminum film, and a titanium film are stacked in this order, and the like can be given. Alternatively, a film, an alloy film, or a nitride film which contains aluminum and one or more elements selected from titanium, tantalum, tungsten, molybdenum, chromium, neodymium, and scandium may be used. The conductive layers 204a, 204b, 204c, and 204d can be formed by a sputtering method, for example.

Through the above process, the conductive layer 204a in the protection circuit 106, the conductive layer 204c in the pixel portion 102, and the conductive layer 204b in the driver circuit portion 104 can be formed so as to be level with one another.

Figure 7A:
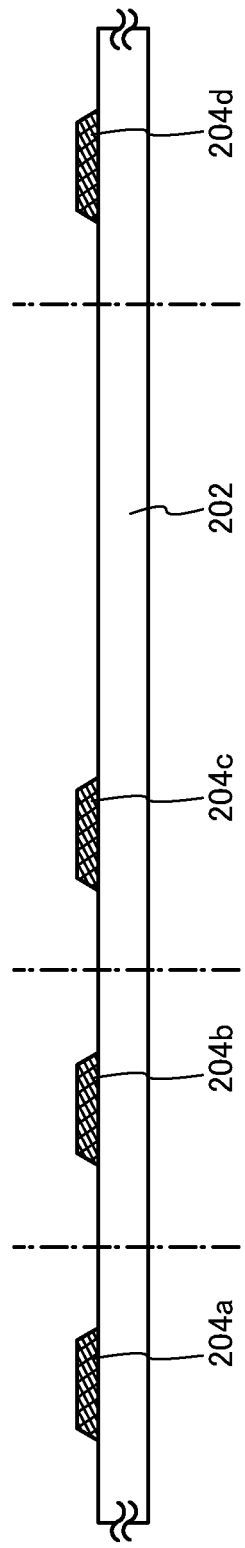
FIGS. 7A and 7B are cross-sectional views illustrating a method for manufacturing a display device.
Figure 7B:
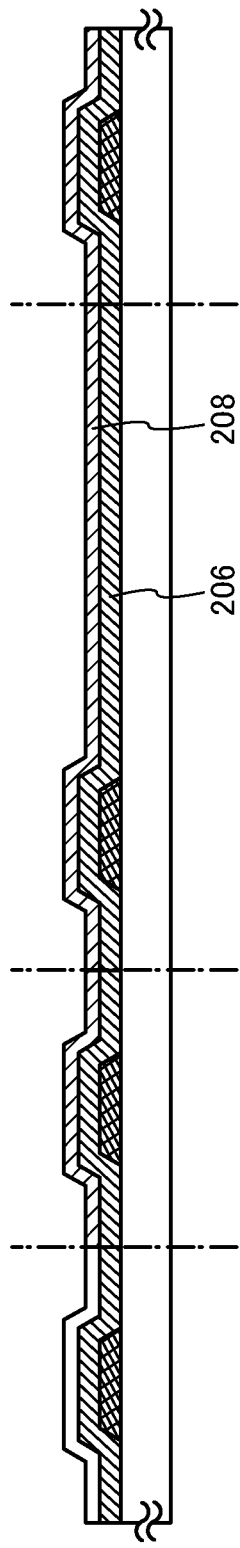
Figure 11:
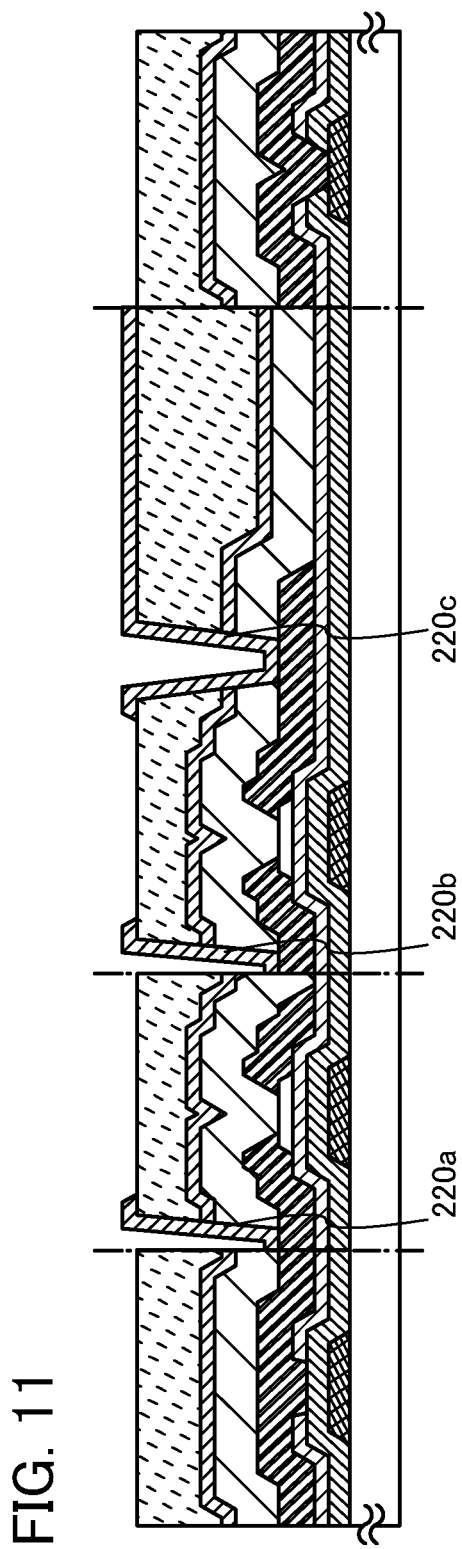
FIG. 11 is a cross-sectional view illustrating a method for manufacturing the display device.

Next, the insulating layers 206 and 208 are formed over the substrate 202 and the conductive layers 204a, 204b, 204c, and 204d (see FIG. 7B).

The insulating layer 206 is formed to have a single-layer structure or a layered structure using, for example, any of a silicon nitride oxide film, a silicon nitride film, an aluminum oxide film, and the like with a PE-CVD apparatus. In the case where the insulating layer 206 has a layered structure, it is preferable that a silicon nitride film with fewer defects be provided as a first silicon nitride film, and a silicon nitride film from which hydrogen and ammonia are less likely to be released be provided over the first silicon nitride film, as a second silicon nitride film. In such a case, transfer of hydrogen and nitrogen contained in the insulating layer 206 to the semiconductor layers 210a and 210b can be inhibited.

The insulating layer 208 is formed to have a single-layer structure or a layered structure using any of a silicon oxide film, a silicon oxynitride film, and the like with a PE-CVD apparatus. Note that it is preferable that the insulating layer 206 and the insulating layer 208 be successively formed in vacuum, in which case impurities are less likely to enter the interface between the insulating layer 206 and the insulating layer 208. Regions of the insulating layers 206 and 208 which overlap with the conductive layers 204b and 204c can function as a gate insulating layer. For example, the insulating layer 206 can be formed using a silicon nitride film to a thickness of 300 nm, and the insulating layer 208 can be formed using a silicon oxynitride film to a thickness of 50 nm.

Note that silicon nitride oxide refers to an insulating material that contains more nitrogen than oxygen, whereas silicon oxynitride refers to an insulating material that contains more oxygen than nitrogen.

When the gate insulating layer has the above structure, the following effects can be obtained, for example. A silicon nitride film has a higher dielectric constant than a silicon oxide film and needs a larger thickness for equivalent capacitance. Thus, the physical thickness of the gate insulating film can be increased. Thus, the electrostatic breakdown of a transistor can be prevented by inhibiting a reduction in the withstand voltage of the transistor and improving the withstand voltage of the transistor.

Next, a semiconductor film is formed over the insulating layer 208 and processed into desired regions, so that the semiconductor layers 210a and 210b are formed. The semiconductor layers 210a and 210b can be formed in such a manner that a mask is formed in a desired region by second patterning and regions not covered with the mask are etched. For the etching, dry etching, wet etching, or a combination of both can be employed (see FIG. 8A).

For the semiconductor layers 210a and 210b, for example, an oxide semiconductor can be used. An oxide semiconductor that can be used for the semiconductor layers 210a and 210b preferably includes a layer represented by an In-M-Zn-based oxide containing at least indium (In), zinc (Zn), and M (M is a metal such as Al, Ga, Ge, Y, Zr, Sn, La, Ce, or Hf). Alternatively, the semiconductor layers 210a and 210b preferably contain both In and Zn. In order to reduce variations in electrical characteristics of the transistors including the oxide semiconductor, the oxide semiconductor preferably contains a stabilizer in addition to In and Zn.

Examples of the stabilizer include gallium (Ga), tin (Sn), hafnium (Hf), aluminum (Al), and zirconium (Zr). Other examples of the stabilizer include lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), and lutetium (Lu).

As the oxide semiconductor, for example, any of the following can be used: indium oxide, tin oxide, zinc oxide, an In—Zn-based oxide, a Sn—Zn-based oxide, an Al—Zn-based oxide, a Zn—Mg-based oxide, a Sn—Mg-based oxide, an In—Mg-based oxide, an In—Ga-based oxide, an In—Ga—Zn-based oxide, an In—Al—Zn-based oxide, an In—Sn—Zn-based oxide, a Sn—Ga—Zn-based oxide, an Al—Ga—Zn-based oxide, a Sn—Al—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, an In—Lu—Zn-based oxide, an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, and an In—Hf—Al—Zn-based oxide.

Note that, for example, an In—Ga—Zn-based oxide means an oxide containing In, Ga, and Zn as its main components and there is no particular limitation on the ratio of In, Ga, and Zn. The In—Ga—Zn-based oxide may contain a metal element other than the In, Ga, and Zn. Further, in this specification and the like, a film formed using an In—Ga—Zn-based oxide is also referred to as an IGZO film.

Alternatively, a material represented by $InMO_3(ZnO)_m$ (m>0, where m is not an integer) may be used. Note that M represents one or more metal elements selected from Ga, Fe, Mn, and Co. Still alternatively, a material represented by $In_2SnO_5(ZnO)_n$ (n>0, where n is an integer) may be used.

The oxide semiconductor film is preferably formed by a sputtering method. As a sputtering method, an RF sputtering method, a DC sputtering method, an AC sputtering method, or the like can be employed. In particular, a DC sputtering method is preferably employed because dust generated in the deposition can be reduced and the film thickness can be uniform.

Here, a structure of an oxide semiconductor film will be described below.

An oxide semiconductor film is classified roughly into a single-crystal oxide semiconductor film and a non-single-crystal oxide semiconductor film. The non-single-crystal oxide semiconductor film includes any of a c-axis aligned crystalline oxide semiconductor (CAAC-OS) film, a polycrystalline oxide semiconductor film, a microcrystalline oxide semiconductor film, an amorphous oxide semiconductor film, and the like.

First, a CAAC-OS film will be described.

The CAAC-OS film is one of oxide semiconductor films having a plurality of c-axis aligned crystal parts.

In a transmission electron microscope (TEM) image of the CAAC-OS film, a boundary between crystal parts, that is, a grain boundary is not clearly observed. Thus, in the CAAC-OS film, a reduction in electron mobility due to the grain boundary is less likely to occur.

According to the TEM image of the CAAC-OS film observed in the direction substantially parallel to a sample surface (cross-sectional TEM image), metal atoms are arranged in a layered manner in the crystal parts. Each metal atom layer has a morphology reflected by a surface over which the CAAC-OS film is formed (hereinafter, a surface over which the CAAC-OS film is formed is referred to as a formation surface) or the top surface of the CAAC-OS film, and is arranged in parallel to the formation surface or the top surface of the CAAC-OS film.

On the other hand, according to the TEM image of the CAAC-OS film observed in the direction substantially perpendicular to the sample surface (plan TEM image), metal atoms are arranged in a triangular or hexagonal configuration in the crystal parts. However, there is no regularity of arrangement of metal atoms between different crystal parts.

From the results of the cross-sectional TEM image and the plan TEM image, alignment is found in the crystal parts in the CAAC-OS film.

In this specification, a term "parallel" indicates that the angle formed between two straight lines is greater than or equal to −10° and less than or equal to 10°, and accordingly includes the case where the angle is greater than or equal to −5° and less than or equal to 5°. In addition, a term "perpendicular" indicates that the angle formed between two straight lines is greater than or equal to 80° and less than or equal to 100°, and accordingly includes the case where the angle is greater than or equal to 85° and less than or equal to 95°.

Most of the crystal parts included in the CAAC-OS film each fit inside a cube whose one side is less than 100 nm Thus, there is a case where a crystal part included in the CAAC-OS film fits inside a cube whose one side is less than 10 nm, less than 5 nm, or less than 3 nm Note that when a plurality of crystal parts included in the CAAC-OS film are connected to each other, one large crystal region is formed in some cases. For example, a crystal region with an area of 2500 nm$^2$ or more, 5 μm$^2$ or more, or 1000 μm$^2$ or more is observed in some cases in the plan TEM image.

A CAAC-OS film is subjected to structural analysis with an X-ray diffraction (XRD) apparatus. For example, when the CAAC-OS film including an InGaZnO$_4$ crystal is analyzed by an out-of-plane method, a peak appears frequently when the diffraction angle (2θ) is around 31°. This peak is derived from the (009) plane of the InGaZnO$_4$ crystal, which indicates that crystals in the CAAC-OS film have c-axis alignment, and that the c-axes are aligned in the direction substantially perpendicular to the formation surface or the top surface of the CAAC-OS film.

On the other hand, when the CAAC-OS film is analyzed by an in-plane method in which an X-ray enters a sample in the direction substantially perpendicular to the c-axis, a peak appears frequently when 2θ is around 56°. This peak is derived from the (110) plane of the InGaZnO$_4$ crystal. Here, analysis (φ scan) is performed under conditions where the sample is rotated around a normal vector of a sample surface as an axis (φ axis) with 2θ fixed at around 56°. In the case where the sample is a single-crystal oxide semiconductor film of InGaZnO$_4$, six peaks appear. The six peaks are derived from crystal planes equivalent to the (110) plane. On the other hand, in the case of a CAAC-OS film, a peak is not clearly observed even when φ scan is performed with 2θ fixed at around 56°.

According to the above results, in the CAAC-OS film having c-axis alignment, while the directions of a-axes and b-axes are different between crystal parts, the c-axes are aligned in the direction parallel to a normal vector of the formation surface or a normal vector of the top surface of the CAAC-OS film. Thus, each metal atom layer arranged in a layered manner observed in the cross-sectional TEM image corresponds to a plane parallel to the a-b plane of the crystal.

Note that the crystal part is formed concurrently with deposition of the CAAC-OS film or is formed through crystallization treatment such as heat treatment. As described above, the c-axis of the crystal is aligned in the direction parallel to a normal vector of the formation surface or a normal vector of the top surface of the CAAC-OS film. Thus, for example, in the case where a shape of the CAAC-OS film is changed by etching or the like, the c-axis of the crystal might not be necessarily parallel to a normal vector of the formation surface or a normal vector of the top surface of the CAAC-OS film.

Further, the degree of crystallinity in the CAAC-OS film is not necessarily uniform. For example, in the case where crystal growth leading to the CAAC-OS film occurs from the vicinity of the top surface of the film, the proportion of the c-axis aligned crystal parts in the vicinity of the top surface is higher than that in the vicinity of the formation surface in some cases. Further, when an impurity is added to the CAAC-OS film, a region to which the impurity is added is altered, and the proportion of the c-axis aligned crystal parts in the CAAC-OS film varies depending on regions, in some cases.

Note that when the CAAC-OS film with an InGaZnO$_4$ crystal is analyzed by an out-of-plane method, a peak of 2θ may also be observed at around 36°, in addition to the peak of 2θ at around 31°. The peak of 2θ at around 36° indicates that a crystal having no c-axis alignment is included in part of the CAAC-OS film. It is preferable that in the CAAC-OS film, a peak of 2θ appear at around 31° and a peak of 2θ do not appear at around 36°.

The CAAC-OS film is an oxide semiconductor film having a low impurity concentration. The impurity is an element other than the main components of the oxide semiconductor film, such as hydrogen, carbon, silicon, and a transition metal element. In particular, an element that has higher bonding strength to oxygen than a metal element included in the oxide semiconductor film, such as silicon, disturbs the atomic arrangement of the oxide semiconductor film by depriving the oxide semiconductor film of oxygen and causes a decrease in crystallinity. Further, heavy metals such as iron and nickel, argon, carbon dioxide, and the like each have a large atomic radius (molecular radius), and thus disturb the atomic arrangement of the oxide semiconductor film and causes a decrease in crystallinity when any of them is contained in the oxide semiconductor film. Note that the impurity contained in the oxide semiconductor film might serve as a carrier trap or a carrier generation source.

Further, the CAAC-OS film is an oxide semiconductor film having a low density of defect states. For example, oxygen vacancies in the oxide semiconductor film serve as carrier traps or serve as carrier generation sources in some cases when hydrogen is captured therein.

The state in which the impurity concentration is low and the density of defect states is low (the number of oxygen vacancies is small) is referred to as a highly purified intrinsic state or a substantially highly purified intrinsic state. A highly purified intrinsic or substantially highly purified intrinsic oxide semiconductor film has few carrier generation sources, and thus can have a low carrier density. Thus, a transistor including the oxide semiconductor film rarely has negative threshold voltage (is rarely normally on). The highly purified intrinsic or substantially highly purified intrinsic oxide semiconductor film has few carrier traps. Accordingly, the transistor including the oxide semiconductor film has small variations in electrical characteristics and high reliability. Electric charge trapped by the carrier traps in the oxide semiconductor film takes a long time to be released, and might behave like fixed electric charge. Thus, a transistor including an oxide semiconductor film having a high impurity concentration and a high density of defect states has unstable electrical characteristics in some cases.

In a transistor using the CAAC-OS film, change in electrical characteristics due to irradiation with visible light or ultraviolet light is small.

Next, a microcrystalline oxide semiconductor film will be described.

In an image obtained with TEM, crystal parts cannot be found clearly in the microcrystalline oxide semiconductor film in some cases. In most cases, the size of a crystal part in the microcrystalline oxide semiconductor is greater than or equal to 1 nm and less than or equal to 100 nm, or greater than or equal to 1 nm and less than or equal to 10 nm A microcrystal with a size greater than or equal to 1 nm and less than or equal to 10 nm or a size greater than or equal to 1 nm and less than or equal to 3 nm is specifically referred to as nanocrystal (nc). An oxide semiconductor film including a nanocrystal is referred to as a nanocrystalline oxide semiconductor (nc-OS) film. In an image obtained with TEM, a crystal grain cannot be found clearly in the nc-OS film in some cases.

In the nc-OS film, a microscopic region (for example, a region with a size greater than or equal to 1 nm and less than or equal to 10 nm, in particular, a region with a size greater than or equal to 1 nm and less than or equal to 3 nm) has a periodic atomic order. Further, there is no regularity of crystal orientation between different crystal parts in the nc-OS film; thus, the orientation of the whole film is not observed. Accordingly, in some cases, the nc-OS film cannot be distinguished from an amorphous oxide semiconductor depending on an analysis method. For example, when the nc-OS film is subjected to structural analysis by an out-of-plane method with an XRD apparatus using an X-ray having a diameter larger than a crystal part, a peak which shows a crystal plane does not appear. Further, a halo pattern is shown in a selected-area electron diffraction pattern of the nc-OS film which is obtained by using an electron beam having a probe diameter (e.g., larger than or equal to 50 nm) larger than the diameter of a crystal part. Meanwhile, spots are shown in a nanobeam electron diffraction pattern of the nc-OS film which is obtained by using an electron beam having a probe diameter (e.g., larger than or equal to 1 nm and smaller than or equal to 30 nm) close to, or smaller than or equal to the diameter of a crystal part. Further, in a nanobeam electron diffraction pattern of the nc-OS film, regions with high luminance in a circular (ring) pattern are shown in some cases. Also in a nanobeam electron diffraction pattern of the nc-OS film, a plurality of spots are shown in a ring-like region in some cases.

The nc-OS film is an oxide semiconductor film having more regularity than the amorphous oxide semiconductor film; thus, the nc-OS film has a lower density of defect levels than the amorphous oxide semiconductor film. However, there is no regularity of crystal orientation between different crystal parts in the nc-OS film; hence, the nc-OS film has a higher density of defect states than the CAAC-OS film.

Note that an oxide semiconductor film may be a stack including two or more films of an amorphous oxide semiconductor film, a microcrystalline oxide semiconductor film, and a CAAC-OS film, for example.

For the deposition of the CAAC-OS film, the following conditions are preferably used.

By reducing the amount of impurities entering the CAAC-OS film during the deposition, the crystal state can be prevented from being broken by the impurities. For example, impurities (e.g., hydrogen, water, carbon dioxide, and nitrogen) which exist in a deposition chamber are reduced. Furthermore, impurities in a deposition gas is reduced. Specifically, a deposition gas whose dew point is −80° C. or lower, preferably −100° C. or lower is used.

By increasing the substrate heating temperature during the deposition, migration of a sputtered particle is likely to occur after the sputtered particle reaches a substrate surface. Specifically, the substrate heating temperature during the deposition is higher than or equal to 100° C. and lower than or equal to 740° C., preferably higher than or equal to 200° C. and lower than or equal to 500° C. By increasing the substrate heating temperature during the deposition, when the flat-plate-like sputtered particle reaches the substrate, migration occurs on the substrate surface, so that a flat plane of the flat-plate-like sputtered particle is attached to the substrate.

Furthermore, it is preferable that the proportion of oxygen in the deposition gas be increased and the power be optimized in order to reduce plasma damage in the deposition. The proportion of oxygen in the deposition gas is 30 vol % or higher, preferably 100 vol %.

As an example of the sputtering target, an In—Ga—Zn—O compound target will be described below.

The In—Ga—Zn—O compound target, which is polycrystalline, is made by mixing $InO_X$ powder, $GaO_Y$ powder, and $ZnO_Z$ powder in a predetermined molar ratio, applying pressure, and performing heat treatment at a temperature higher than or equal to 1000° C. and lower than or equal to 1500° C. Note that X, Y, and Z are each a given positive number. The kinds of powder and the molar ratio for mixing powder may be determined as appropriate depending on the desired sputtering target.

Next, first heat treatment is preferably performed. The first heat treatment may be performed at a temperature higher than or equal to 250° C. and lower than or equal to 650° C., preferably higher than or equal to 300° C. and lower than or equal to 500° C., in an inert gas atmosphere, in an atmosphere containing an oxidizing gas at 10 ppm or more, or under reduced pressure. Alternatively, the first heat treatment may be performed in such a manner that heat treatment is performed in an inert gas atmosphere, and then another heat treatment is performed in an atmosphere containing an oxidizing gas at 10 ppm or more, in order to compensate desorbed oxygen. By the first heat treatment, the crystallinity of the oxide semiconductor that is used for the semiconductor layers 210a and 210b can be improved, and in addition, impurities such as hydrogen and water can be removed from the insulating layer 206 and 208 and the semiconductor layers 210a and 210b. The first heat treatment may be performed before etching for formation of the oxide semiconductor layers.

Note that stable electrical characteristics can be effectively imparted to a transistor in which an oxide semiconductor layer serves as a channel by reducing the concentration of impurities in the oxide semiconductor layer to make the oxide semiconductor layer intrinsic or substantially intrinsic. A substantially intrinsic oxide semiconductor layer refers to an oxide semiconductor layer whose carrier density is lower than $1 \times 10^{17}/cm^3$, preferably lower than $1 \times 10^{15}/cm^3$, more preferably lower than $1 \times 10^{13}/cm^3$.

In an oxide semiconductor layer, hydrogen, nitrogen, carbon, silicon, and metal elements except for the main components are impurities. For example, hydrogen and nitrogen form donor levels to increase the carrier density. Silicon forms impurity levels in an oxide semiconductor layer. The impurity levels serve as traps and might cause the electrical characteristics of a transistor to degrade.

In order to make an oxide semiconductor layer intrinsic or substantially intrinsic, the concentration of silicon, which is measured by SIMS, is set to be lower than or equal to lower than $1\times10^{19}$ atoms/cm$^3$, preferably lower than $5\times10^{18}$ atoms/cm$^3$, more preferably lower than $1\times10^{18}$ atoms/cm$^3$. The concentration of hydrogen in the oxide semiconductor layer is set to lower than or equal to $2\times10^{20}$ atoms/cm$^3$, preferably lower than or equal to $5\times10^{19}$ atoms/cm$^3$, more preferably lower than or equal to $1\times10^{19}$ atoms/cm$^3$, still more preferably lower than or equal to $5\times10^{18}$ atoms/cm$^3$. The concentration of nitrogen in the oxide semiconductor layer is set to lower than $5\times10^{19}$ atoms/cm$^3$, preferably lower than or equal to $5\times10^{18}$ atoms/cm$^3$, more preferably lower than or equal to $1\times10^{18}$ atoms/cm$^3$, still more preferably lower than or equal to $5\times10^{17}$ atoms/cm$^3$.

In the case where an oxide semiconductor layer includes crystals, high concentration of silicon or carbon might reduce the crystallinity of the oxide semiconductor layer. In order not to lower the crystallinity of the oxide semiconductor layer, the concentration of silicon in the oxide semiconductor layer is set to lower than $1\times10^{19}$ atoms/cm$^3$, preferably lower than $5\times10^{18}$ atoms/cm$^3$, more preferably lower than $1\times10^{18}$ atoms/cm$^3$. Moreover, the concentration of carbon in the oxide semiconductor layer can be set to lower than $1\times10^{19}$ atoms/cm$^3$, preferably lower than $5\times10^{18}$ atoms/cm$^3$, more preferably lower than $1\times10^{18}$ atoms/cm$^3$.

A transistor in which a highly purified oxide semiconductor layer is used for a channel formation region as described above has an extremely low off-state current, and the off-state current standardized on the channel width of the transistor can be as low as several yoctoamperes per micrometer to several zeptoamperes per micrometer.

When the density of localized levels in an oxide semiconductor layer is reduced, stable electrical characteristics can be imparted to a transistor including the oxide semiconductor layer. To impart stable electrical characteristics to the transistor, the absorption coefficient due to the localized levels in the oxide semiconductor layer, which is obtained in measurement by a constant photocurrent method (CPM), is set to lower than $1\times10^{-3}$/cm, preferably lower than $3\times10^{-4}$/cm.

Next, a mask is formed over the insulating layer 208 by third patterning and regions not covered with the mask are etched to remove part of the insulating layer 208 in the protection circuit 106 and part of the insulating layers 206 and 208 in the connecting portion 109. The opening portions 207a and 207b may be formed prior to the formation of the semiconductor layers 210a and 210b (see FIG. 8B).

The mask can be formed by the third patterning using a multi-tone mask. A multi-tone mask can perform three levels of light exposure to obtain an exposed portion, a half-exposed portion, and an unexposed portion. A multi-tone mask is an exposure mask through which light is transmitted to have a plurality of intensities. One-time light exposure and development process can form a resist mask with regions with plural thicknesses (typically, two kinds of thicknesses). Accordingly, the use of a multi-tone mask can reduce the number of exposure masks. Examples of such a multi-tone mask include a half-tone mask and a gray-tone mask.

When the third patterning is performed using a multi-tone mask, the opening portions 207a and 207b can be formed in different depth directions, in which case the opening portion 207a can expose the insulating layer 206 and the opening portion 207b can expose the conductive layer 204d. The formation method of the opening portions 207a and 207b is not limited thereto; patterning may be performed using different masks.

Thus, the insulating layers 206 and 208 in the pixel portion 102 and the driver circuit portion 104 can function as a stack of gate insulating layers. The insulating layer 206 in the protection circuit 106 can function as a resistor.

Then, a conductive film is formed over the insulating layers 206 and 208, the semiconductor layers 210a and 210b, and the conductive layer 204d and processed into desired regions, so that the conductive layers 212a, 212b, 212c, 212d, 212e, and 212f are formed. The conductive layers 212a, 212b, 212c, 212d, 212e, and 212f can be formed in such a manner that a mask is formed in a desired region by fourth patterning and regions not covered by the mask are etched (see FIG. 9A).

Further, through the above process, the conductive layer 212a in the protection circuit 106 and the conductive layers 212d and 212e in the pixel portion 102, and the conductive layers 212b and 212c in the driver circuit portion 104 can be formed over the same surface.

The conductive layers 212a, 212b, 212c, 212d, 212e, and 212f are formed to have a single-layer structure or a layered structure using, as a conductive material, any of metals such as aluminum, titanium, chromium, nickel, copper, yttrium, zirconium, molybdenum, silver, tantalum, and tungsten or an alloy containing any of these metals as its main component. For example, a two-layer structure in which a titanium film is stacked over an aluminum film, a two-layer structure in which a titanium film is stacked over a tungsten film, a two-layer structure in which a copper film is formed over a copper-magnesium-aluminum alloy film, a three-layer structure in which a titanium film or a titanium nitride film, an aluminum film or a copper film, and a titanium film or a titanium nitride film are stacked in this order, a three-layer structure in which a molybdenum film or a molybdenum nitride film, an aluminum film or a copper film, and a molybdenum film or a molybdenum nitride film are stacked in this order, and the like can be given. Note that a transparent conductive material containing indium oxide, tin oxide, or zinc oxide may be used. The conductive layers 212a, 212b, 212c, 212d, 212e, and 212f can be formed by a sputtering method, for example.

In this embodiment, the conductive layers 212b, 212c, 212d, and 212e are provided over the semiconductor layers 210a and 210b; however, the conductive layers 212b, 212c, 212d, and 212e may be provided between the insulating layer 208 and the semiconductor layers 210a and 210b.

Then, the insulating layers 214 and 216 are formed so as to cover the insulating layer 208, the semiconductor layers 210a and 210b, and the conductive layers 212a, 212b, 212c, 212d, 212e, and 212f (see FIG. 9B).

For the insulating layer 214, an inorganic insulating material containing oxygen can be used in order to improve the characteristics of the interface with the oxide semiconductor used for the semiconductor layer 210a, 210b. For the insulating layer 216, it is preferable to use a material with which impurities from the outside, such as moisture, are less likely to enter the oxide semiconductor used for the semiconductor layers 210a and 210b; for example, an inorganic insulating material containing nitrogen can be used. The insulating layers 214 and 216 can be formed by a PE-CVD method, for example.

For example, a silicon oxide film, a silicon oxynitride film, an aluminum oxide film, or the like with a thickness in the range from 150 nm to 400 nm can be used for the insulating layer 214, and a silicon nitride film, a silicon nitride oxide film, or the like with a thickness in the range from 150 nm to 400 nm can be used for the insulating layer 216. In this embodiment, a silicon oxynitride film with a thickness of 300 nm is used for the insulating layer 214, and a silicon nitride film with a thickness of 150 nm is used for the insulating layer

216. In this case, the silicon nitride film functions as a block layer that prevents entry of moisture into the semiconductor layers 210a and 210b. The silicon nitride film is preferably formed at a high temperature to have an improved blocking property; for example, the silicon nitride film is preferably formed at a temperature in the range from the substrate temperature of 100° C. to the strain point of the substrate, more preferably at a temperature in the range from 300° C. to 400° C. When the silicon nitride film is formed at a high temperature, a phenomenon in which oxygen is released from the oxide semiconductor used for the semiconductor layers 210a and 210b and the carrier density is increased is caused in some cases; therefore, the upper limit of the temperature is a temperature at which the phenomenon is not caused.

Next, the insulating layer 218 is formed over the insulating layer 216 (see FIG. 10A.

Further, the insulating layer 218 can be formed using an organic material having heat resistance, such as an acrylic resin, a polyimide resin, a benzocyclobutene resin, a polyamide resin, or an epoxy resin. Note that the insulating layer 218 may be formed by stacking plural insulating films formed using any of these materials. With the use of the insulating layer 218, unevenness due to the transistor and the like can be reduced. The insulating layer 218 can be formed by a spin coating method, for example.

As an acrylic resin that can be used for the insulating layer 218, it is preferable to use a material that has a low water absorbing property and is less likely to release gas components (e.g., $H_2O$, C, or F) from the film.

Next, a mask is formed over the insulating layer 218 by fifth patterning and regions not covered with the mask are etched, so that opening portions 219a, 219b, and 219c are formed (see FIG. 10B).

The opening portions 219a, 219b, and 219c are formed so as to reach the conductive layers 212b, 212d, and 212e, respectively.

Then, a conductive film is formed so as to fill the opening portions 219a, 219b, and 219c and processed into desired regions, so that the conductive layers 220a, 220b, and 220c are formed. The conductive layers 220a, 220b, and 220c are formed in such a manner that a mask is formed by sixth patterning and regions not covered with the mask are etched (see FIG. 11).

For the conductive layers 220a, 220b, and 220c, a light-transmitting conductive material such as indium oxide containing tungsten oxide, indium zinc oxide containing tungsten oxide, indium oxide containing titanium oxide, indium tin oxide containing titanium oxide, indium tin oxide (hereinafter referred to as ITO), indium zinc oxide, or indium tin oxide to which silicon oxide is added can be used. The conductive layers 220a, 220b, and 220c can be formed by a sputtering method, for example.

Through the above process, the pixel portion and the driver circuit portion that include the transistors and the protection circuit can be formed over one substrate, that is, the substrate 202. In the manufacturing process described in this embodiment, the transistors and the protection circuit can be formed at the same time by the first to sixth patterning, that is, with the six masks.

Next, a structure that is formed over the substrate 252 provided so as to face the substrate 202 will be described below.

First, the substrate 252 is prepared. For materials of the substrate 252, the materials that can be used for the substrate 202 can be referred to. Then, the coloring layer 254 and the insulating layer 256 are formed over the substrate 252 (see FIG. 12A).

The coloring layer 254 is a coloring layer that transmits light in a specific wavelength range. For example, a red (R) color filter for transmitting light in a red wavelength range, a green (G) color filter for transmitting light in a green wavelength range, a blue (B) color filter for transmitting light in a blue wavelength range, or the like can be used. Each color filter is formed in a desired position with a known material by a printing method, an inkjet method, an etching method using a photolithography technique, or the like. For the insulating layer 256, an insulating film of an acrylic resin or the like can be used.

Next, the conductive layer 258 is formed over the insulating layer 256 (see FIG. 12B). For materials of the conductive layer 258, the materials that can be used for the conductive layers 220a, 220b, and 220c can be referred to.

Next, the liquid crystal layer 260 is formed between the substrate 202 and the substrate 252. The liquid crystal layer 260 can be formed by a dispenser method (dropping method), or an injecting method in which liquid crystal is injected using a capillary phenomenon after the substrate 202 and the substrate 252 are attached to each other.

Through the above process, the display device illustrated in FIG. 6 can be fabricated.

This embodiment can be combined as appropriate with any of the other embodiments in this specification.

(Embodiment 4)

In this embodiment, configurations that can be used for the pixel circuit 108 in the display device illustrated in FIG. 1A will be described with reference to FIGS. 13A and 13B.

Figure 13A:
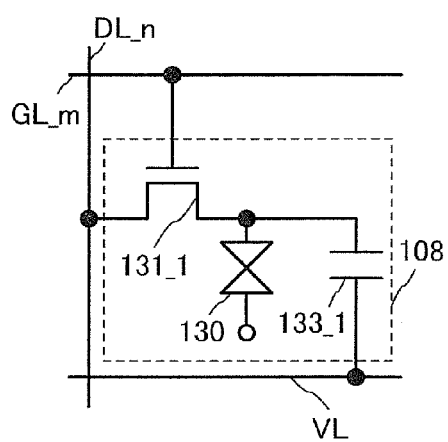
FIGS. 13A and 13B are circuit diagrams each illustrating a pixel circuit that can be used in a display device.

In the display device illustrated in FIG. 1A, the pixel circuit 108 can have the configuration illustrated in FIG. 13A.

The pixel circuit 108 illustrated in FIG. 13A includes a liquid crystal element 130, a transistor 131_1, and a capacitor 133_1.

The potential of one of a pair of electrodes of the liquid crystal element 130 is set according to the specifications of the pixel circuit 108 as appropriate. The alignment state of the liquid crystal element 130 depends on written data. A common potential may be supplied to one of the pair of electrodes of the liquid crystal element 130 included in each of a plurality of pixel circuits 108. Further, the potential supplied to one of a pair of electrodes of the liquid crystal element 130 in the pixel circuit 108 in one row may be different from the potential supplied to one of a pair of electrodes of the liquid crystal element 130 in the pixel circuit 108 in another row.

As a driving method of the display device including the liquid crystal element 130, any of the following modes can be used, for example: a TN mode, an STN mode, a VA mode, an ASM (axially symmetric aligned micro-cell) mode, an OCB (optically compensated birefringence) mode, an FLC (ferroelectric liquid crystal) mode, an AFLC (antiferroelectric liquid crystal) mode, an MVA (multi-domain vertical alignment) mode, a PVA (patterned vertical alignment) mode, an IPS mode, an FFS mode, a TBA (transverse bend alignment) mode, and the like. Other examples of the driving method of the display device include ECB (electrically controlled birefringence) mode, PDLC (polymer dispersed liquid crystal) mode, PNLC (polymer network liquid crystal) mode, and a guest-host mode. Note that one embodiment of the present invention is not limited thereto, and any of various liquid crystal elements and driving methods can be used as a liquid crystal element and a driving method thereof.

The liquid crystal element may be formed using a liquid crystal composition including liquid crystal exhibiting a blue phase and a chiral material. The liquid crystal exhibiting a blue phase has a short response time of 1 msec or less and is optically isotropic; therefore, alignment treatment is not necessary and viewing angle dependence is small.

In the pixel circuit 108 in the m-th row and the n-th column, one of a source and a drain of the transistor 131_1 is electrically connected to the data line DL_n, and the other is electrically connected to the other of a pair of electrodes of a liquid crystal element 130. A gate of the transistor 131_1 is electrically connected to the scan line GL_m. The transistor 131_1 has a function of controlling whether to write a data signal by being turned on or off.

One of a pair of electrodes of the capacitor 133_1 is electrically connected to a wiring to which a potential is supplied (hereinafter referred to as a potential supply line VL), and the other is electrically connected to the other of the pair of electrodes of the liquid crystal element 130. The potential of the potential supply line VL is set according to the specifications of the pixel circuit 108 as appropriate. The capacitor 133_1 functions as a storage capacitor for storing written data.

For example, in the display device including the pixel circuit 108 in FIG. 13A, the pixel circuits 108 are sequentially selected row by row by the gate driver 104a, whereby the transistors 131_1 are turned on and a data signal is written.

When the transistors 131_1 are turned off, the pixel circuits 108 in which the data has been written are brought into a holding state. This operation is performed sequentially row by row; thus, an image can be displayed.

Figure 13B:
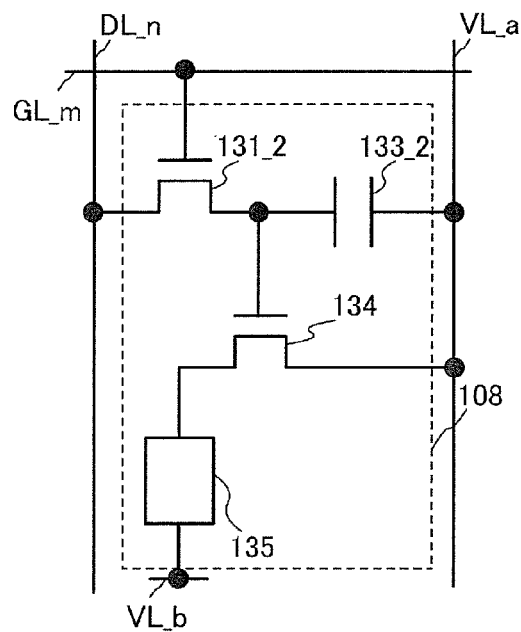

The pixel circuit 108 illustrated in FIG. 13B includes a transistor 131_2, a capacitor 133_2, a transistor 134, and a light-emitting element 135.

One of a source and a drain of the transistor 131_2 is electrically connected to a wiring to which a data signal is supplied (hereinafter referred to as a data line DL_n). A gate of the transistor 131_2 is electrically connected to a wiring to which a gate signal is supplied (hereinafter referred to as a scan line GL_m).

The transistor 131_2 has a function of controlling whether to write a data signal by being turned on or off.

One of a pair of electrodes of the capacitor 133_2 is electrically connected to a wiring to which power is supplied (power supply line VL_a), and the other is electrically connected to the other of the source and the drain of the transistor 131_2.

The capacitor 133_2 functions as a storage capacitor for storing written data.

One of a source and a drain of the transistor 134 is electrically connected to the power supply line VL_a. Further, a gate of the transistor 134 is electrically connected to the other of the source and the drain of the transistor 131_2.

One of an anode and a cathode of the light-emitting element 135 is electrically connected to a power supply line VL_b, and the other is electrically connected to the other of the source and the drain of the transistor 134.

As the light-emitting element 135, an organic electroluminescent element (also referred to as an organic EL element) or the like can be used, for example. Note that the light-emitting element 135 is not limited to an organic EL element; an inorganic EL element including an inorganic material may be used.

A high power supply potential VDD is supplied to one of the power supply line VL_a and the power supply line VL_b, and a low power supply potential VSS is supplied to the other.

In the display device including the pixel circuit 108 in FIG. 13B, the pixel circuits 108 are sequentially selected row by row by the gate driver 104a, whereby the transistors 131_2 are turned on and a data signal is written.

When the transistors 131_2 are turned off, the pixel circuits 108 in which the data has been written are brought into a holding state. Further, the amount of current flowing between the source and the drain of the transistor 134 is controlled in accordance with the potential of the written data signal. The light-emitting element 135 emits light with a luminance corresponding to the amount of flowing current. This operation is performed sequentially row by row; thus, an image can be displayed.

Note that in this specification and the like, a display element, a display device, which is a device including a display element, a light-emitting element, and a light-emitting device, which is a device including a light-emitting element, can employ various modes or can include various elements. Some display elements, display devices, light-emitting elements, or light-emitting devices each include a display medium whose contrast, luminance, reflectance, transmittance, or the like is changed by electromagnetic action, such as an electroluminescence (EL) element (e.g., an EL element including organic and inorganic materials, an organic EL element, or an inorganic EL element), an LED (e.g., a white LED, a red LED, a green LED, or a blue LED), a transistor (a transistor that emits light depending on the amount of current), an electron emitter, a liquid crystal element, electronic ink, an electrophoretic element, a grating light valve (GLV), a plasma display panel (PDP), a digital micromirror device (DMD), a piezoelectric ceramic display, or a carbon nanotube. Examples of a display device including an EL element include an EL display. Examples of a display device including an electron emitter include a field emission display (FED) and an SED-type flat panel display (SED: surface-conduction electron-emitter display). Examples of a display device including a liquid crystal element include liquid crystal displays (e.g., a transmissive liquid crystal display, a transflective liquid crystal display, a reflective liquid crystal display, a direct-view liquid crystal display, and a projection liquid crystal display). Examples of a display device including electronic ink or an electrophoretic element include electronic paper.

Examples of an EL element include an element including an anode, a cathode, and an EL layer interposed between the anode and the cathode. Examples of an EL layer include, but are not limited to, a layer utilizing light emission (fluorescence) from a singlet exciton, a layer utilizing light emission (phosphorescence) from a triplet exciton, a layer utilizing light emission (fluorescence) from a singlet exciton and light emission (phosphorescence) from a triplet exciton, a layer including an organic material, a layer including an inorganic material, a layer including an organic material and an inorganic material, a layer including a high-molecular material, a layer including a low-molecular material, and a layer including a high-molecular material and a low-molecular material. Note that any of various types of EL elements other than the above can alternatively be used.

An example of a liquid crystal element is an element that controls transmission and non-transmission of light by optical modulation action of liquid crystal. The element can include a pair of electrodes and a liquid crystal layer. The optical modulation action of liquid crystal is controlled by an electric field applied to the liquid crystal (including a lateral electric field, a vertical electric field, and a diagonal electric field). Specifically, any of the following can be used for a liquid crystal element, for example: nematic liquid crystal, cholesteric liquid crystal, smectic liquid crystal, discotic liquid crystal, thermotropic liquid crystal, lyotropic liquid crystal, low-molecular liquid crystal, high-molecular liquid crystal, polymer dispersed liquid crystal (PDLC), ferroelectric liquid crystal, anti-ferroelectric liquid crystal, main-chain liquid crystal, side-chain high-molecular liquid crystal, plasma addressed liquid crystal (PALC), banana-shaped liquid crystal, and the like.

For example, display of electronic paper can be performed using molecules (a method utilizing optical anisotropy, dye molecular orientation, or the like), particles (a method utilizing electrophoresis, particle movement, particle rotation, phase change, or the like), movement of one end of a film, coloring properties or phase change of molecules, optical absorption by molecules, or self-light emission by combination of electrons and holes. Specifically, examples of a display method of electronic paper include but are not limited to microcapsule electrophoresis, horizontal electrophoresis, vertical electrophoresis, a spherical twisting ball, a magnetic twisting ball, a columnar twisting ball, a charged toner, electronic liquid powder, magnetic electrophoresis, a magnetic thermosensitive type, electro wetting, light-scattering (transparent-opaque change), a cholesteric liquid crystal and a photoconductive layer, cholesteric liquid crystal, bistable nematic liquid crystal, ferroelectric liquid crystal, a liquid crystal dispersed type with a dichroic dye, a movable film, coloring and decoloring properties of a leuco dye, photochromism, electrochromism, electrodeposition, and flexible organic EL. Note that any of various electronic paper and display methods other than the above can alternatively be used. Here, with the use of microcapsule electrophoresis, aggregation and precipitation of phoresis particles can be prevented. Electronic liquid powder has advantages such as high-speed response, high reflectivity, a wide viewing angle, low power consumption, and memory properties.

This embodiment can be combined as appropriate with any of the other embodiments in this specification.

(Embodiment 5)

In this embodiment, a structure that can be used for the pixel portion 102 of the display device illustrated in FIG. 6 will be described with reference to FIGS. 14A to 14D.

Figure 14A:
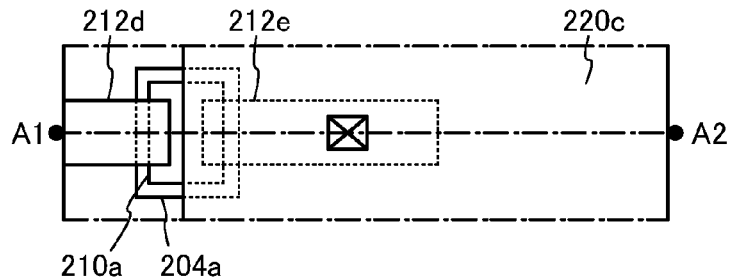
FIGS. 14A and 14C are top plan views of transistors.
Figure 14B:
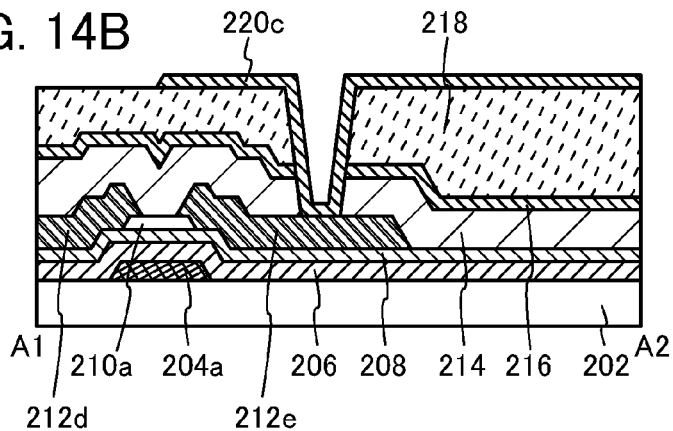
FIGS. 14B and 14D are cross-sectional views of the transistors.
Figure 14C:
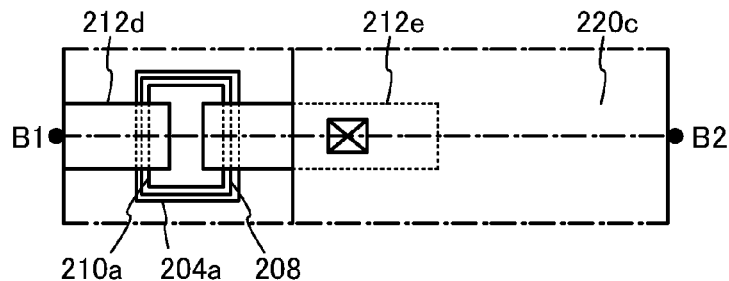
Figure 14D:
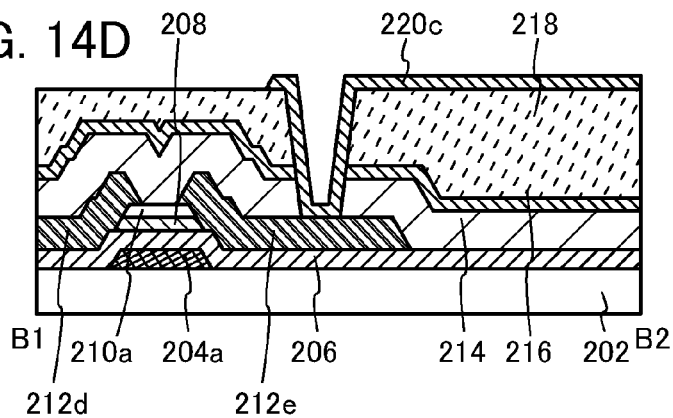

FIG. 14A is a top view of part of the structure of a transistor that can be used in the pixel portion 102, and FIG. 14B is a cross-sectional view along dashed-dotted line A1-A2 in FIG. 14A. FIG. 14C is a top view of part of the structure of a transistor that can be used in the pixel portion 102, and FIG. 14D is a cross-sectional view along dashed-dotted line B1-B2 in FIG. 14C. Note that common reference numerals and common hatching patterns are used for portions that have functions similar to those of the portions described in the above embodiments, and detailed descriptions of the portions will be omitted.

In the top views in FIGS. 14A and 14C, the insulating layers 206, 208, 214, 216, and 218 and the like are omitted for simplicity.

The transistor that can be used in the pixel portion 102 illustrated in FIGS. 14A and 14B includes a conductive layer 204a over the substrate 202, insulating layers 206 and 208 over the substrate 202 and the conductive layer 204a, a semiconductor layer 210a over the insulating layer 208, and conductive layers 212d and 212e electrically connected to the semiconductor layer 210a.

The insulating layers 214, 216, and 218 are formed above the transistor, and the conductive layer 212e and the conductive layer 220c are electrically connected to each other through an opening portion formed in the insulating layers 214, 216, and 218.

The structure in FIGS. 14A and 14B is different from that in FIG. 6 in the position of the conductive layer 220c. Specifically, in the structure in FIGS. 14A and 14B, the conductive layer 220c is placed so as to partly overlap with the semiconductor layer 210a.

With the structure in FIGS. 14A and 14B, overcurrent from an upper portion of the transistor used in the pixel portion 102 can be released with the use of the conductive layer 220c.

The transistor that can be used in the pixel portion 102 illustrated in FIGS. 14C and 14D includes the conductive layer 204a over the substrate 202, the insulating layers 206 and 208 over the substrate 202 and the conductive layer 204a, the semiconductor layer 210a over the insulating layer 208, and the conductive layers 212d and 212e electrically connected to the semiconductor layer 210a.

The insulating layers 214, 216, and 218 are formed above the transistor, and the conductive layer 212e and the conductive layer 220c are electrically connected to each other through an opening portion formed in the insulating layers 214, 216, and 218.

The structure in FIGS. 14C and 14D is different from that in FIG. 6 in the position of the insulating layer 208. Specifically, in the structure in FIGS. 14C and 14D, a side edge of the semiconductor layer 210a is substantially aligned with a side edge of the insulating layer 208. For example, part of the insulating layer 208 is etched using a mask used in formation of the semiconductor layer 210a, whereby the structure in FIGS. 14C and 14D can be obtained.

With the structure in FIGS. 14C and 14D, electric charge charged in the conductive layer 220c can be released to the conductive layer 204a through the conductive layer 212e and the insulating layer 206.

This embodiment can be combined with any of the other embodiments described in this specification, as appropriate.

(Embodiment 6)

In this embodiment, a configuration that can be used for the protection circuit 106 will be described with reference to FIGS. 15A to 15D, FIGS. 16A to 16C, and FIGS. 17A to 17C.

Figure 15A:
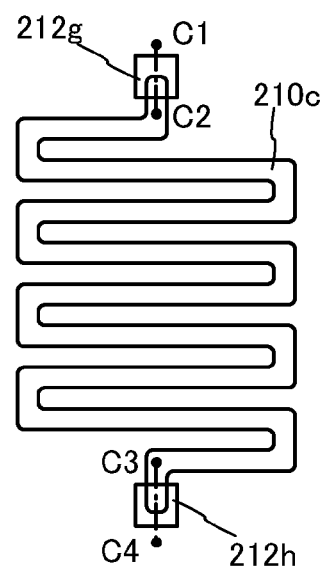
FIGS. 15A and 15B are top plan views of resistors.
Figure 15B:
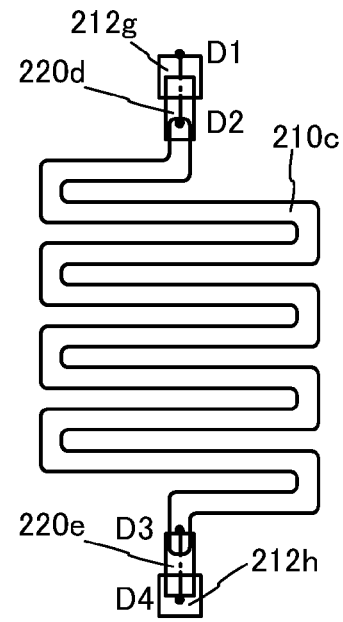
Figure 15C:
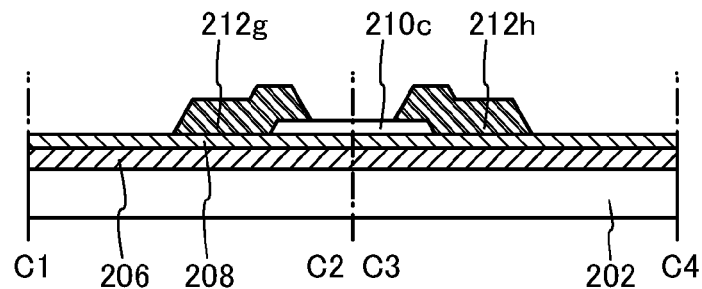
FIGS. 15C and 15D are cross-sectional views of the resistors.
Figure 15D:
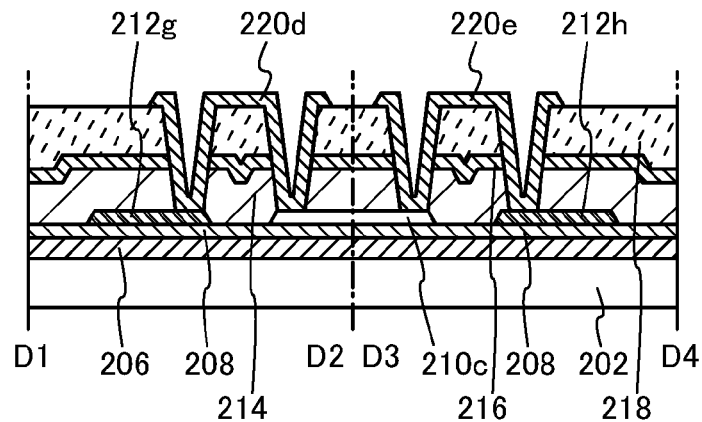

FIGS. 15A and 15B are each a top view of an element that can be used as the protection circuit 106. FIG. 15C is a cross-sectional view along dashed-dotted lines C1-C2 and C3-C4 in FIG. 15A. FIG. 15D is a cross-sectional view along dashed-dotted lines D1-D2 and D3-D4 in FIG. 15B.

FIGS. 15A and 15C illustrate a resistor that can be used as the protection circuit 106. The resistor illustrated in FIGS. 15A and 15C includes the insulating layers 206 and 208 over the substrate 202, a semiconductor layer 210c over the insulating layer 208, and conductive layers 212g and 212h electrically connected to the semiconductor layer 210c.

FIGS. 15B and 15D illustrate a resistor that can be used as the protection circuit 106. The resistor illustrated in FIGS. 15B and 15D includes the insulating layers 206 and 208 over the substrate 202, the semiconductor layer 210c and the conductive layers 212g and 212h over the insulating layer 208, the insulating layers 214, 216, and 218 over the insulating layer 208, the semiconductor layer 210c, and the conductive layers 212g and 212h, a conductive layer 220d that is over the insulating layer 218 and electrically connects the conductive layer 212g and the semiconductor layer 210c, and a conductive layer 220e that is over the insulating layer 218 and electrically connects the conductive layer 212h and the semiconductor layer 210c.

In the resistor, the semiconductor layer 210c can be used as a resistor. When the semiconductor layer 210c has the structure illustrated in FIGS. 15A and 15B, the resistivity can be controlled.

Figure 16A:
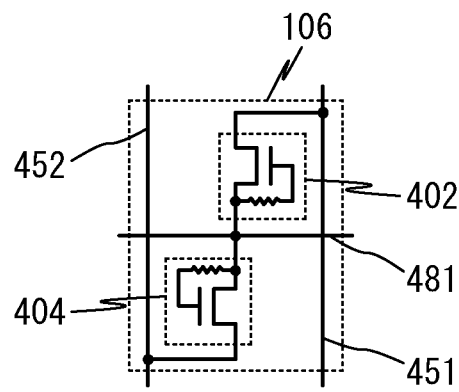
FIGS. 16A to 16C are circuit diagrams of resistors.
Figure 16B:
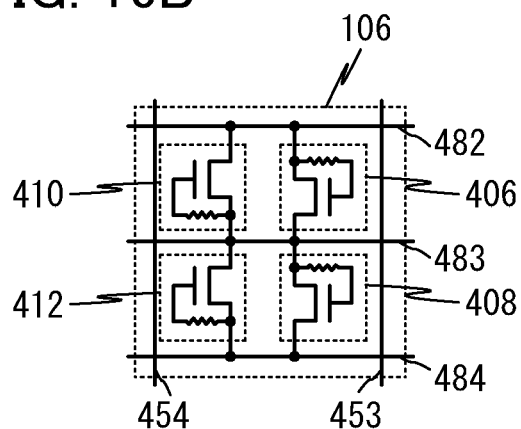
Figure 16C:
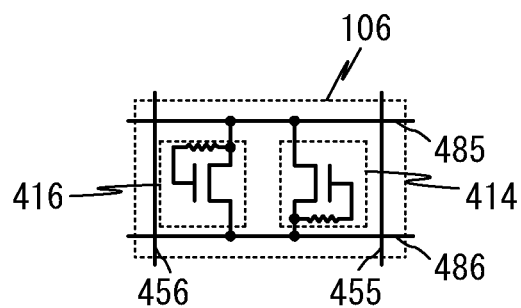

FIGS. 16A to 16C illustrate circuit configuration examples that can be used for the protection circuit 106.

The circuit configuration in FIG. 16A includes wirings 451, 452, and 481 and transistors 402 and 404.

A first terminal functioning as a source electrode of the transistor 402 is electrically connected to a second terminal functioning as a gate electrode of the transistor 402, and a third terminal functioning as a drain electrode of the transistor 402 is electrically connected to the wiring 451. The first terminal of the transistor 402 is electrically connected to the wiring 481. A first terminal functioning as a source electrode of the transistor 404 is electrically connected to a second terminal functioning as a gate electrode of the transistor 404, and a third terminal functioning as a drain electrode of the transistor 404 is electrically connected to the wiring 452. The first terminal of the transistor 404 is electrically connected to the wiring 481.

The circuit configuration in FIG. 16B includes wirings 453, 454, 482, 483, and 484 and transistors 406, 408, 410, and 412.

A first terminal functioning as a source electrode of the transistor 406 is electrically connected to a second terminal functioning as a gate electrode of the transistor 406, and a third terminal functioning as a drain electrode of the transistor 406 is electrically connected to the wiring 483. The first terminal of the transistor 406 is electrically connected to the wiring 482.

A first terminal functioning as a source electrode of the transistor 408 is electrically connected to a second terminal functioning as a gate electrode of the transistor 408, and a third terminal functioning as a drain electrode of the transistor 408 is electrically connected to the wiring 484. The first terminal of the transistor 408 is electrically connected to the wiring 483.

A first terminal functioning as a source electrode of the transistor 410 is electrically connected to a second terminal functioning as a gate electrode of the transistor 410, and a third terminal functioning as a drain electrode of the transistor 410 is electrically connected to the wiring 482. The first terminal of the transistor 410 is electrically connected to the wiring 483.

A first terminal functioning as a source electrode of the transistor 412 is electrically connected to a second terminal functioning as a gate electrode of the transistor 412, and a third terminal functioning as a drain electrode of the transistor 412 is electrically connected to the wiring 483. The first terminal of the transistor 412 is electrically connected to the wiring 484.

The circuit configuration in FIG. 16C includes wirings 455, 456, 485, and 486 and transistors 414 and 416.

A first terminal functioning as a source electrode of the transistor 414 is electrically connected to a second terminal functioning as a gate electrode of the transistor 414, and a third terminal functioning as a drain electrode of the transistor 414 is electrically connected to the wiring 485. The first terminal of the transistor 414 is electrically connected to the wiring 486.

A first terminal functioning as a source electrode of the transistor 416 is electrically connected to a second terminal functioning as a gate electrode of the transistor 416, and a third terminal functioning as a drain electrode of the transistor 416 is electrically connected to the wiring 486. The first terminal of the transistor 416 is electrically connected to the wiring 485.

Any of the diode-connected transistors having the circuit configurations illustrated in FIGS. 16A to 16C may be used in the protection circuit 106 that can be used for one embodiment of the present invention.

Figure 17A:
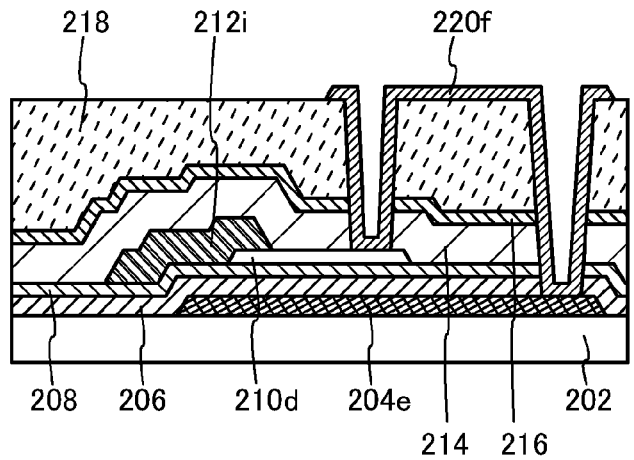
FIGS. 17A to 17C are cross-sectional views of resistors.
Figure 17B:
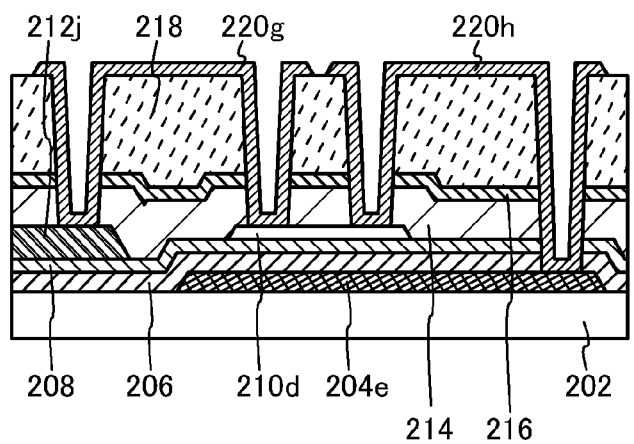
Figure 17C:
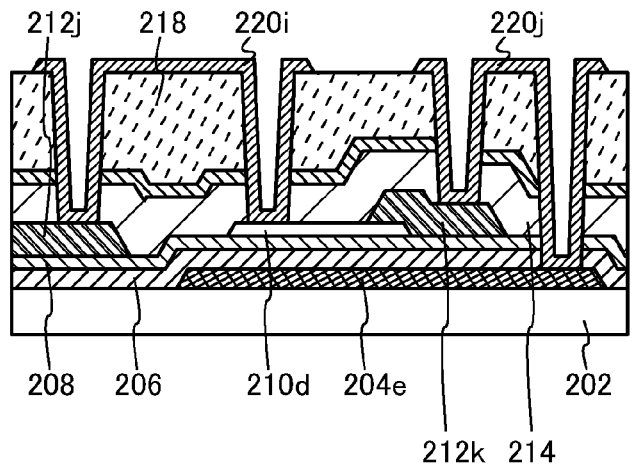

In the circuit configurations illustrated in FIGS. 16A to 16C, the first terminal functioning as a source electrode is connected to the second terminal functioning as a gate electrode as in the structures illustrated in FIGS. 17A to 17C, whereby resistivity can be controlled appropriately.

FIG. 17A illustrates a resistor that can be used as the protection circuit 106. The resistor illustrated in FIG. 17A includes a conductive layer 204e over the substrate 202; the insulating layers 206 and 208 over the substrate 202 and the conductive layer 204e; a semiconductor layer 210d over the insulating layer 208; a conductive layer 212i electrically connected to the semiconductor layer 210d; insulating layers 214, 216, and 218 over the insulating layer 208, the semiconductor layer 210d, and the conductive layer 204e; and a conductive layer 220f that is over the insulating layer 218 and electrically connects the semiconductor layer 210d and the conductive layer 204e.

FIG. 17B illustrates a resistor that can be used as the protection circuit 106. The resistor illustrated in FIG. 17B includes the conductive layer 204e over the substrate 202; the insulating layers 206 and 208 over the substrate 202 and the conductive layer 204e; the semiconductor layer 210d and the conductive layer 212j over the insulating layer 208; the insulating layers 214, 216, and 218 over the insulating layer 208, the semiconductor layer 210d, and the conductive layer 212j; a conductive layer 220g that is over the insulating layer 218 and electrically connects the conductive layer 212j and the semiconductor layer 210d; and a conductive layer 220h that is over the insulating layer 218 and electrically connects the conductive layer 204e and the semiconductor layer 210d.

FIG. 17C illustrates a resistor that can be used as the protection circuit 106. The resistor illustrated in FIG. 17C includes the conductive layer 204e over the substrate 202; the insulating layers 206 and 208 over the substrate 202 and the conductive layer 204e; the semiconductor layer 210d and the conductive layer 212j over the insulating layer 208; the conductive layer 212k electrically connected to the semiconductor layer 210d; the insulating layers 214, 216, and 218 over the insulating layer 208, the semiconductor layer 210d, the conductive layer 212j, and the conductive layer 212k; a conductive layer 220i that is over the insulating layer 218 and electrically connects the conductive layer 212j and the semiconductor layer 210d; and a conductive layer 220j that is over the insulating layer 218 and electrically connects the conductive layer 212k and the conductive layer 204e.

The materials that can be used for the semiconductor layers 210a and 210b described in the above embodiment can be referred to for materials of the semiconductor layers 210c and 210d that can be used for the resistors illustrated in FIGS. 15A to 15D, FIGS. 16A to 16C, and FIGS. 17A to 17C. The semiconductor layers 210c and 210d can be formed in the same process as the semiconductor layers 210a and 210b.

The materials that can be used for the conductive layers 212a, 212b, 212c, 212d, 212e, and 212f described in the above embodiment can be referred to for materials of the conductive layers 212g, 212h, 212i, 212j, and 212k that can be used for the resistors illustrated in FIGS. 15A to 15D, FIGS. 16A to 16C, and FIGS. 17A to 17C. The conductive layers 212g and 212h can be formed in the same process as the conductive layers 212a, 212b, 212c, 212d, 212e, and 212f.

The materials that can be used for the conductive layers 220a, 220b, and 220c described in the above embodiment can be referred to for materials of the conductive layers 220d, 220e, 220f, 220g, 220h, 220i, 220j that can be used for the resistors illustrated in FIGS. 15A to 15D, FIGS. 16A to 16C, and FIGS. 17A to 17C. The conductive layers 220d and 220e can be formed in the same process as the conductive layers 220a, 220b, and 220c.

In such a manner, as such a conductive layer that can be used for the protection circuit, a conductive layer functioning as a gate electrode of a transistor, conductive layers functioning as source and drain electrodes of the transistor, and the like can be used. For example, the structure of the protection circuit 106 illustrated in FIG. 17B can also be described as follows.

The protection circuit 106 in FIG. 17B includes a first conductive layer (the conductive layer 204e) over the same surface as a gate electrode, first insulating layers (the insulating layers 206 and 208) over the first conductive layer (the conductive layer 204e), an oxide semiconductor layer (the semiconductor layer 210d) that is over the first insulating layers (the insulating layers 206 and 208) and overlap with the first conductive layer (the conductive layer 204e), second insulating layers (the insulating layers 214, 216, and 218) over the oxide semiconductor layer (the semiconductor layer 210d), and second conductive layers (the conductive layers 220g and 220h) over the second insulating layers (the insulating layers 214, 216, and 218). The second conductive layers (the conductive layers 220g and 220h) are electrically connected to the oxide semiconductor layer (the semiconductor layer 210d) through opening portions formed in the second insulating layers (the insulating layers 214, 216, and 218).

This embodiment can be combined with any of the other embodiments described in this specification, as appropriate.

(Embodiment 7)

In this embodiment, the structure of a transistor that can be used in the pixel circuit portion 102 and the driver circuit portion 104 of the display device illustrated in FIG. 1A of Embodiment 1 will be described below with reference to FIGS. 18A to 18D.

Figure 18A:
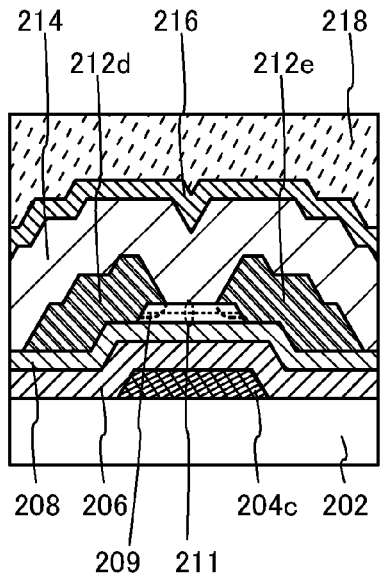
FIG. 18A is a cross-sectional view of a transistor.

The transistor illustrated in FIG. 18A includes the conductive layer 204c over the substrate 202, insulating layers 206 and 208 over the substrate 202 and the conductive layer 204c, an oxide stack 211 over the insulating layer 208, conductive layers 212d and 212e over the insulating layer 208 and the oxide stack 211. The transistor illustrated in FIG. 18A may further be provided with the insulating layers 214, 216, and 218 over the transistor, specifically, over the insulating layer 208, the oxide stack 211, and the conductive layers 212d and 212e.

Note that depending on the kind of a conductive film used for the conductive layers 212d and 212e, oxygen is removed from part of the oxide stack 211 or a mixed layer is formed so that n-type regions 209 are formed in the oxide stack 211 in some cases. In FIG. 18A, the n-type regions 209 can be formed in regions of the oxide stack 211 which are in the vicinity of the interface with the conductive layers 212d and 212e. The n-type regions 209 can function as source and drain regions.

In the transistor illustrated in FIG. 18A, the conductive layer 204c functions as a gate electrode, the conductive layer 212d functions as one of a source electrode and a drain electrode, and the conductive layer 212e functions as the other of the source electrode and the drain electrode.

In the transistor illustrated in FIG. 18A, the distance in a region of the oxide stack 211 which overlaps with the conductive layer 204c and is between the conductive layer 212d and the conductive layer 212e is referred to as a channel length. A channel region refers to a region of the oxide stack 211 which overlaps with the conductive layer 204c and is sandwiched between the conductive layer 212d and the conductive layer 212e. Further, a channel refers to a region through which current mainly flows in the channel formation region.

Here, the oxide stack 211 will be described in detail with reference to FIG. 18B.

Figure 18B:
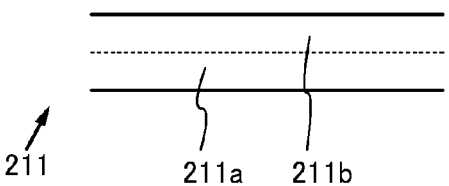
FIGS. 18B to 18D are diagrams illustrating an oxide stack.

FIG. 18B is an enlarged view of a region of the oxide stack 211 which is surrounded by broken line in FIG. 18A. The oxide stack 211 includes an oxide semiconductor layer 211a and an oxide layer 211b.

The oxide semiconductor layer 211a preferably includes a layer represented by an In-M-Zn oxide that contains at least indium (In), zinc (Zn), and M (M is a metal such as Al, Ga, Ge, Y, Zr, Sn, La, Ce, or Hf). The oxide semiconductor materials, the formation method, and the like that can be used for the semiconductor layers 210a and 210b described in the above embodiment can be referred to for those of the oxide semiconductor layer 211a.

The oxide layer 211b contains one or more kinds of elements contained in the oxide semiconductor layer 211a. The energy at the bottom of the conduction band of the oxide layer 211b is located closer to the vacuum level than that of the oxide semiconductor layer 211a by 0.05 eV or more, 0.07 eV or more, 0.1 eV or more, or 0.15 eV or more and 2 eV or less, 1 eV or less, 0.5 eV or less, or 0.4 eV or less. In this case, when an electric field is applied to the conductive layer 204c functioning as a gate electrode, a channel is formed in the oxide semiconductor layer 211a in the oxide stack 211 of which energy at the bottom of the conduction band is lowest. In other words, the oxide layer 211b is placed between the oxide semiconductor layer 211a and the insulating layer 214, whereby the channel of the transistor can be formed in the oxide semiconductor layer 211a not in contact with the insulating layer 214. Since the oxide layer 211b contains one or more elements contained in the oxide semiconductor layer 211a, interface scattering is unlikely to occur at the interface between the oxide semiconductor layer 211a and the oxide layer 211b. Thus, transfer of carriers is not inhibited between the oxide semiconductor layer 211a and the oxide layer 211b, resulting in an increase in the field-effect mobility of the transistor. Moreover, an interface state is less likely to be formed between the oxide semiconductor layer 211a and the oxide layer 211b. When an interface state is formed between the oxide semiconductor layer 211a and the oxide layer 211b, a second transistor in which the interface between the oxide semiconductor layer 211a and the oxide layer 211b serves as a channel and which has different threshold voltage from the transistor is formed and the apparent threshold voltage of the transistor varies in some cases. Thus, with the oxide layer 211b, fluctuation in the electrical characteristics of the transistors, such as threshold voltage, can be reduced.

As the oxide layer 211b, an oxide layer that is represented by an In-M-Zn-based oxide (M is a metal such as Al, Ti, Ga, Ge, Y, Zr, Sn, La, Ce, or Hf) and contains a larger amount of M in an atomic ratio than that in the oxide semiconductor layer 211a is used. Specifically, the amount of any of the above elements in the oxide layer 211b in an atomic ratio is one and a half times or more, preferably twice or more, more preferably three times or more as high as that in the oxide semiconductor layer 211a in an atomic ratio. Any of the above elements is more strongly bonded to oxygen than indium, and thus has a function of suppressing generation of oxygen vacancies in the oxide layer. In other words, the oxide layer 211b is an oxide layer in which oxygen vacancies are less likely to be generated than in the oxide semiconductor layer 211a.

That is to say, when each of the oxide semiconductor layer 211a and the oxide layer 211b is an In-M-Zn-based oxide containing at least indium, zinc, and M (M is a metal such as Al, Ti, Ga, Ge, Y, Zr, Sn, La, Ce, or Hf), the oxide semiconductor layer 211b has an atomic ratio of In to M and Zn which is $x_1:y_1:z_1$, and the oxide layer 211a has an atomic ratio of In to M and Zn which is $x_2:y_2:z_2$, $y_1/x_1$ is preferably larger than $y_2/x_2$. $y_1/x_1$ is one and a half times or more as large as $y_2/x_2$, preferably two times or more, more preferably three times or more as large as $y_2/x_2$. At this time, when $y_2$ is larger than $x_2$ in the oxide semiconductor layer 211a, the transistor can have stable electrical characteristics. However, when $y_2$ is three times or more as large as $x_2$, the field-effect mobility of the transistor is reduced; accordingly, $y_2$ is preferably smaller than three times $x_2$.

When the oxide semiconductor layer 211a is an In-M-Zn-based oxide, the atomic ratio of In to M is preferably as follows: the proportion of In is higher than or equal to 25 atomic % and the proportion of M is lower than 75 atomic %; more preferably, the proportion of In is higher than or equal to 34 atomic % and the proportion of M is lower than 66 atomic %. When an In-M-Zn-based oxide is used as the oxide layer 211b, the atomic ratio between In to M is preferably as follows: the proportion of In is lower than 50 atomic % and the proportion of M is higher than or equal to 50 atomic %; more preferably, the proportion of In is lower than 25 atomic % and the proportion of M is higher than or equal to 75 atomic %.

For the oxide semiconductor layer 211a and the oxide layer 211b, an oxide semiconductor containing indium, zinc, and gallium can be used. Specifically, the oxide semiconductor layer 211a can be formed using an In—Ga—Zn-based oxide whose atomic ratio of In to Ga and Zn is 1:1:1, an In—Ga—Zn-based oxide whose atomic ratio of In to Ga and Zn is 3:1:2, or an oxide having a composition in the neighborhood of any of the above atomic ratios. The oxide layer 211b can be formed using an In—Ga—Zn-based oxide whose atomic ratio of In to Ga and Zn is 1:3:2, an In—Ga—Zn-based oxide whose atomic ratio of In to Ga and Zn is 1:6:4, an In—Ga—Zn-based oxide whose atomic ratio of In to Ga and Zn is 1:9:6, or an oxide having a composition in the neighborhood of any of the above atomic ratios.

The thickness of the oxide semiconductor layer 211a is greater than or equal to 3 nm and less than or equal to 200 nm, preferably greater than or equal to 3 nm and less than or equal to 100 nm, more preferably greater than or equal to 3 nm and less than or equal to 50 nm. The thickness of the oxide layer 211b is greater than or equal to 3 nm and less than or equal to 100 nm, preferably greater than or equal to 3 nm and less than or equal to 50 nm.

Next, the band structure of the oxide stack 211 will be described with reference to FIGS. 18C and 18D.

For example, the oxide semiconductor layer 211a was formed using an In—Ga—Zn-based oxide having an energy gap of 3.15 eV, and the oxide layer 211b was formed using an In—Ga—Zn-based oxide having an energy gap of 3.5 eV. The energy gaps were measured using a spectroscopic ellipsometer (UT-300 manufactured by HORIBA JOBIN YVON S.A.S.).

The energy gap between the vacuum level and the top of the valence band (also called ionization potential) of the oxide semiconductor layer 211a and the energy gap therebetween of the oxide layer 211b were 8 eV and 8.2 eV, respectively. Note that the energy gap between the vacuum level and the top of the valence band was measured with an ultraviolet photoelectron spectrometer (UPS) (VersaProbe manufactured by ULVAC-PHI, Inc.).

Thus, the energy gap between the vacuum level and the bottom of the conduction band (also called electron affinity) of the oxide semiconductor layer 211a and the energy gap therebetween of the oxide layer 211b were 4.85 eV and 4.7 eV, respectively.

Figure 18C:
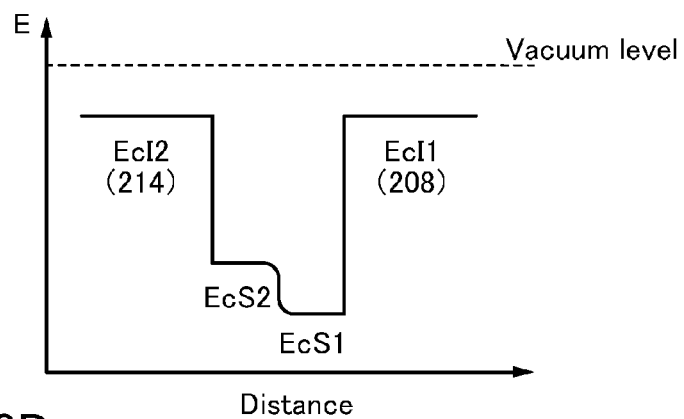

FIG. 18C schematically illustrates a part of the band structure of the oxide stack 211. Here, the case where a silicon oxide film is provided in contact with the oxide stack 211 will be described. In FIG. 18C, EcI1 denotes the energy of the bottom of the conduction band in the silicon oxide film; EcS1 denotes the energy of the bottom of the conduction band in the oxide semiconductor layer 211a; EcS2 denotes the energy of the bottom of the conduction band in the oxide layer 211b; and EcI2 denotes the energy of the bottom of the conduction band in the silicon oxide film. Further, EcI1 and EcI2 correspond to the insulating layer 208 and the insulating layer 214 in FIG. 18A, respectively.

As shown in FIG. 18C, there is no energy barrier between the oxide semiconductor layer 211a and the oxide layer 211b, and the energy level of the bottom of the conduction band is changed smoothly, or continuously. This is because the oxide layer 211b and the oxide semiconductor layer 211a contain a common element and oxygen is transferred between the oxide semiconductor layer 211a and the oxide layer 211b, so that a mixed layer is formed.

As shown in FIG. 18C, the oxide semiconductor layer 211a in the oxide stack 211 serves as a well and a channel region of the transistor including the oxide stack 211 is formed in the oxide semiconductor layer 211a. Note that since the energy of the bottom of the conduction band of the oxide stack 211 is continuously changed, it can be said that the oxide semiconductor layer 211a and the oxide layer 211b are continuous.

Although trap levels due to impurities or defects might be formed in the vicinity of the interface between the oxide layer 211b and the insulating layer 214 as shown in FIG. 18C, the oxide semiconductor layer 211a can be distanced from the trap levels owing to existence of the oxide layer 211b. However, when the energy gap between EcS1 and EcS2 is small, electrons in the oxide semiconductor layer 211a might reach the trap level over the energy gap. When the electrons are captured by the trap level, they become negative fixed charge, so that the threshold voltage of the transistor is shifted in the positive direction. Therefore, it is preferable that the energy difference between EcS1 and EcS2 be 0.1 eV or more, more preferably 0.15 eV or more because a change in the threshold voltage of the transistor is prevented and stable electrical characteristics are obtained.

Figure 18D:
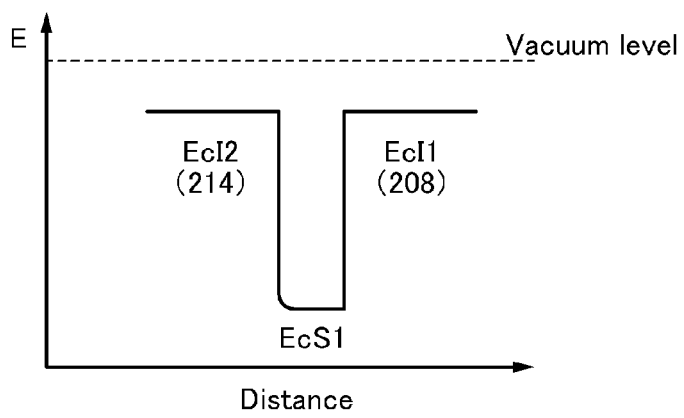

FIG. 18D schematically illustrates a part of the band structure of the oxide stack 211, which is a modification example of the band structure shown in FIG. 18C. Here, the case where a silicon oxide film is provided in contact with the oxide stack 211 will be described. In FIG. 18D, EcI1 denotes the energy of the bottom of the conduction band in the silicon oxide film; EcS1 denotes the energy of the bottom of the conduction band in the oxide semiconductor layer 211a; and EcI2 denotes the energy of the bottom of the conduction band in the silicon oxide film. Further, EcI1 corresponds to the insulating layer 208 in FIG. 18A, and EcI2 corresponds to the insulating layer 214 in FIG. 18A.

In the transistor illustrated in FIG. 18A, an upper portion of the oxide stack 211, that is, the oxide layer 211b is etched in some cases in formation of the conductive layers 212d and 212e. However, a mixed layer of the oxide semiconductor layer 211a and the oxide layer 211b is formed on the top surface of the oxide semiconductor layer 211a in some cases in formation of the oxide layer 211b.

For example, when the oxide semiconductor layer 211a is an In—Ga—Zn-based oxide whose atomic ratio of In to Ga and Zn is 1:1:1 or an In—Ga—Zn-based oxide whose atomic ratio of In to Ga and Zn is 3:1:2, and the oxide semiconductor layer 211b is an In—Ga—Zn-based oxide whose atomic ratio of In to Ga and Zn is 1:3:2 or an In—Ga—Zn-based oxide whose atomic ratio of In to Ga and Zn is 1:6:4, the Ga content in the oxide layer 211b is higher than that in the oxide semiconductor layer 211a. Thus, a GaOx layer or a mixed layer whose Ga content is higher than that in the oxide semiconductor layer 211a can be formed on the top surface of the oxide semiconductor layer 211a.

For that reason, even in the case where the oxide layer 211b is etched, the energy of the bottom of the conduction band of EcS1 on the EcI2 side is increased and the band structure shown in FIG. 18D is shown in some cases.

This embodiment can be combined with any of the other embodiments described in this specification, as appropriate.

(Embodiment 8)

In this embodiment, the structure of a connection terminal portion that can be used in the display device illustrated in FIG. 1A described in Embodiment 1 will be described with reference to FIG. 19. Note that common reference numerals and common hatching patterns are used for portions that have functions similar to those of the portions described in the above embodiments, and detailed descriptions of the portions will be omitted.

Figure 19:
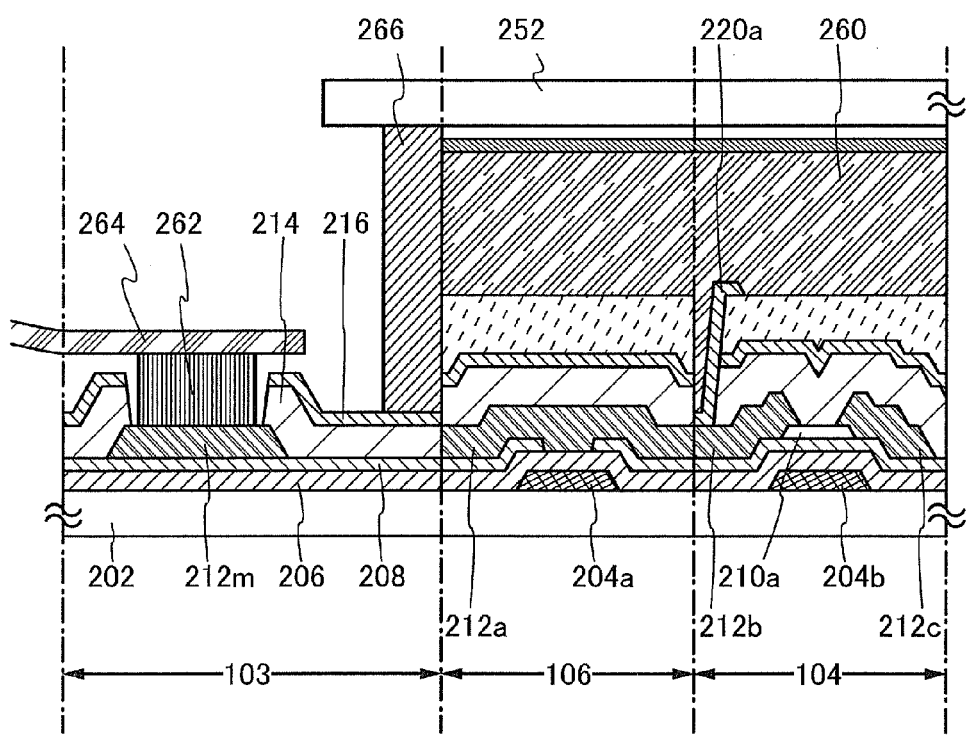
FIG. 19 is a cross-sectional view of a connection terminal portion of a display device.

A connection terminal portion 103 that can be used in the display device illustrated in FIG. 19 includes the insulating layers 206 and 208 over the substrate 202, a conductive layer 212m over the insulating layer 208, and the insulating layers 214 and 216 over the insulating layer 208. An opening portion reaching the conductive layer 212m is formed in the insulating layers 214 and 216, and the conductive layer 212m is electrically connected to a terminal of an FPC 264 through an anisotropic conductive agent 262.

In the connection terminal portion 103, a sealant 266 is formed over the insulating layer 216. With the sealant 266, a liquid crystal layer 260 is sealed between the substrate 202 and the substrate 252.

The materials of the insulating layers described in the above embodiment can be referred to for materials of the insulating layers 206 and 208.

The conductive layer 212m can be formed using the same conductive film as the conductive layers 212a, 212b, and 212c formed in the protection circuit 106 and the driver circuit portion 104.

The anisotropic conductive agent 262 is formed by curing a paste-form or sheet-form material that is obtained by mixing conductive particles into a thermosetting resin or a thermosetting and photo-curing resin. The anisotropic conductive agent 262 exhibits anisotropic conductivity by light irradiation or thermocompression bonding. As conductive particles used for the anisotropic conductive agent 262, for example, particles of a spherical organic resin coated with a thin-film metal such as Au, Ni, or Co can be used.

As described in this embodiment, the protection circuit 106 of one embodiment of the present invention provided between the connection terminal portion 103 and the driver circuit portion 104 can protect the driver circuit portion 104 from overcurrent due to static electricity generated in attaching the FPC 264. Accordingly, a highly reliable display device can be provided.

A display device in this specification refers to an image display device or a light source (including a lighting device). Furthermore, the display device also includes the following modules in its category: a module to which a connector such as an FPC or a TCP is attached; a module having a TCP at the tip of which a printed wiring board is provided; and a module in which an integrated circuit (IC) is directly mounted on a display element by a COG method.

Note that the structures and the like described in this embodiment can be combined as appropriate with any of the structures and the like described in the other embodiments.

(Embodiment 9)

In this embodiment, a touch sensor and a display module that can be combined with a display device of one embodiment of the present invention will be described with reference to FIGS. 20A and 20B, FIG. 21, FIG. 22, and FIG. 23.

Figure 20A:
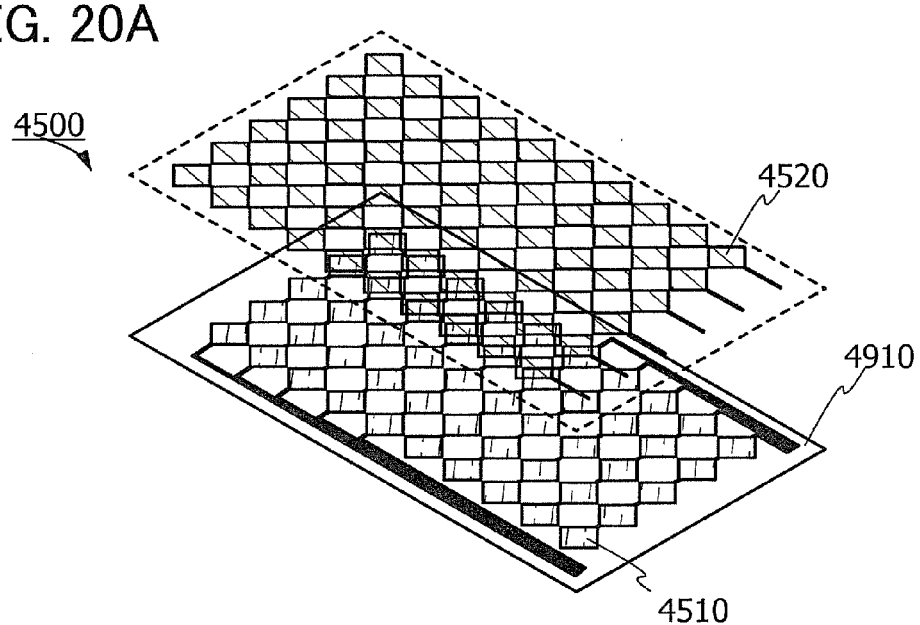
FIGS. 20A and 20B illustrate a touch sensor.
Figure 20B:
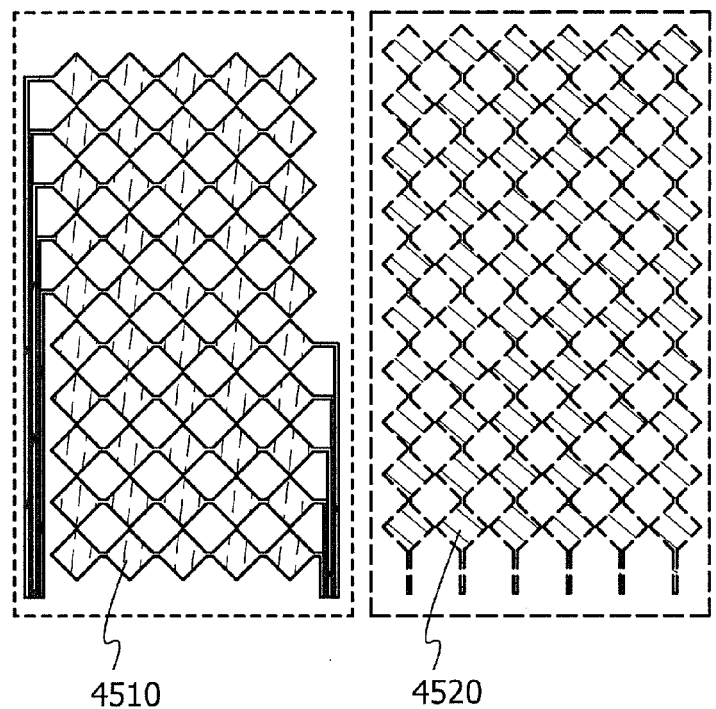
Figure 21:
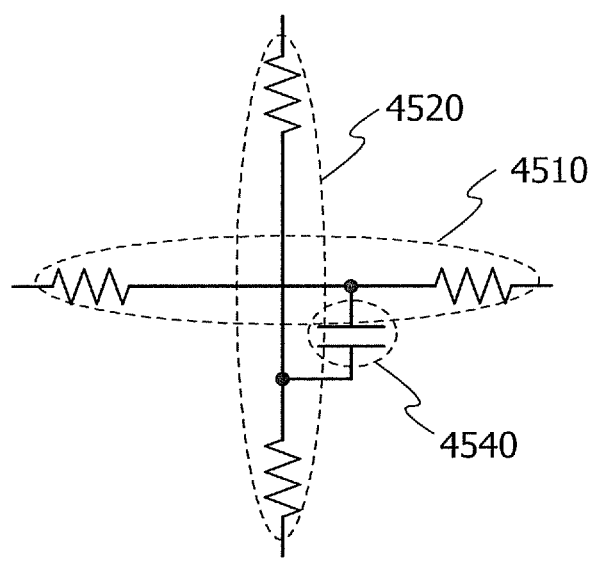
FIG. 21 is a circuit diagram of the touch sensor.

FIG. 20A is an exploded perspective view of a structural example of a touch sensor 4500. FIG. 20B is a top plan view of a structural example of an electrode of the touch sensor 4500. FIG. 21 is a cross-sectional view of a structural example of the touch sensor 4500.

The touch sensor 4500 illustrated in FIGS. 20A and 20B includes, over a substrate 4910, a plurality of conductive layers 4510 arranged in the X-axis direction and a plurality of conductive layers 4520 arranged in the Y-axis direction intersecting with the X-axis direction. In FIGS. 20A and 20B, a plan view of the plurality of conductive layers 4510 of the touch sensor 4500 and a plan view of the plurality of conductive layers 4520 of the touch sensor 4500 are separately illustrated.

FIG. 21 is an equivalent circuit diagram of an intersection portion of the conductive layer 4510 and the conductive layer 4520 of the touch sensor 4500 illustrated in FIGS. 20A and 20B. As illustrated in FIG. 21, a capacitor 4540 is formed at the intersection portion of the conductive layer 4510 and the conductive layer 4520.

The plurality of conductive layers 4510 and the plurality of conductive layers 4520 have structures in each of which a plurality of quadrangular conductive films are connected to each other. The plurality of conductive layers 4510 and the plurality of conductive layers 4520 are provided so that the quadrangular conductive films of the plurality of conductive layers 4510 does not overlap with the quadrangular conductive films of the plurality of conductive layers 4520. At the intersection portion of the conductive layer 4510 and the conductive layer 4520, an insulating film is provided between the conductive layer 4510 and the conductive layer 4520 to prevent the conductive layers 4510 and 4520 from being in contact with each other.

Figure 22:
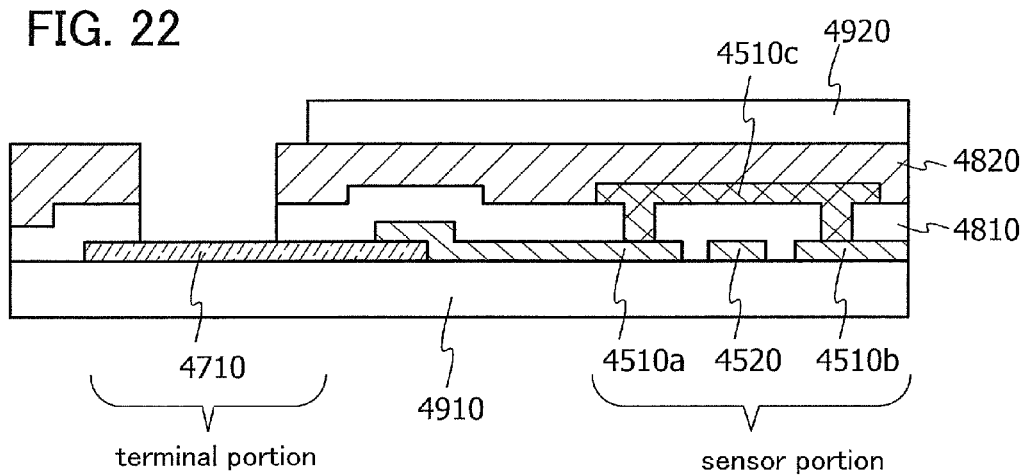
FIG. 22 is a cross-sectional view of the touch sensor.

FIG. 22 is a cross-sectional view illustrating an example of a connection structure of the conductive layers 4510 and the conductive layer 4520 of the touch sensor 4500 in FIGS. 20A and 20B. FIG. 22 illustrates, as an example, a cross-sectional view of a portion where the conductive layers 4510 (conductive layers 4510a, 4510b, and 4510c) intersects with the conductive layer 4520.

As illustrated in FIG. 22, the conductive layers 4510 include the conductive layer 4510a and the conductive layer 4510b in the first layer and the conductive layer 4510c in the second layer over an insulating layer 4810. The conductive layer 4510a and the conductive layer 4510b are connected by the conductive layer 4510c. The conductive layer 4520 is formed using the conductive film in the first layer. An insulating layer 4820 is formed so as to cover the conductive layers 4510 and 4520 and an electrode 4710. As the insulating layers 4810 and 4820, silicon oxynitride films may be formed, for example. A base film formed using an insulating film may be provided between the substrate 4910, and the conductive layers 4510 and the electrode 4710. As the base film, for example, a silicon oxynitride film can be formed.

The conductive layers 4510 and the conductive layer 4520 are formed using a conductive material that transmits visible light, such as indium tin oxide containing silicon oxide, indium tin oxide, zinc oxide, indium zinc oxide, or zinc oxide to which gallium is added.

The conductive layer 4510a is connected to the electrode 4710. A terminal for connection to an FPC is formed using the electrode 4710. Similarly to the conductive layers 4510, the conductive layer 4520 is connected to the electrode 4710. The electrode 4710 can be formed of a tungsten film, for example.

The insulating layer 4820 is formed so as to cover the conductive layers 4510 and 4520 and the electrode 4710. An opening portion is formed in the insulating layers 4810 and 4820 over the electrode 4710 to electrically connect the electrode 4710 and the FPC. A substrate 4920 is attached to the insulating layer 4820 using an adhesive, an adhesive film, or the like. The substrate 4910 side is bonded to a color filter substrate of a display panel with an adhesive or an adhesive film, so that a touch panel is completed.

Next, a display module that can be formed using a display device of one embodiment of the present invention will be described with reference to FIG. 23.

Figure 23:
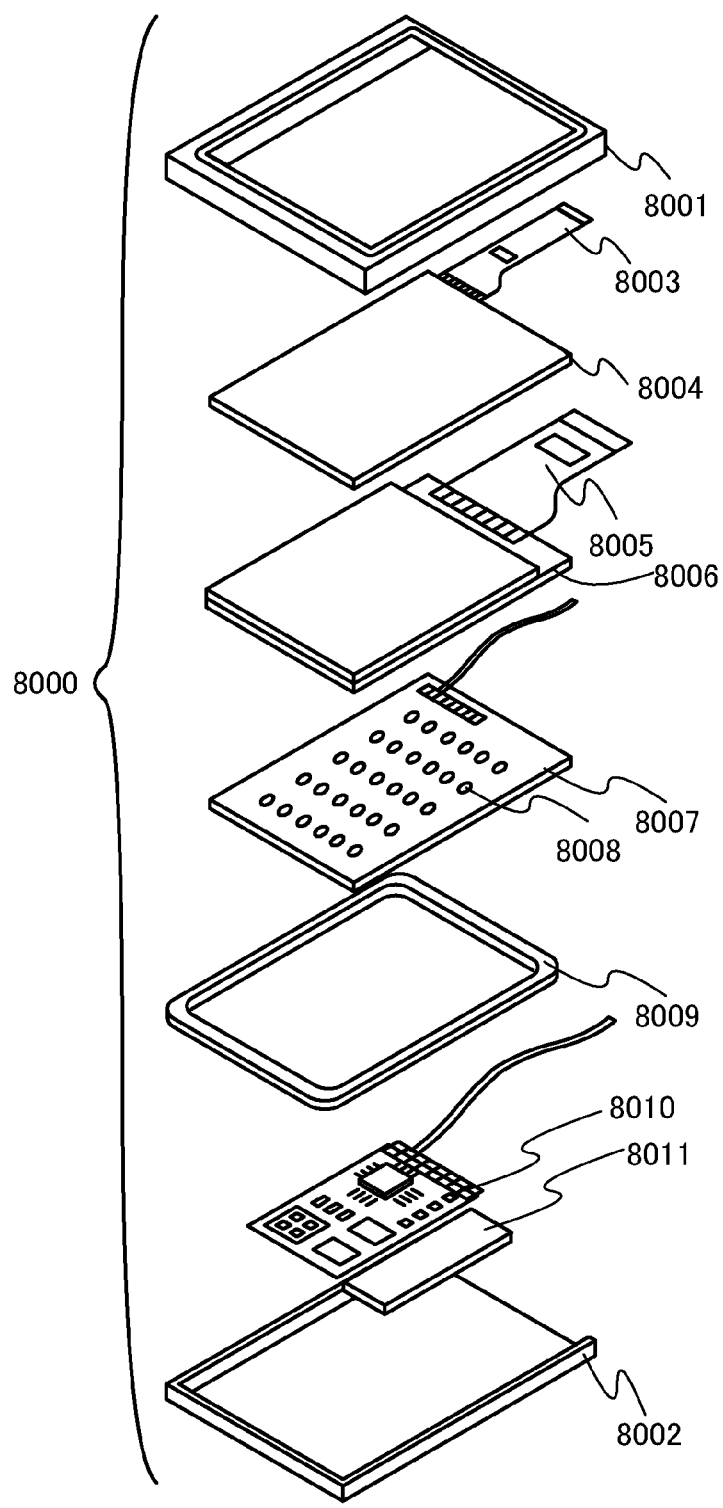
FIG. 23 illustrates a display module including a display device of one embodiment of the present invention.

In a display module 8000 in FIG. 23, a touch panel 8004 connected to an FPC 8003, a display panel 8006 connected to an FPC 8005, a backlight unit 8007, a frame 8009, a printed board 8010, and a battery 8011 are provided between an upper cover 8001 and a lower cover 8002.

The shapes and sizes of the upper cover 8001 and the lower cover 8002 can be changed as appropriate in accordance with the sizes of the touch panel 8004 and the display panel 8006.

The touch panel 8004 can be a resistive touch panel or a capacitive touch panel and may be formed so as to overlap with the display panel 8006. A counter substrate (sealing substrate) of the display panel 8006 can have a touch panel function. A photosensor may be provided in each pixel of the display panel 8006 so that the touch panel 8004 can function as an optical touch panel.

The backlight unit 8007 includes a light source 8008. The light source 8008 may be provided at an end portion of the backlight unit 8007 and a light diffusing plate may be used.

The frame 8009 protects the display panel 8006 and functions as an electromagnetic shield for blocking electromagnetic waves generated by the operation of the printed board 8010. The frame 8009 may function as a radiator plate.

The printed board 8010 is provided with a power supply circuit and a signal processing circuit for outputting a video signal and a clock signal. As a power source for supplying power to the power supply circuit, an external commercial power source or a power source using the battery 8011 provided separately may be used. The battery 8011 can be omitted in the case of using a commercial power source.

The display module 8000 can be additionally provided with a member such as a polarizing plate, a retardation plate, or a prism sheet.

Note that the structures and the like described in this embodiment can be combined as appropriate with any of the structures and the like described in the other embodiments.

(Embodiment 10)

In this embodiment, examples of electronic devices will be described.

FIGS. 24A to 24H and FIGS. 25A to 25D illustrate electronic devices. These electronic devices can include a housing 5000, a display portion 5001, a speaker 5003, an LED lamp 5004, operation keys 5005 (including a power switch or an operation switch), a connection terminal 5006, a sensor 5007 (a sensor having a function of measuring force, displacement, position, speed, acceleration, angular velocity, rotational frequency, distance, light, liquid, magnetism, temperature, chemical substance, sound, time, hardness, an electric field, a current, a voltage, electric power, radiation, a flow rate, humidity, gradient, oscillation, odor, or infrared ray), a microphone 5008, and the like.

Figure 24A:
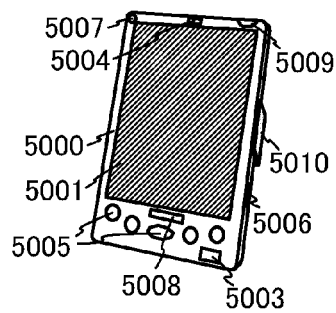
FIGS. 24A to 24H each illustrate an electronic device including a display device of one embodiment of the present invention.
Figure 24B:
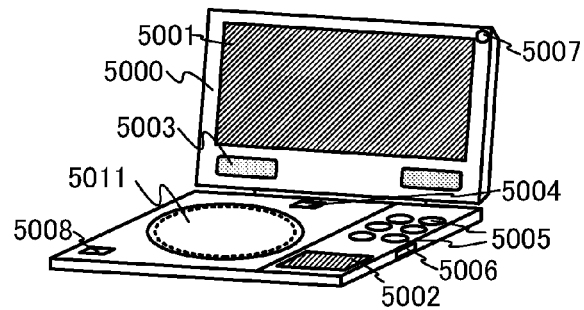
Figure 24C:
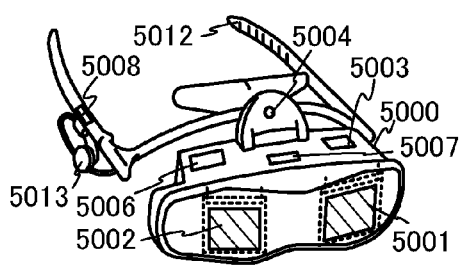
Figure 24D:
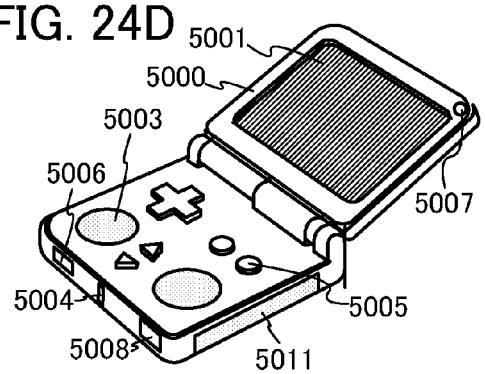
Figure 24E:
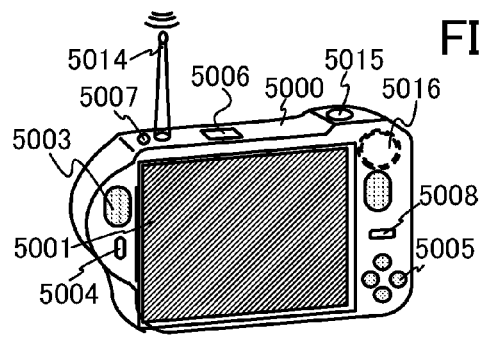
Figure 24F:
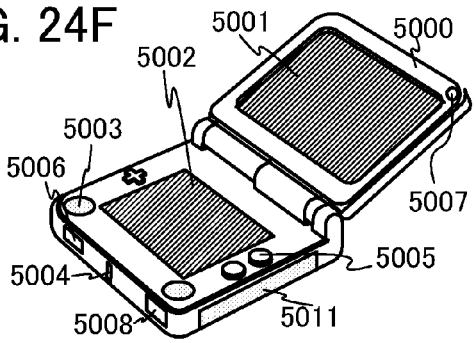
Figure 24G:
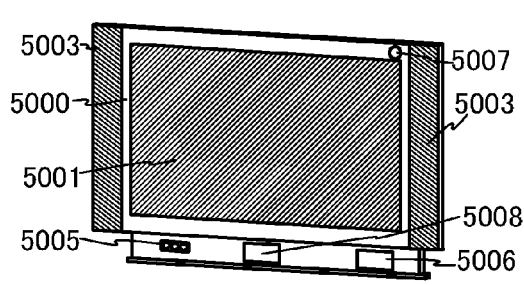
Figure 24H:
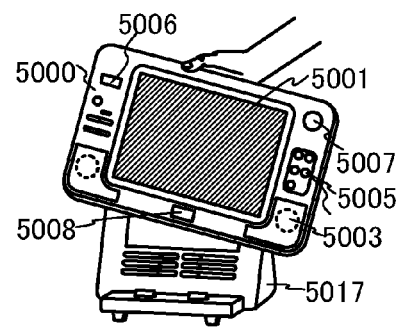
Figure 25A:
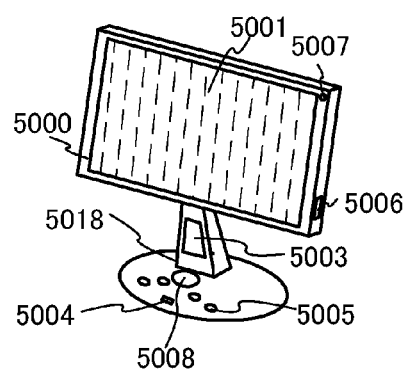
FIGS. 25A to 25H each illustrate an electronic device including a display device of one embodiment of the present invention.
Figure 25B:
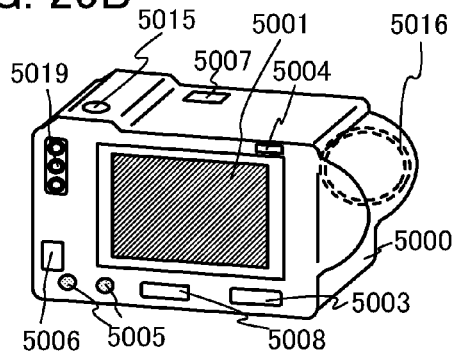
Figure 25C:
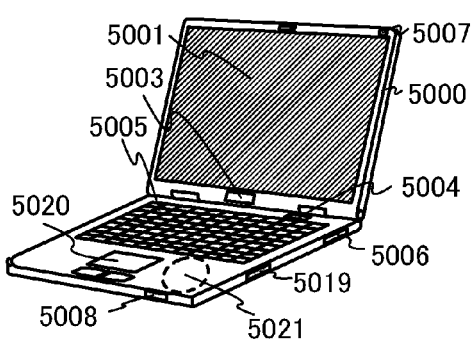
Figure 25D:
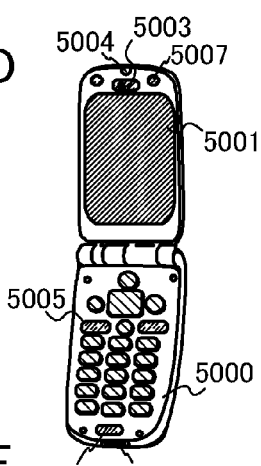

FIG. 24A illustrates a mobile computer which can include a switch 5009, an infrared port 5010, and the like in addition to the above components. FIG. 24B illustrates a portable image reproducing device (e.g., a DVD reproducing device) which is provided with a memory medium and can include a second display portion 5002, a memory medium reading portion 5011, and the like in addition to the above components. FIG. 24C illustrates a goggle-type display which can include the second display portion 5002, a supporting portion 5012, an earphone 5013, and the like in addition to the above components. FIG. 24D illustrates a portable game machine which can include the memory medium reading portion 5011 and the like in addition to the above components. FIG. 24E illustrates a digital camera which has a television reception function and can include an antenna 5014, a shutter button 5015, an image receiving portion 5016, and the like in addition to the above components. FIG. 24F illustrates a portable game machine which can include the second display portion 5002, the memory medium reading portion 5011, and the like in addition to the above components. FIG. 24G illustrates a television receiver which can include a tuner, an image processing portion, and the like in addition to the above components. FIG. 24H illustrates a portable television receiver which can include a charger 5017 capable of transmitting and receiving signals, and the like in addition to the above components. FIG. 25A illustrates a display which can include a support base 5018 and the like in addition to the above components. FIG. 25B illustrates a camera which can include an external connection port 5019, a shutter button 5015, an image reception portion 5016, and the like in addition to the above components. FIG. 25C illustrates a computer which can include a pointing device 5020, the external connection port 5019, a reader/writer 5021, and the like in addition to the above components. FIG. 25D illustrates a mobile phone which can include a transmitter, a receiver, a tuner of one-segment partial reception service for mobile phones and mobile terminals, and the like in addition to the above components.

The electronic devices illustrated in FIGS. 24A to 24H and FIGS. 25A to 25D can have a variety of functions. For example, a function of displaying a variety of data (a still image, a moving image, a text image, and the like) on a display portion, a touch panel function, a function of displaying a calendar, date, time, and the like, a function of controlling a process with a variety of software (programs), a wireless communication function, a function of being connected to a variety of computer networks with a wireless communication function, a function of transmitting and receiving a variety of data with a wireless communication function, a function of reading a program or data stored in a memory medium and displaying the program or data on a display portion, and the like can be given. Further, the electronic device including a plurality of display portions can have a function of displaying image data mainly on one display portion while displaying text data on another display portion, a function of displaying a three-dimensional image by displaying images where parallax is considered on a plurality of display portions, or the like. Furthermore, the electronic device including an image receiving portion can have a function of shooting a still image, a function of taking a moving image, a function of automatically or manually correcting a shot image, a function of storing a shot image in a memory medium (an external memory medium or a memory medium incorporated in the camera), a function of displaying a shot image on the display portion, or the like. Note that functions that can be provided for the electronic devices illustrated in FIGS. 24A to 24H and FIGS. 25A to 25D are not limited thereto, and the electronic devices can have a variety of functions.

The electronic devices described in this embodiment each include the display portion for displaying some sort of data.

Next, applications of a display device will be described.

Figure 25E:
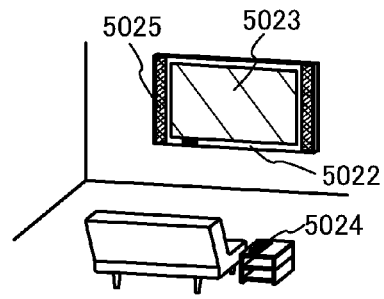

FIG. 25E illustrates an example in which a display device is incorporated in a building. FIG. 25E illustrates a housing 5022, a display portion 5023, a remote controller 5024, which is an operation portion, a speaker 5025, and the like. The display device is incorporated in the building as a wall-hanging type, so that the display device can be provided without requiring a wide space.

Figure 25F:
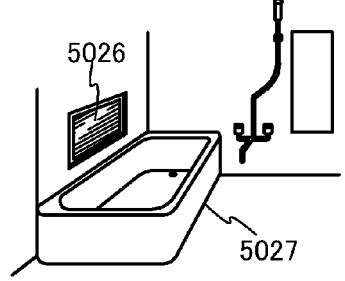

FIG. 25F illustrates another example in which a display device is incorporated in a building. The display module 5026 is incorporated in a prefabricated bath 5027 so that a bather can watch the display module 5026.

Note that although the wall and the prefabricated bath are taken as examples of the building in this embodiment, one embodiment of the present invention is not limited thereto and a display device can be provided in any of a variety of buildings.

Next, an example in which a display device is incorporated in a moving object will be described.

Figure 25G:
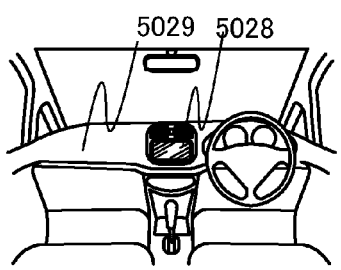

FIG. 25G illustrates an example in which a display device is provided in a vehicle. A display module 5028 is provided in a body 5029 of a vehicle and can display data on the operation of the body or data input from inside or outside of the body on demand. Note that a navigation function may be provided.

Figure 25H:
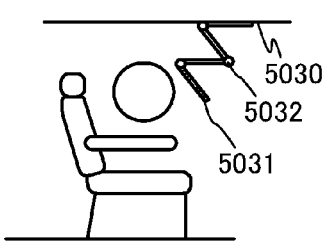

FIG. 25H illustrates an example in which a display device is incorporated in a passenger airplane. FIG. 25H illustrates a usage pattern when a display module 5031 is provided for a ceiling 5030 above a seat of the passenger airplane. The display module 5031 is attached to the ceiling 5030 with a hinge portion 5032, and a passenger can watch the display module 5031 by stretching the hinge portion 5032. The display module 5031 has a function of displaying data when operated by a passenger.

Note that although the body of the vehicle and the body of the airplane are taken as examples of the moving object, one embodiment of the present invention is not limited thereto. A display device can be provided for a variety of moving objects such as a two-wheel vehicle, a four-wheel vehicle (including an automobile and a bus), a train (including a monorail train and a railway train), and a ship.

Note that in this specification and the like, part of a diagram or a text described in one embodiment can be taken out to constitute one embodiment of the invention. Thus, in the case where a diagram or a text related to a certain part is described, a content taken out from the diagram or the text of the certain part is also disclosed as one embodiment of the invention and can constitute one embodiment of the invention. Therefore, for example, part of a diagram or a text including one or more of active elements (e.g., transistors and diodes), wirings, passive elements (e.g., capacitors and resistors), conductive layers, insulating layers, semiconductor layers, organic materials, inorganic materials, components, devices, operating methods, manufacturing methods, and the like can be taken out to constitute one embodiment of the invention. For example, M circuit elements (e.g., transistors or capacitors) (M is an integer) are picked up from a circuit diagram in which N circuit elements (e.g., transistors or capacitors) (N is an integer, where M<N) are provided, whereby one embodiment of the invention can be constituted. As another example, M layers (M is an integer) are picked up from a cross-sectional view in which N layers (N is an integer, where M<N) are provided, whereby one embodiment of the invention can be constituted. As another example, M elements (M is an integer) are picked up from a flow chart in which N elements (N is an integer, where M<N) are provided, whereby one embodiment of the invention can be constituted.

Note that, in the case where at least one specific example is illustrated in a diagram or a text described in one embodiment in this specification and the like, it will be readily appreciated by those skilled in the art that a broader concept of the specific example can be derived. Therefore, in the case where at least one specific example is illustrated in the diagram or the text described in one embodiment, a broader concept of the specific example is disclosed as one embodiment of the invention and can constitute one embodiment of the invention.

Note that, in this specification and the like, a content illustrated in at least a diagram (which may be part of the diagram) is disclosed as one embodiment of the invention and can constitute one embodiment of the invention. Therefore, when a certain content is illustrated in a diagram, the content is disclosed as one embodiment of the invention even without text description and can constitute one embodiment of the invention. Similarly, a diagram obtained by taking out part of a diagram is disclosed as one embodiment of the invention and can constitute one embodiment of the invention.

(Embodiment 11)

Although the variety of films such as the conductive film and the semiconductor film which are described in the above embodiment can be formed by a sputtering method or a plasma chemical vapor deposition (CVD) method, such films may be formed by another method, e.g., a thermal CVD method. A metal organic chemical vapor deposition (MOCVD) method or an atomic layer deposition (ALD) method may be employed as an example of a thermal CVD method.

A thermal CVD method has an advantage that no defect due to plasma damage is generated since it does not utilize plasma to form a film.

Deposition by a thermal CVD method may be performed in such a manner that a source gas and an oxidizer are supplied to a chamber at a time, the pressure in the chamber is set to an atmospheric pressure or a reduced pressure, and they are made to react with each other in the vicinity of the substrate or over the substrate.

Deposition by an ALD method may be performed in such a manner that the pressure in a chamber is set to an atmospheric pressure or a reduced pressure, source gases for reaction are sequentially introduced into the chamber, and then the sequence of the gas introduction is repeated. For example, two or more kinds of source gases are sequentially supplied to the chamber by switching switching valves (also referred to as high-speed valves). For example, a first source gas is introduced, an inert gas (e.g., argon or nitrogen) or the like is introduced at the same time as or after the introduction of the first gas so that the source gases are not mixed, and then a second source gas is introduced. Note that in the case where the first source gas and the inert gas are introduced at a time, the inert gas serves as a carrier gas, and the inert gas may also be introduced at the same time as the introduction of the second source gas. Alternatively, the first source gas may be exhausted by vacuum evacuation instead of the introduction of the inert gas, and then the second source gas may be introduced. The first source gas is adsorbed on a surface of the substrate to form a first layer; then the second source gas is introduced to react with the first layer; as a result, a second layer is stacked over the first layer, so that a thin film is formed. The sequence of the gas introduction is repeated plural times until a desired thickness is obtained, whereby a thin film with excellent step coverage can be formed. The thickness of the thin film can be adjusted by the number of repetition times of the sequence of the gas introduction; therefore, an ALD method makes it possible to accurately adjust the film thickness and thus is suitable for manufacturing a minute FET.

The variety of films such as the conductive film and the semiconductor film which are described in the above embodiment can be formed by a thermal CVD method such as a MOCVD method or an ALD method. For example, in the case where an In—Ga—Zn—O film is formed, trimethylindium, trimethylgallium, and dimethylzinc are used. Note that the chemical formula of trimethylindium is $In(CH_3)_3$. The chemical formula of trimethylgallium is $Ga(CH_3)_3$. The chemical formula of dimethylzinc is $Zn(CH_3)_2$. Without limitation to the above combination, triethylgallium (chemical formula: $Ga(C_2H_5)_3$) can be used instead of trimethylgallium, and diethylzinc (chemical formula: $Zn(C_2H_5)_2$) can be used instead of dimethylzinc.

For example, in the case where a tungsten film is formed using a deposition apparatus employing ALD, a $WF_6$ gas and a $B_2H_6$ gas are sequentially introduced plural times to form an initial tungsten film, and then a $WF_6$ gas and an $H_2$ gas are introduced at a time, so that a tungsten film is formed. Note that an $SiH_4$ gas may be used instead of a $B_2H_6$ gas.

For example, in the case where an oxide semiconductor film, e.g., an In—Ga—Zn—O film is formed using a deposition apparatus employing ALD, an $In(CH_3)_3$ gas and an $O_3$ gas are sequentially introduced plural times to form an InO layer, a $Ga(CH_3)_3$ gas and an $O_3$ gas are introduced at a time to form a GaO layer, and then a $Zn(CH_3)_2$ gas and an $O_3$ gas are introduced at a time to form a ZnO layer. Note that the order of these layers is not limited to this example. A mixed compound layer such as an In—Ga—O layer, an In—Zn—O layer, or a Ga—Zn—O layer may be formed by mixing of any of these gases. Note that although an $H_2O$ gas which is obtained by bubbling with an inert gas such as Ar may be used instead of an $O_3$ gas, it is preferable to use an $O_3$ gas which does not contain H. Alternatively, instead of an $In(CH_3)_3$ gas, an $In(C_2H_5)_3$ gas may be used. Instead of a $Ga(CH_3)_3$ gas, a $Ga(C_2H_5)_3$ gas may be used. Instead of an $In(CH_3)_3$ gas, an $In(C_2H_5)_3$ may be used. Still alternatively, a $Zn(CH_3)_2$ gas may be used.

This application is based on Japanese Patent Application serial no. 2012-260208 filed with Japan Patent Office on Nov. 28, 2012, the entire contents of which are hereby incorporated by reference.

What is claimed is:

1. A display device comprising:
a pixel portion;
a driver circuit portion that is provided outside the pixel portion; and
a protection circuit that is electrically connected to one of or both the pixel portion and the driver circuit portion and includes a pair of electrodes,
wherein the pixel portion includes a transistor,
wherein the transistor includes a gate insulating layer,
wherein the gate insulating layer includes:
a first insulating layer containing nitrogen and silicon; and
a second insulating layer containing oxygen, nitrogen, and silicon, and
wherein the protection circuit includes the first insulating layer between the pair of electrodes.

2. The display device according to claim 1,
wherein a resistivity of the first insulating layer is greater than or equal to $10^{10}$ Ωcm and less than $10^{18}$ Ωcm.

3. The display device according to claim 1,
the transistor further comprising a semiconductor layer,
wherein the semiconductor layer of the transistor is an oxide semiconductor layer.

4. A display device comprising:
a pixel portion;
a driver circuit portion that is provided outside the pixel portion; and
a protection circuit that is electrically connected to one of or both the pixel portion and the driver circuit portion and includes a pair of electrodes,
wherein the pixel portion includes:
pixel electrodes arranged in a matrix each of which is electrically connected to a transistor,
wherein each of the transistors includes:
a gate electrode;
a gate insulating layer over the gate electrode;
a semiconductor layer over the gate insulating layer;
a source electrode and a drain electrode over the semiconductor layer,
wherein the gate insulating layer includes:
a first insulating layer containing nitrogen and silicon; and
a second insulating layer containing oxygen, nitrogen, and silicon, and
wherein the protection circuit includes the first insulating layer between the pair of electrodes.

5. The display device according to claim 4,
wherein one of the pair of electrodes is formed over a same surface as the gate electrode, and
wherein the other of the pair of electrodes is formed over a same surface as the source electrode or the drain electrode.

6. The display device according to claim 4,
wherein a resistivity of the first insulating layer is greater than or equal to $10^{10}$ Ωcm and less than $10^{18}$ Ωcm.

7. The display device according to claim 4,
wherein the semiconductor layer is an oxide semiconductor layer.

8. A display device comprising:
a pixel portion; and
a protection circuit that is electrically connected to the pixel portion and includes a pair of electrodes,
wherein the pixel portion includes a transistor,
wherein the transistor includes a gate insulating layer,
wherein the gate insulating layer includes:
a first insulating layer containing nitrogen and silicon; and
a second insulating layer containing oxygen, nitrogen, and silicon, and
wherein the protection circuit includes the first insulating layer between the pair of electrodes.

9. The display device according to claim 8, further comprising:
a gate electrode under the gate insulating layer;
a semiconductor layer over the gate insulating layer;
a source electrode and a drain electrode over the semiconductor layer,
wherein one of the pair of electrodes is formed over a same surface as the gate electrode, and
wherein the other of the pair of electrodes is formed over a same surface as the source electrode or the drain electrode.

10. The display device according to claim 8,
wherein a resistivity of the first insulating layer is greater than or equal to $10^{10}$ Ωcm and less than $10^{18}$ Ωcm.

11. The display device according to claim 3,
wherein the semiconductor layer comprises an oxide semiconductor containing at least indium and zinc.

12. The display device according to claim 4,
wherein the semiconductor layer comprises an oxide semiconductor containing at least indium and zinc.

13. The display device according to claim 8, the transistor further comprising a semiconductor layer.

14. The display device according to claim 13,
wherein the semiconductor layer comprises an oxide semiconductor containing at least indium and zinc.

15. The display device according to claim 1,
wherein the first insulating layer is a silicon nitride film.

16. The display device according to claim 4,
wherein the first insulating layer is a silicon nitride film.

17. The display device according to claim 8,
wherein the first insulating layer is a silicon nitride film.

18. The display device according to claim 1, further comprising a plurality of pixel electrodes,
wherein the plurality of pixel electrodes is arranged in a matrix, and
wherein one of the plurality of pixel electrodes is electrically connected to the transistor.

19. A display device comprising:
a pixel portion; and
a protection circuit that is electrically connected to the pixel portion and includes a pair of electrodes,
wherein the pixel portion includes a transistor,
wherein the transistor includes a gate insulating layer and an oxide semiconductor layer,
wherein the gate insulating layer includes:
a first insulating layer comprising silicon nitride; and
a second insulating layer comprising any one of silicon oxide and silicon oxynitride, and
wherein the protection circuit includes the first insulating layer between the pair of electrodes.

20. The display device according to claim 19,
wherein a resistivity of the first insulating layer is greater than or equal to $10^{10}$ ωcm and less than $10^{18}$ ωcm.

21. The display device according to claim 19,
wherein the oxide semiconductor layer comprises at least indium and zinc.

22. The display device according to claim 19, further comprising a plurality of pixel electrodes,
wherein the plurality of pixel electrodes is arranged in a matrix, and
wherein one of the plurality of pixel electrodes is electrically connected to the transistor.

* * * * *